United States Patent [19]

Witalka et al.

[11] Patent Number: 4,511,967
[45] Date of Patent: Apr. 16, 1985

[54] SIMULTANEOUS LOAD AND VERIFY OF A DEVICE CONTROL STORE FROM A SUPPORT PROCESSOR VIA A SCAN LOOP

[75] Inventors: Jerome J. Witalka, Minneapolis; Howard L. Buettner, Bloomington; James G. Ellsworth, St. Paul, all of Minn.

[73] Assignee: Sperry Corporation, New Yor, N.Y.

[21] Appl. No.: 466,761

[22] Filed: Feb. 15, 1983

[51] Int. Cl.³ .............................................. G06F 1/00
[52] U.S. Cl. .................................................. 364/200
[58] Field of Search ... 364/200 MS File, 900 MS File

[56] References Cited

U.S. PATENT DOCUMENTS 4,167,780 9/1979 Hayashi .............................. 364/200

Primary Examiner—Raulfe B. Zache
Attorney, Agent, or Firm—William C. Fuess; Kenneth T. Grace; Marshall M. True

[57] ABSTRACT

The loading (writing) of plural successive data strings of specifiable bit-length and numbers to a scan/set testable register (called a CONTROL STORE SCAN LOOP STRING) from which it may then be transferred to a control store (called a CONTROL STORE (RAM)) both within a remote slave digital logic device (called a CENTRAL COMPLEX) is bit-serially conducted upon one signal line of a scan/set network by a controlling digital logic device (called a SUPPORT PROCESSOR) in substantially simultaneous time to the reading of the previous contents of such register (and control store) bit-serially via another signal line of said scan/set network. Both signal lines and devices together form a circular BIT-SERIAL SCAN LOOP, upon which the bit-serial writing and reading is time overlapped. The data strings read are the echo-back of the data strings previously written, and are, in a first operational mode called ECHO, lodged in a buffer memory (called a SCAN/SET BUFFER) of the controlling digital logic device wherein, subsequent to communication, they may be programmably compared with the data strings written in verification of process integrity. In a selectable alternative second operational mode called VERIFY, each successive data string read back is, in substantially simultaneous time, automatically compared with the data string as previously written. Thusly, loading (writing) and reading and verifying activities on variably specifiable numbers of data strings of variably specifiable bit-length communicated upon a BIT-SERIAL SCAN LOOP all transpire substantially concurrently in simultaneous time.

25 Claims, 28 Drawing Figures

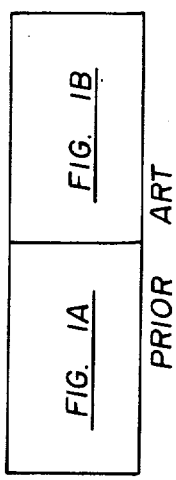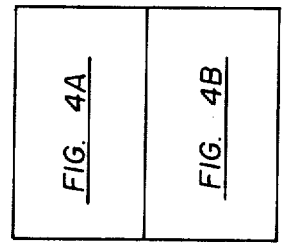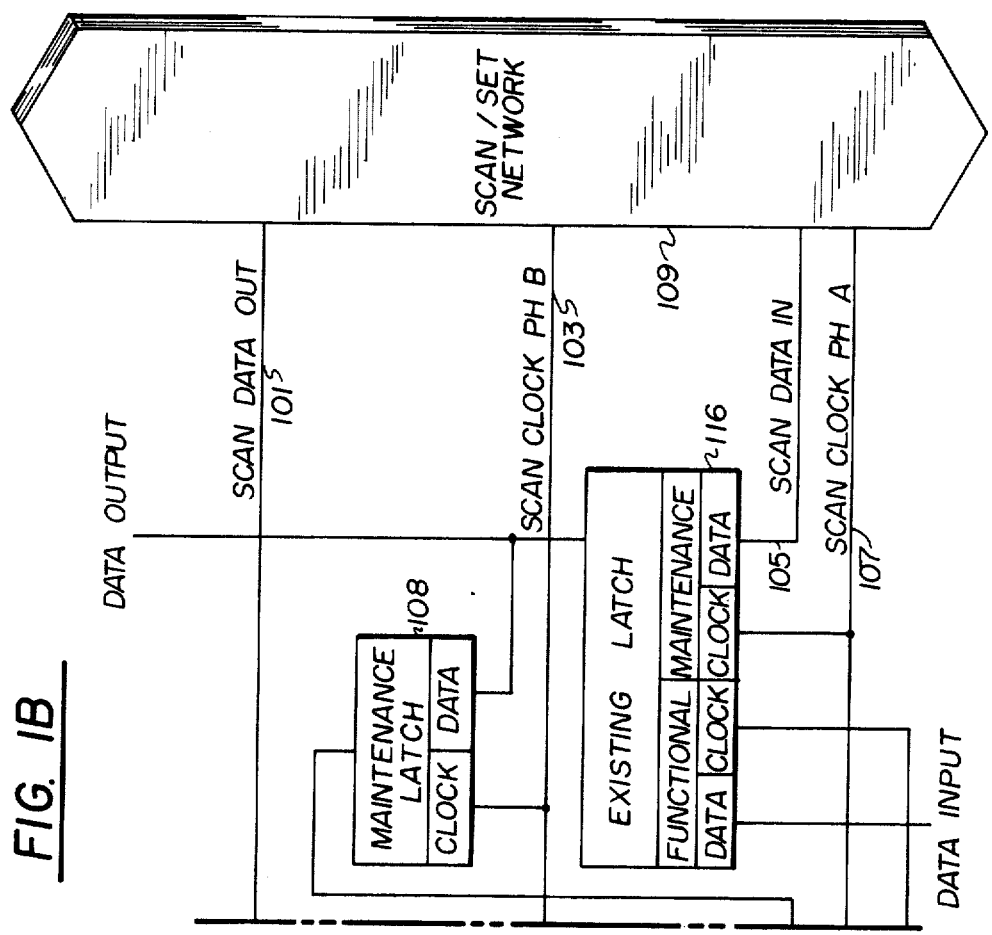

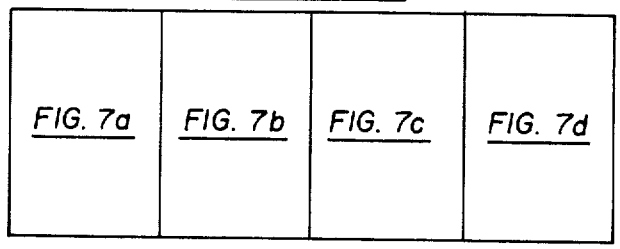
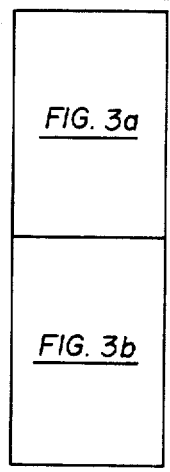
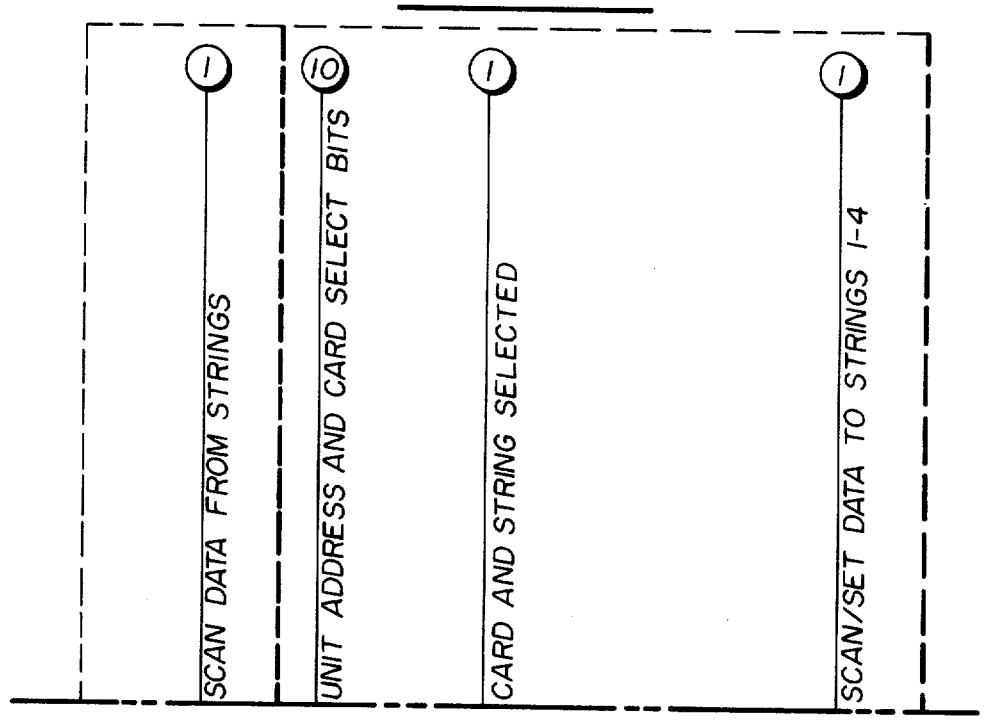

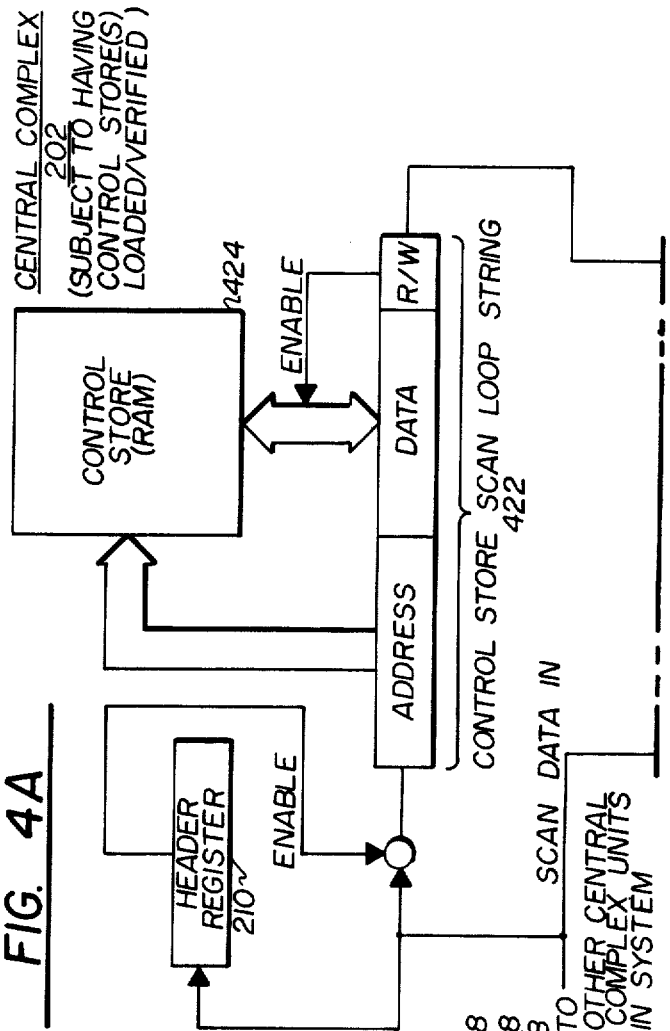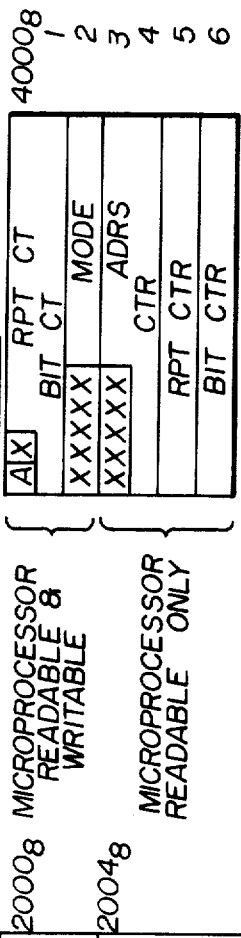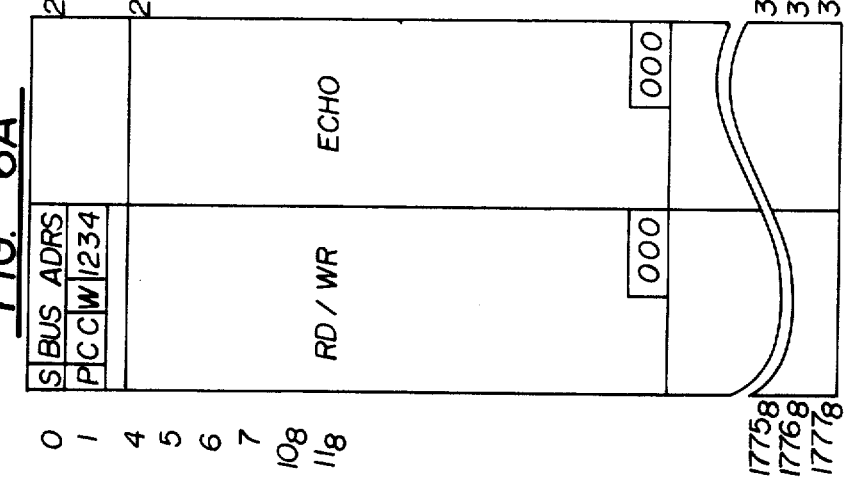

|   |   |   |   |   |   |   |
|---|---|---|---|---|---|---|
| 0 | S | BUS ADRS | | | | 2000₈ |
| 1 | P | CC | W | 1 2 3 4 | | |
| | | | | | | |
| 4 | | FIRST | | OLD | | 2004₈ |
| 5 | | BLOCK STRING | | STRING | | |
| 6 | | DATA | 00 | DATA | 00 | |
| 7 | | SECOND | | ECHO | | 2007₈ |
| 10₈ | | BLOCK STRING | | FIRST | | |
| 11 | | DATA | 00 | BLOCK | 00 | |
| 12 | | THIRD | | ECHO | | 2012₈ |
| 13 | | BLOCK STRING | | SECOND | | |
| 14 | | DATA | 00 | BLOCK | 00 | |
| 15 | | FOURTH | | ECHO | | 2015₈ |
| 16 | | BLOCK STRING | | THIRD | | |
| 17 | | DATA | 00 | BLOCK | 00 | |
| 20 | | FIFTH | | ECHO | | 2020₈ |
| 21 | | BLOCK STRING | | FOURTH | | |
| 22 | | DATA | 00 | BLOCK | 00 | |
| 23 | | | | (ECHO FIFTH BLOCK) | 00 | 2023₈ |
| | | | | | | 2026₈ |
| 1777₈ | | | | | | 3777₈ |

FIG. 5a

| | | |
|---|---|---|
| REPEAT COUNT REGISTER 416 (=5₈) | 0 0 0 0 0 1 0 1 | 4000₈ |
| LOOP LENGTH REGISTER 408 (=26₈) | 0 0 0 1 0 1 1 0 | 1 |
| MODE REGISTER 414 | X X X X X 1 1 0 | 2 |
| ADDRESS REGISTER (UPPER & LOWER) 402 (=23₈) | X X X X X 0 0 0 / 0 0 0 1 0 0 1 1 | 3 / 4 |
| REPEAT COUNTER 420 (=5₈) | 0 0 0 0 0 1 0 1 | 5 |
| BIT COUNTER 412 (=30₈) | 0 0 0 1 1 0 0 0 | 6 |

FIG. 5b

LEGEND

\*    LOGICAL 'AND' OPERATOR

\+    LOGICAL 'OR' OPERATOR

/    LOGICAL 'INVERSE', OR 'NOT', OF THE PARENTHESIZED
     EXPRESSION FOLLOWING

=    BOOLEAN EXPRESSION PRODUCING THE LOGICAL 'TRUE'
     SIGNAL CONDITION

.EQ.    ARITHMETIC EQUALITY (EQUAL)

.NE.    ARITHMETIC INEQUALITY (NOT EQUAL)

CLR (FF)    CLEAR THE INDICATED FLIP-FLOP

SET (FF)    SET THE INDICATED FLIP-FLOP

.IF.    WHEN EXPRESSION FOLLOWING IS BOOLEAN 'TRUE' THEN
        CONDITION PRECEDING IS SATISFIED (ALL NUMBERS ARE EXPRESSED IN OCTAL)

FIG. 8a

DERIVATION OF CONTROL SIGNALS

A =      FF SS BUSY DLY

B =      FF EN SS RAM WR DATA + SS RAM WR STROBE

SS RAM WR STROBE = FF WR DLY 2 * / (FF SS BUSY) * DECODE 230 + / (FF B) * FFA * / (FF EN HDR + FF INHIBIT A + FF INHIBIT FIRST B) * (MODE REG BITS 6-7 .EQ. 0 + MODE REG BITS 6-7 .EQ. 3) * BIT CTR DLY BITS 5-7 .EQ. 0

C =      Ø2 * / (FF A) * FF A DLY

D =      Ø2 * FF SS BUSY * / (FF A) * / (FF A DLY)

E =      / (EN LD SHIFT REG)

EN LD SHIFT REG = FF SS BUSY * BIT CTR REG BITS 5-7 .EQ. 0 * (FF EN HDR + MODE REG BIT 6 + MODE REG BIT 7)

F =      Ø2 * / (FF A) * FF A DLY

G =      FF SS BUSY * / (FF CT MATCH)

H =      Ø4 * FF WR DLY 2 * EN MODE REG

EN MODE REG = ACTUAL ADDRS BITS 0-22 .EQ. 1144002 OCTAL

I =      Ø4 * FF B * FF A DLY * FF INHIBIT A * / (FF COUNT MATCH * BIT CTR DLY BITS 5-7 .EQ. Ø)

FIG. 8b

J=          02 * FF A * / (FF A DLY)

CLR1=      04 * ((FF INHIBIT A * FF B * FF A DLY) + (FF WR DLY 2 * EN MODE REG) + (FF COUNT MATCH * BIT CTR DLY BITS 5-7 .EQ. 0 * MODE REG BIT 5 * / (FF VERIFY ERROR) * / (FF BLK XFR COMPLETE) * FF B * FF A DLY))

K=          04 * WR DLY 2 * EN ADDRS ONE

EN ADDRS ONE = ACTUAL ADDRS BITS 0-22 .EQ. 1144001

L=          MEM REQUEST EN * UPROC READ * DECODE 230

M=         MEM REQUEST EN * UPROC READ * EN RD LOOP LENGTH

EN READ LOOP LENGTH = ACTUAL ADDRS BITS 0-22 .EQ. 1144001

N=          MEM REQUEST EN * UPROC READ * EN MODE REG

EN MODE REG = ACTUAL ADDRS BITS 0-22 .EQ. 1144002

O=          MEM REQUEST EN * UPROC READ * EN BIT COUNTER

EN BIT COUNTER = ACTUAL ADDRS BITS 0-22 .EQ. 1144006

SET P=      02 * FF COUNT MATCH * REPEAT COUNTER .EQ. REPEAT COUNT * MODE REG BIT 5 * (/(SET Q * FF VERIFY ERROR) + (ZERO BLK CT * ZERO BIT CT)) * MODE REG BIT 5

CLR P=      02 * FF INTRA DLY * BC PRI

SET Q=      02 * VERIFY * MODE REG BIT 5-7 .EQ. 6 * REPEAT COUNTER .NE. 001 * / (EN HDR) * / (FF INHIBIT FIRST B) * BIT CTR REG BITS 5-7 .EQ. 0 * FF A * FF A DLY

FIG. 8c

CLR Q=   02 * FF INTRA DLY * BC PRI

R=   04 * (/(FF EN HDR) + (FF EN HDR * (/(MODE BIT 5) +
     RPT CTR BITS 0-7 .EQ. 001 + (MODE REG BITS 5-7 .EQ.
     6 * RPT CTR BITS 0-7 .EQ. 002)))) * BIT CTR DLY
     BITS 5-7 .EQ. 4 * FF B * FF A DLY

S=   04 * ((/(FF EN HDR) * (BIT CTR BITS 05-07 .EQ.
     4 + BIT CTR BITS 05-07 .EQ. 5)) + (FF EN HDR *
     (/(MODE REG BIT 5) + RPT CTR BITS 0-7 .EQ. 001 +
     (MODE REG BITS 5-7 .EQ. 6 * RPT CTR REG BITS 0-7
     .EQ. 2))) * BIT CTR REG BITS 4-7 .EQ. 15) * FF B *
     / (FF A DLY)

JAM 1=   04 * FF EN HDR * (/(MODE REG BIT 5) + RPT CTR REG
     BITS 0-7 .EQ. 001 + MODE REG BITS 5-7 .EQ. 6) * RPT
     CTR REG BITS 0-7 .EQ. 2 * BIT CTR REG BITS 4-7 .EQ.
     02 * FF B * /(FF A DLY)

T=   /(FF SS BUSY) * /(FF EN HDR)

U=   FF EN HDR

V=   FF BUSY * /(FF EN HDR) * BIT CTR REG BITS 5-7 .EQ.
     0) * /(FF A)

W=   FF BUSY * /(FF EN HDR) * /(BIT CTR REG BITS 5-7
     .EQ. 0) * /(FF A)

X=   MODE REG BITS 5-7 .EQ. 6 * BIT CTR REG BITS 5-7
     .EQ. 5 * REPEAT CTR REG BITS 0-6 .NE. 000

Y=   04 * FF B * FF A DLY * /(FF INHIBIT A) * ((/(MODE
     REG BIT 5) * BIT CTR DLY BITS 0-7 .EQ. 377) +
     (MODE REG BIT 5 * FF EN HDR * BIT CTR REG BITS
     3-7 .EQ. 00))

Z=   02 * FF A * /(FF A DLY)

FIG. 8d

CLR 2 =     FF WR DLY 2 * ACTUAL ADDRS BITS 0-22 .EQ. 1144002

AA =        04 * FF WR DLY 2 * ACTUAL ADDRS BITS 0-22 .EQ. 1144000

AB =        MEM REQUEST EN * UPROC READ * ACTUAL ADDRS BITS 0-22 .EQ. 1144000

AC =        MEM REQUEST EN * UPROC READ * ACTUAL ADDRS BITS 0-22 .EQ. 1144003

AD =        MEM REQUEST EN * UPROC READ * ACTUAL ADDRS BITS 0-22 .EQ. 1144004

AE =        MEM REQUEST EN * UPROC READ * ACTUAL ADDRS BITS 0-22 .EQ. 1144005

CLOCK MANAGEMENT

CLR FF A .IF. 04 * FF A DLY * FF B

SET FF A .IF. /(FF A DLY) * FF B

CLR FF A DLY .IF. 04 * /(FF A) * /(FF B)

SET FF A DLY .IF. 04 * FF A * /(FF B)

CLR FF B .IF. 02 * (/(FF A) * FF A DLY) + (FF A * /(FF A DLY))

SET FF B .IF. 02 * ((FF BUSY * /(FF A) * /(FF A DLY) + (FF A * FF A DLY))

FIG. 8e

SIGNALS RECEIVED FROM SYSTEM MICROPROCESSOR

Ø2, Ø4, WRITE STROBE, MEM EN, UPROC READ, ACTUAL ADDRS BITS 00-18, FF INTRA DLY, VE PRI, WR DATA BUS 00-07, BC PRI

SIGNALS RECEIVED FROM SCAN/SET NETWORK

SCAN DATA OUT

SIGNALS PROVIDED TO SCAN/SET NETWORK

SCAN CLOCK PH A, SCAN CLOCK PH B, SCAN ADDRESS ENABLE, SCAN DATA IN

SIGNALS PROVIDED TO SYSTEM MICROPROCESSOR

RD DATA BUS 00-07, PAR, BC INTRPT, VE INTRPT,

FIG. 8f

SIMULTANEOUS LOAD AND VERIFY OF A DEVICE CONTROL STORE FROM A SUPPORT PROCESSOR VIA A SCAN LOOP

BACKGROUND OF THE INVENTION

1. Field of the Invention

The invention relates generally to digital bit-serial data transfer between one device and another, and the verification of the integrity of such a transfer by having the transmitted data bit-serially returned to the originating device. The invention specifically relates to a digital logic device which, responsively to a single software initiated operation, allows the simultaneous loading and verification of a control store in a remotely situated device via a bit-serial digital SCAN loop.

2. Description of the Prior Art

It is current computer design practice to employ microcode designs in many of the central complex units of medium to large scale digital computer systems. These microcoded designs are controlled by data stored in local memories called control stores. It is common practice to utilize an inexpensive, separate, minicomputer-type device to load the various control stores of the various central complex units within a computer system. Such a minicomputer-type device may be identified as a SYSTEM SUPPORT PROCESSOR, or SSP.

A second task commonly performed by the same SSP which loads the control store of central complex units within a computer system is the control of scan/set networks within such central complex units. The scan/set networks within each central computer complex allows the SSP to read or write the state of all storage elements within such networks for the purpose of functional tests. It is also known to utilize a scan/set network for the loading of the control stores within the various central complex units of the computer system.

The prior art procedure by which the control stores of the central complex units of a computer system have been loaded via the scan/set network mechanism controlled from a SYSTEMS SUPPORT PROCESSOR is as follows. The SSP obtains the data to be written into the control store of the remote central complex unit from a data source, such as a peripheral floppy disk drive, and normally emplaces this data within an SSP internal buffer memory store, such as a RAM. Next, the data may be directly or indirectly written into the remote control store, usually a RAM, of the central complex unit via the bit-serial data transmission capability of the scan/set network. After the entirety of the control store is loaded, the written contents of such control store are next read back to the SSP via the selfsame scan/set network. Finally, the data read from the CONTROL STORE, via the scan/set network, is compared with the data written to such control store, via the scan/set network, within the SSP in order to verify the integrity of the process.

The procedure of writing a remote control store, reading the contents of such control store, and comparing the read content to the written content for purposes of verification, was acceptable when only a few such remote central complex units existed, and/or the control stores within such central complex units were of modest bit length. As the number and size of control stores, nominally RAMs, in computer systems is growing larger with successive system generations, the time of loading all such control stores during system initialization has grown unacceptably long. The subject invention of this disclosure will deal with this problem by selectively either performing the writing and reading of the control store (both via the scan/set network) substantially simultaneously and concurrently, or by selectively performing both the writing of the control store, the reading of the control store, and the verification of the data read against the data written—all three steps—substantially simultaneously as concurrent operations.

As subsidiary aspects of the present invention wherein the loading plus the reading plus (selectively) the verifying of a control store within a central complex unit may be accomplished in time overlap by a SYSTEMS SUPPORT PROCESSOR both writing and reading such control store within such central complex unit via a scan/set network, it will become evident that the present invention exhibits versatility as to the addressable locations, and variable bit lenths, of the control stores so loaded. Specifically, it is known in the art that a central digital logic device, a SYSTEM SUPPORT PROCESSOR, managing a scan/set network is able to, via an address word called a HEADER quantity, addressably select amongst a number of central complex units interconnected on one such scan/set network. Specifically, it is further known in the prior art that the central scan/set network controlling digital logic device, the SYSTEM SUPPORT PROCESSOR, is able to addressably select, also by the information contained within such HEADER word, a single one scan/set test loop, called a single STRING, from amongst a number of such loops existing within each central complex unit device. Finally, it is also known that the central scan/set network controlling digital logical device, the SYSTEM SUPPORT PROCESSOR, may, having identified a particular scan/set test loop within a particular central complex unit device, proceed to deal with such scan/set test loop in rough accordance with its individual bit length. Normally, and when normally accomplished under microprocessor control, such manipulation of the scan/set test loops, the STRINGS, is granularized in accordance with some basic number of bits, nominally 8-bits as comprise a byte, which is the basic quantum of communication to and from such scan/set test loop via such scan/set network. In other words, the scan/set central network controlling element, the SYSTEM SUPPORT PROCESSOR, will normally addressably select and deal with scan/set test loops which are in bit-length multiples of 8-bits; e.g. 136-bits, or 168-bits, as might be respectively associated with two individually addressable STRINGS. When the number of bits, representing scan/set testable stored latches within a scan/set test loop, is not an integer number in modulus eight, then additional "zero", or placeholding, bits are normally transferred as part of the scan/set test process and/or the control stores loading process. The present invention overcomes this limitation of dealing with individually addressable bit strings of a bit-length modulus greater than one (1).

SUMMARY OF THE INVENTION

The present invention is an apparatus and method for the loading (writing) and simultaneous, time-overlapped, reading of the written information within the control store of a microcoded design digital logic device from a controlling, digital logic microcoded, SUPPORT PROCESSOR device via a bit-serial scan loop.

As a second aspect of the present information, first portions of that information previously written to control store which has been read back may be verified, by comparison to the written information, for correctness during simultaneous overlapped time, with the ongoing continuing writing and reading of second, subsequent portions of information from the controlling, SUPPORT PROCESSOR, device to the control store within a remote, CENTRAL COMPLEX, device via a bit-serial scan loop. Previous systems required sequential time in which to perform one or more of the separate operations of firstly loading a control store with data, second reading back the data so stored, and thirdly verifying the correctness of the read back data to the data written. In its second, preferred embodiment aspect, the apparatus of the present invention performs all three of these functions of loading (writing) control store, reading control store, and verifying the read information to the written information substantially time-concurrently in one operation. The word "substantially" means that a first portion of data must always be loaded (written) within the control store before the subsequent reading and verification of this first portion data can then transpire in time-overlap with the writing of further, second, portions of data. Similarly, "substantially" means that the final operation performed must always be the reading and verification of the final portion of data so stored within the control store. When the total data stored is devided into a large multiplicity of such data portions, the time-overlap of the storing (writing) and reading functions conducted upon the bit-serial scan loop, and the optionally selectable time-overlapping of the verification function, allows substantial time saving in the overall conduct of the process of loading and verifying a control store within a remote CENTRAL COMPLEX from a controlling SYSTEM SUPPORT PROCESSOR via scan loop, such activity as might transpire during the initialization of a computer system.

The summary manner by which the present invention obtains the substantially simultaneous load (write) and read and verification of the data within a control store of a remote CENTRAL COMPLEX from a central controlling digital logic device, a SYSTEM SUPPORT PROCESSOR, via a bit-serial SCAN data transfer loop is as follows. The process controlling, SYSTEM SUPPORT PROCESSOR, digital logic device is a microcoded design wherein the data and necessary control header words to be ultimately transferred to a remote device may be retrieved, such as from a peripherial, to an internal memory. A parameter called a loop length—which parameter defines the number of bits within each of one or more portions, of strings, of data which will be transferred bit-serially upon the scan loop, portion by portion, from the SYSTEM SUPPORT PROCESSOR to the control store of the CENTRAL COMPLEX—is established within a control register. Similarly, a second parameter called the repeat count—which parameter defines the total numbers of such portion to be sequentially transferred—is established in a second register. When enabled by the single execution of a single microinstruction, these registers will control a process autonomously conducted in independent dedicated logics whereby firstly control information, called a HEADER word, and secondly all the data information, portion by portion, which is to become lodged within the control store of the remote CENTRAL COMPLEX will be serially shifted onto a bit-serial scan loop by the mechanism of a shift register, called a SCAN/SHIFT REGISTER. Such a scan loop is circular, also passing through a dual rank scan/shiftable register within the CENTRAL COMPLEX (which contains the control store) and returning to the SCAN/SHIFT REGISTER within the SYSTEM SUPPORT PROCESSOR. After the transmission of the addressing control, HEADER word, information which addresses a particular CENTRAL COMPLEX and causes such CENTRAL COMPLEX to effectuate the loading of its control store from that data next bit-serially transferred across the scan loop, the accomplishment of simultaneous loading (writing) and reading operations between the controlling SYSTEM SUPPORT PROCESSOR and the slave CENTRAL COMPLEX is based on this circular nature of the bit-serial scan loop. As one portion of data is shifted from the SCAN/SHIFT REGISTER of the SYSTEM SUPPORT PROCESSOR to and through the dual rank scan/shiftable register within the CENTRAL COMPLEX (wherein, upon receipt, it may then be utilized for the loading of the control store within such CENTRAL COMPLEX), a previously loaded (written) data portion within said selfsame dual rank scan/shiftable register will be bit-serially read back into the selfsame SCAN/SHIFT REGISTER of the SYSTEM SUPPORT PROCESSOR. In a hardware selectable operational mode called ECHO, this data read back in time-overlap with the writing of subsequent portions is simply lodged within a buffer memory for later, microprogrammed controlled, comparison with the written data, which is still stored within a different portion of said buffer memory, for comparison and verification purposes. Thusly, in this first aspect of the invention, on the loading (writing) and the reading of data are substantially simultaneously time-overlapped in the bit-serial transmission of scan data bidirectionally between the SYSTEM SUPPORT PROCESSOR and the CENTRAL COMPLEX upon the scan loop.

As the second aspect of the present invention, however, the digital logic hardware apparatus of the SYSTEM SUPPORT PROCESSOR can be selectively enabled to verify each data portion as and when read back from the control store of the CENTRAL COMPLEX via the scan loop. In such a selectable operational mode, called VERIFY mode, the ongoing comparison of the data written with the data read for the purposes of verification is transpiring substantially time-overlapped with the loading (writing) and reading—which are also time-overlapped. Thusly, upon the selection of these second aspect VERIFY operational mode, the loading (writing), reading and verification of data transferred from a SYSTEM SUPPORT PROCESSOR to the control store of a remote CENTRAL COMPLEX via a circular bit-serial scan loop will transpire substantially simultaneously, ending when the last portion of data read is correctly verified. In the apparatus and method of the present invention, the detection of a verification error will result in an interrupt, and all parameters usefull to a controlling microprocessor to assess the nature and location of the detected error will be available within addressable buffer memory store and register locations of the apparatus.

Under the parameters of process control, such as are contained within registers, there are no unused or superfluous bits involved in any portion of the control and/or data communication via the bit-serial scan loop. Coupled with the time-overlapped performance of the loading, reading and verification processes, the net result is to perform the loading of a remote control store via a bit-serial scan loop as efficiently and as quickly as possible. Comprehensive full control of the apparatus is enabled for the addressable selection of a single remote CENTRAL COMPLEX from amongst a plurality of such complexes, for the selection of a single addressable scan loop (such as may be associated with a single control store) from amongst a plurality of such scan loops within such CENTRAL COMPLEX, for specification control of the exact number of bits which will be transferred in each portion of data to such CENTRAL COMPLEX, for specification control of the exact total numbers of such portions as will in aggregate be transferred to such CENTRAL COMPLEX, and for developing, and retaining, all information as allows the diagnosis, whether by microprogram or human means, of any detected verification error occurring within the overall activity of the invention.

Correspondingly, it is the first object of the present invention that when a controlling digital logic device, called a SYSTEM SUPPORT PROCESSOR, does load (write) data to a remote second slave digital logical device via a bit-serial scan loop, and where this controlling digital device, this SYSTEM SUPPORT PROCESSOR, does also read the data written via a circular continuation of this selfsame bit-serial scan loop, then the loading (writing) of second portions of data to such second slave digital logical device should transpire simultaneously, in time-overlap, with the reading of first portions of data back from such second slave digital logic device. When the second slave digital logic device, called a CENTRAL COMPLEX, utilizes said data bit-serially written to it across said scan loop by the SYSTEM SUPPORT PROCESSOR to cause the loading of a control store therein such CENTRAL COMPLEX device, then the net operation performed is the simultaneous time-overlapped, loading (writing) of second data portions to such control store while first, previously loaded (written), second data portions of such control store are being read back to the process-controlling SYSTEM SUPPORT PROCESSOR.

It is a second object of the present invention that each successive portion of data as read back to the first controlling digital logic device, the SYSTEM SUPPORT PROCESSOR, may, if the VERIFY operational mode is selected, be compared with the selfsame data portion as written (in order thereby to verify the correctness of the loading (writing) and reading) in substantial time-overlap with the already time-overlapped loading (writing) and reading processes. Conversely, should this substantially simultaneous verification (the VERIFY operational mode) not be selectively enabled, it is the object of the present invention that both the entirety of the data written, and the entirety of the data read as an "ECHO" should become lodged within a buffer memory so that comparison verification of such may later be readily accomplisehd by programmed software means. The converse operation to the VERIFY operational mode is called the ECHO operational mode.

It is a third object of the present invention that the bit size of the successive data portions—which data portions are in time-overlap loaded (written) to and read from the second slave digital logic device, the remote CENTRAL COMPLEX, by the controlling first digital logic device, the SYSTEM SUPPORT PROCESSOR, via the bit-serial circular scan loop—should be controllably specifiable. No more, nor any less, than the exactly specified number of bits will be transferred as each successive date portion. Additionally, it is also a third object of the present invention that the total numbers of such portions should be controllably variably, exactly specifiable. Resultantly to accomplishing such an objective, the total size, and the granularlity of the informational data transfers bidirectionally simultaneously occurring between the controlling SYSTEM SUPPORT PROCESSOR and each remote, controlled, CENTRAL COMPLEX may be versatilely specified in accordance with the requirements each of a plurality of such remotely controlled CENTRAL COMPLEXES.

Thusly, specifiable control of both the total bit length and the bit length (granularity) of each portion of the data transfer having been realized in satisfaction of the third objective of the invention, it is a subordinate fourth objective that such specifiable versatility should be utilizable in generalized solution to the problem of time efficient loading, reading and verification of data transmission via a bit-serial scan loop to/from generalized remote, CENTRAL COMPLEX type, devices interconnectable to such scan loop. This subordinate fourth objective—obtaining generalized applicability of the capability of the apparatus and method of the present invention to be particularly variably specified for the bit amount of data transfer and verification transpiring via a circular scan loop—is met in the capability of the present invention to (1) address a single one CENTRAL COMPLEX out of a plurality of such CENTRAL COMPLEXES connected to the selfsame scan loop, and (2) to further address a single scan string (as may be associated with an individual, particular, control store) out of a potential plurality of such scan strings within the selected CENTRAL COMPLEX device. Through the simultaneous realization of the third and subordinate fourth objectives, the actual apparatus and method of the present invention becomes utilizable, without further extension and/or adaptation, in solution of the generalized problem of loading and verifying the data so loaded, from one device to another device upon a circular bit-serial scan loop.

CONVENTIONS EMPLOYED

Throughout the following description and in the accompanying drawings there are certain conventions employed which are familiar to certain of those skilled in the art. Additional information concerning conventions is as follows.

Throughout the drawings, reference designations are comprised of the figure number (up to two digits and one letter) followed by the reference numeral (up to two digits) indicating the unique location of the referenced element, or the first origin of the referenced wire net (line or cable). All logic elements and miscellaneous active elements are assigned even reference numerals. All wire nets, signal lines, cables, pins, buses and like interconnects are assigned odd reference numerals. Such odd reference numeral designation indicates, in its entirety, the figure where the lead originates.

The signal lines and cables are accorded unique descriptive names invariant at all points of usage. Signal lines generally enter at the bottom of logic diagrams and exit at the top. Signals which enter or exit the logic circuit of the present invention altogether from outside the circuit are accorded a symbolism in order that they may be most clearly recognized. Signal lines flowing from or onto buses are represented by broad vectors in the block diagrams. Signal lines channeling signals received from outside logics are accorded a "Y"-like ingress symbol, while signal lines exiting the circuit of the present invention to other logics are "V"-tipped (like arrows) as an egress symbol. If a signal line possesses neither a "Y" or a "V" symbol then it is generated within the logics (which may be unshown) of the present invention. If such a signal line, which will be named, is not shown to be connected then the text of the specification should be referred to for the purpose and manner of generation of such a signal. All signals ingressing or egressing from outside logics to the logics of the present invention are similarly explained.

BRIEF DESCRIPTION OF THE DRAWINGS

FIG. 5a shows the manner of addressing, and utilization of the SCAN/SET BUFFER memory during the operation of the apparatus of the present invention in the block ECHO mode for substantially simultaneously loading (writing) and reading data transmission from and to a SYSTEM SUPPORT PROCESSOR and a control store within a CENTRAL COMPLEX.

FIG. 5b shows the format of addressable registers, and example quantities which might be lodged therein, which are within the SYSTEM SUPPORT PROCESSOR, and which registers control the operation of the present invention.

FIG. 6a shows the manner of utilization of the SCAN/SET BUFFER memory during the operation of the apparatus of the present invention in the non-block ECHO mode for time-overlapped simultaneous loading (writing) and reading of a remote CENTRAL COMPLEX via a bit-serial scan loop, but wherein the verification of data read is not specified to be time-overlapped with such loading (writing) and reading operations.

FIG. 6b shows another, alternative, representation of the addressing and contents of those selfsame control registers within the SYSTEM SUPPORT PROCESSOR which were previously diagrammatically represented in FIG. 5b.

FIG. 8, consisting of FIG. 8a through FIG. 8f, shows a table giving the Boolean logical expressions for the development of certain control signals utilized in the functional operation of the logic apparatus of the present invention as shown in FIG. 7, and signals communicating with the logic apparatus of the present invention are also listed in FIG. 8f.

DESCRIPTION OF THE PREFERRED EMBODIMENT

Figure 1A:
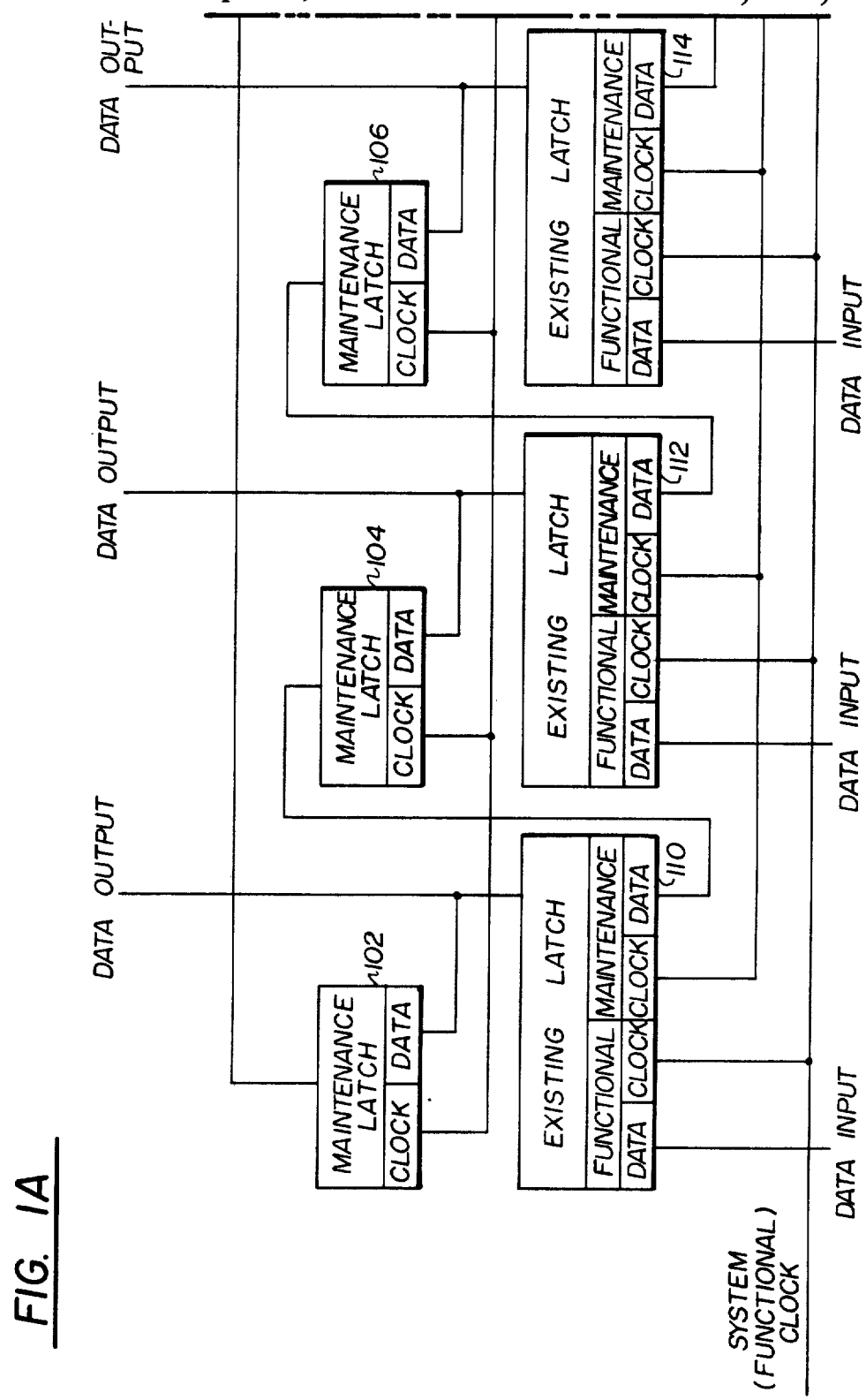
FIG. 1, consisting of FIG. 1a and FIG. 1b, shows the prior art organization of a single string of scan/settable register, such single string as connects to signal lines of a scan/set network.

The present invention deals with a scan/set network. The organization of a single, scan/settable dual rank register, string of a scan/set network is shown as prior art in FIG. 1. A separate second rank MAINTENANCE LATCH, respective latches 102-108, is provided for each first rank EXISTING LATCH, respective latches 110-116, in the system. All the latches are interconnected into a shift register string such that each occurrence of signal SCAN CLOCK PH B on line 103 will transfer the state of the EXISTING LATCH into the corresponding MAINTENANCE LATCH. Each occurrence of the signal SCAN CLOCK PH A on line 107 will left-shift the data one bit position and gate a new data bit as signal SCAN DATA IN on line 105 from the SYSTEM SUPPORT PROCESSOR (not shown) to the least significant EXISTING LATCH 116. Signal SCAN DATA OUT on line 101 from the most significant MAINTENANCE LATCH 102 is the output signal of this single string of a scan/set network back to the SYSTEM SUPPORT PROCESSOR (not shown) which controls the scan/set operation. The collective signal lines 101-107 are referred to as SCAN/SET NETWORK 109. One additional signal, upon a dedicated line, within the SCAN/SET NETWORK 109 is signal SCAN ADDRESS ENABLE, which signal is first diagrammatically represented in FIG. 2.

Figure 2:
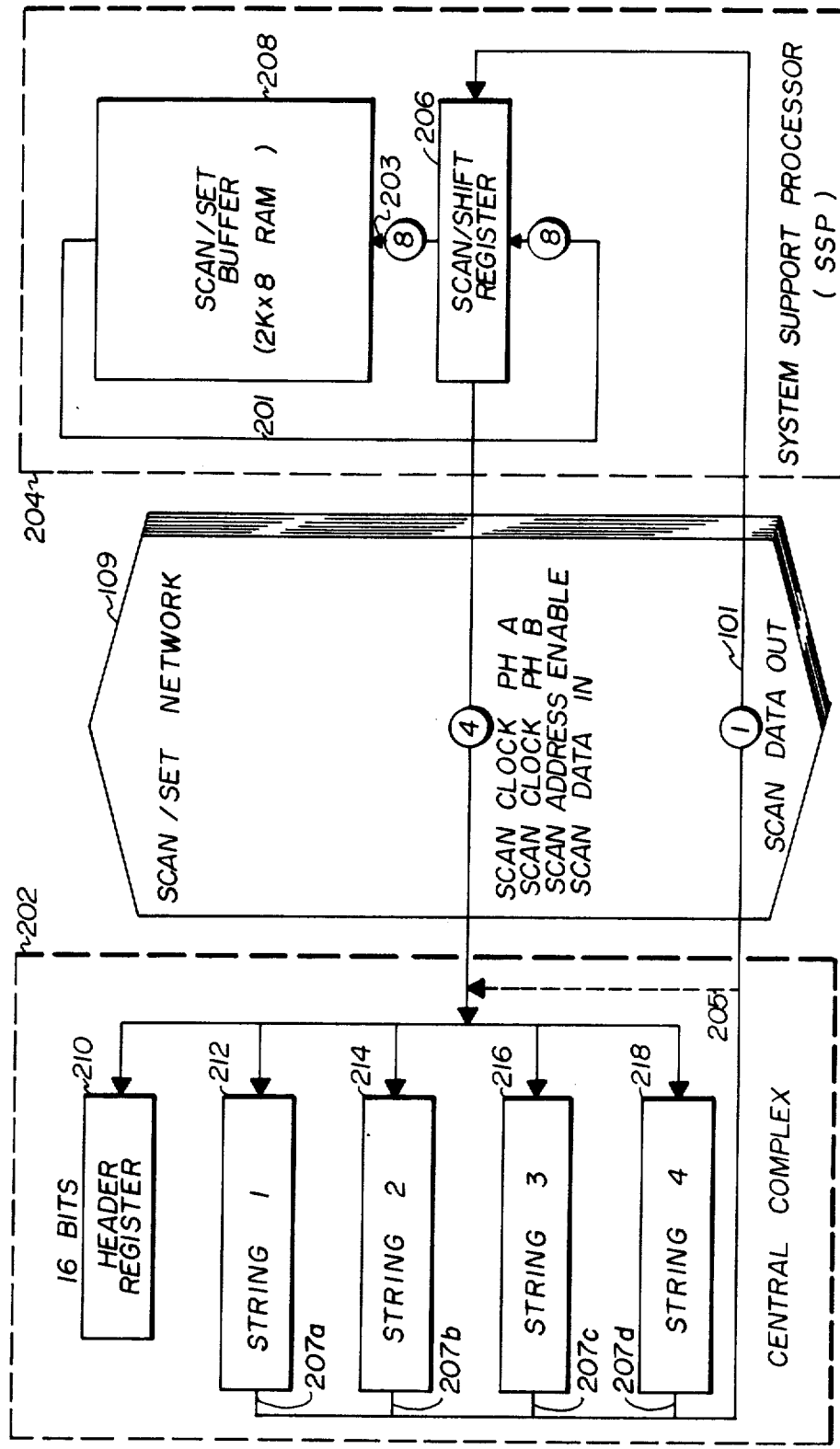
FIG. 2 shows a top level block diagram of a scan/set system.

Continuing next with FIG. 2, a top-level block diagram of a total scan/set system is shown. The master, controlling, device for manipulation of the scan/set operation is the SYSTEM SUPPORT PROCESSOR (SSP) 204. The controlled, slave, device during operation of the scan/set system is the selected CENTRAL COMPLEX 202. The manner of communication between the controlling, SYSTEM SUPPORT PROCESSOR (SSP) 204, and controlled, CENTRAL COMPLEX 202, devices is via the SCAN/SET NETWORK 109. This bus carries signals SCAN CLOCK PH A, SCAN CLOCK PH B, SCAN ADDRESS EN- ABLE and SCAN DATA IN from the SYSTEM SUPPORT PROCESSOR 204 to the CENTRAL COMPLEX 202. This SCAN/SET NETWORK 109 carries signal SCAN DATA OUT on line 101 from the CENTRAL COMPLEX 202 to the SYSTEM SUPPORT PROCESSOR 204. Data transmission via signals SCAN DATA IN and SCAN DATA OUT is bit-serial as clocked by signals SCAN CLOCK PH A and SCAN CLOCK PH B. Signal SCAN ADDRESS ENABLE causes data transmitted from SYSTEM SUPPORT PROCESSOR 204 to CENTRAL COMPLEX 202 via signal SCAN DATA IN to be received into register HEADER 210 (of nominal length 16-bits) within the CENTRAL COMPLEX 202. The total, nominal 16-bits information within this HEADER REGISTER 210 will select a unique one CENTRAL COMPLEX 202, and will further select a unique one of STRING 1 212 through STRING 4 218 for further participation within the current scan/set data transfer operation. Data is next loaded (written) to the selected one of STRING 1 212 through STRING 4 218 (which strings may be of variable bit lengths) from the SCAN/SHIFT REGISTER 206 within SYSTEM SUPPORT PROCESSOR 204 to CENTRAL COMPLEX 202. The data is transmitted as signal SCAN DATA IN clocked by signals SCAN CLOCK PH A and SCAN CLOCK PH B while signal SCAN ADDRESS ENABLE is false. In a like, bit-serial clocked, manner the data is read from the selected one of STRING 1 212 through STRING 4 218 as signal SCAN DATA OUT on line 101 to the SCAN/SHIFT REGISTER 206 within the SYSTEM SUPPORT PROCESSOR 204. Thusly, the bit-serial data transfer path from the SCAN/SHIFT REGISTER 206 across the SCAN/SET NETWORK 109, through the selected one of STRING 1 212 through STRING 4 218, and back across the SCAN/SET NETWORK 109 to the selfsame SCAN/SHIFT REGISTER 206 is a complete, circular, loop called a SCAN loop. The 8-bit SCAN/SHIFT REGISTER 206 is loaded in parallel from SCAN/SET BUFFER (2K×8 RAM) 208 via bus 201, and data is read from the SCAN/SHIFT REGISTER 206 via 8-bit bus 203 back to such SCAN/SET BUFFER (2K×8 RAM) 208.

Figure 3B:
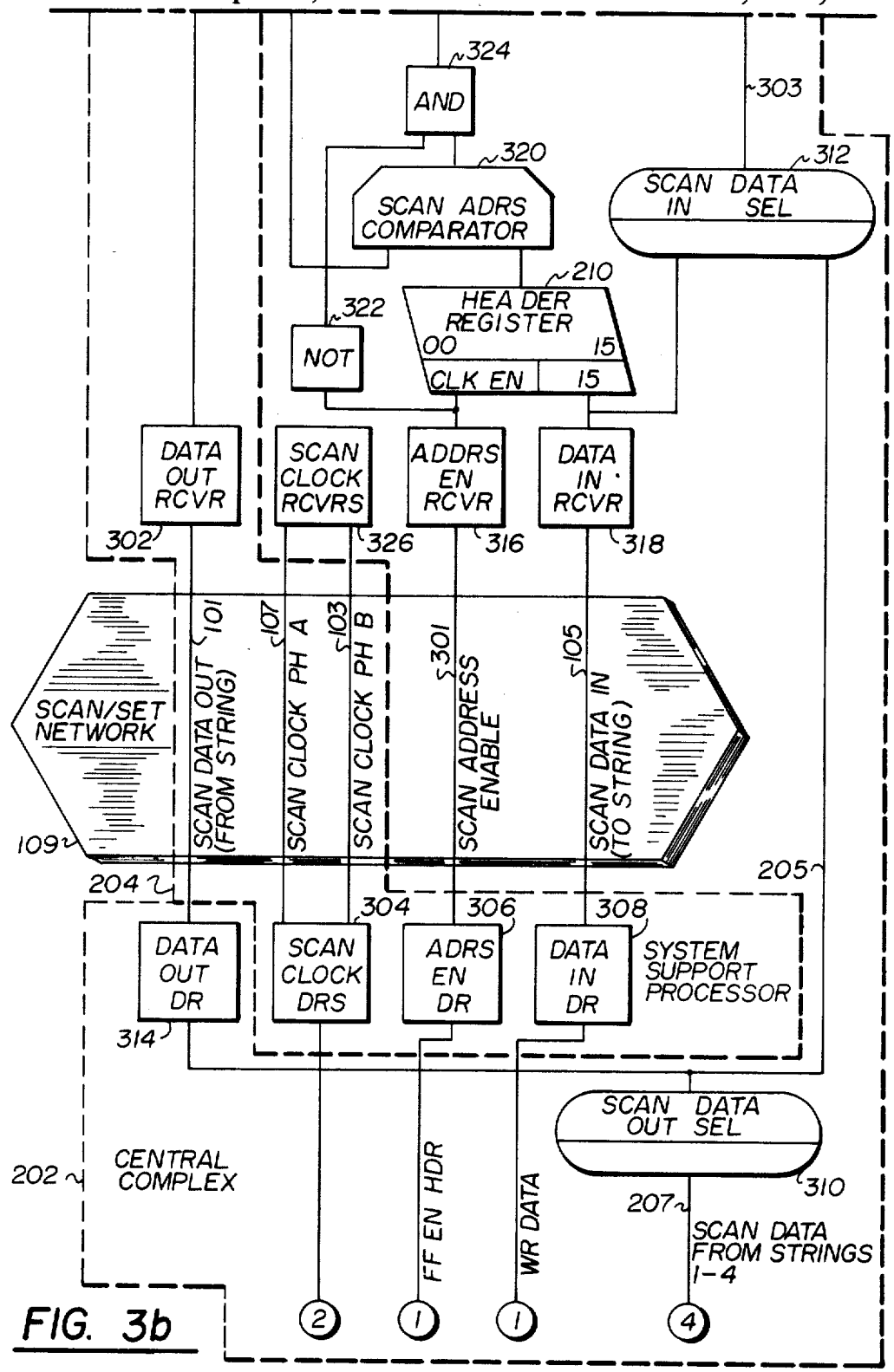
FIG. 3 shows a block diagram of the logics within the slave CENTRAL COMPLEX, such logics as enable such CENTRAL COMPLEX to respond to the manner and method of control to be applied thereto by the circuit apparatus of the present invention within the SYSTEM SUPPORT PROCESSOR to be shown in FIG. 4 and subsequent Figures.

The scan/set process control logics for the slave CENTRAL COMPLEX 202, such logics as are entirely located within CENTRAL COMPLEX 202, are shown in block diagram form in FIG. 3. The entirety of the digital logic shown in the block diagram in FIG. 3, which may be implemented upon a single chip in gate array technology, is normally replicated on each and every scan/set network connected unit within an entire computer system, including CENTRAL COMPLEX UNIT(S) 202 and a single SYSTEM SUPPORT PROCESSOR UNIT 204. However, the single data output receiver, DATA OUT RCVR 302, and the four drivers—SCAN CLOCK DRS 304 (two drivers), ADRS EN DR 306 and DATA IN DR 308—which are illustrated within the smaller L-shaped dotted-line enclosure labeled SYSTEM SUPPORT PROCESSOR 204, are utilized only within the SYSTEM SUPPORT PROCESSOR master scan/set process-controlling digital logical device. The remainder of the logics shown in FIG. 3, those within the larger dotted-line enclosed area labeled CENTRAL COMPLEX 202, occur within each and every CENTRAL COMPLEX unit of the scan/set network interconnected computer system. These remaining logics are also occurring, and functional within the SYSTEM SUPPORT PROCESSOR 204. The use of these logics within the SYSTEM SUPPORT PROCESSOR 204 is, however, purely for when the actively functional, scan/set controlling, SYSTEM SUPPORT PROCESSOR 204 addresses itself, and its own scan/set testable logics, as a slave, controlling device. Thusly the logics within the larger dotted-line enclosed area shown in FIG. 3 always function as slave control logics, whether utilized in any CENTRAL COMPLEX 202 or within the SYSTEM SUPPORT PROCESSOR 204.

Generally, the logics shown in block diagram form in FIG. 3 represent the slave control logics such as are identically replicated in each scan/set network interconnected CENTRAL COMPLEX 202. Being the logics within the slave device to the scan/set operation, the logics shown in FIG. 3 are not integral to the function of the present invention for controlling the simultaneous load and verification of a remote device, the controlled CENTRAL COMPLEX device which may contain a control store, from a controlling device, the SYSTEM SUPPORT PROCESSOR device, via a bit-serial scan loop. The scan data from up to four strings is received as signals SCAN DATA STRINGS 1–4 on cable 207 (previously seen as lines 207a through 207d in FIG. 2) into the scan data output selector SCAN DATA OUT SEL 310. The selected scan data output is transmitted to the data output driver DATA OUT DR on line 301 for transmission to the SYSTEM SUPPORT PROCESSOR as signal SCAN DATA OUT (FROM STRING) on line 101, and is additionally transferred to the scan data input selector, SCAN DATA SEL 312 via line 205. The selection in the scan data input selector, SCAN DATA IN SEL 312, of the signal on line 205 will be enabled during the scan process, thereby allowing the circular shifting back of the read data into the strings.

Continuing in FIG. 3, during the scan loop write operation, the continuing true condition of signal SCAN ADDRESS ENABLE on line 301 as received at the address enable receiver ADDRS EN RCVR 316 will cause the header data received as signal SCAN DATA IN (TO STRING) on line 105 to be received through the data input receiver DATA IN RCVR 318 and serially gated into HEADER REGISTER 210, previously seen in FIG. 2. If a fixed number of bits, nominally 10, of the header word quantity as lodged in HEADER REGISTER 210 identically compare with a like number, nominally 10, of card identification bits, received as signals UNIT ADDRESS AND CARD SELECT BITS, in the scan address comparison circuitry SCAN ADRS COMPARATOR 320, then the positive (identical) results of such comparison will, upon such time as signal SCAN ADDRESS ENABLE on line 301 becomes false (as received in ADDRS EN RCVR 316 and inverted in NOT logical element 322) satisfy AND logical element 324 and produce the logical true signal CARD AND STRING SELECTED. When a slave CENTRAL COMPLEX card device and a certain string contained therein is so selected, then subsequent data occurrences of signal SCAN DATA IN (TO STRING) on line 105 as received at DATA IN RCVR 318 will be enabled for passage through the scan data input selector SCAN DATA IN SEL 312 for circulation to the selected string as signal SCAN/SET DATA TO STRING 1–4 on line 303. The entire SCAN loop process is clocked under control of signals SCAN CLOCK PH A on line 107 and SCAN CLOCK PH B on line 103 as received at the scan clock receivers SCAN CLCK RCVRS 326. The manner by which the slave, CENTRAL COMPLEX device will be first identified by the receipt of a header word selecting such device and also an individual string contained therein, and the manner by which such device will subsequently receive bit-serial transmission of scan data via a SCAN loop, will become clear as the invention is further explained in conjunction with the block diagram of FIG. 4, the memory address maps of FIG. 5 and FIG. 6 and the logic diagram of FIG. 7.

Figure 4B:
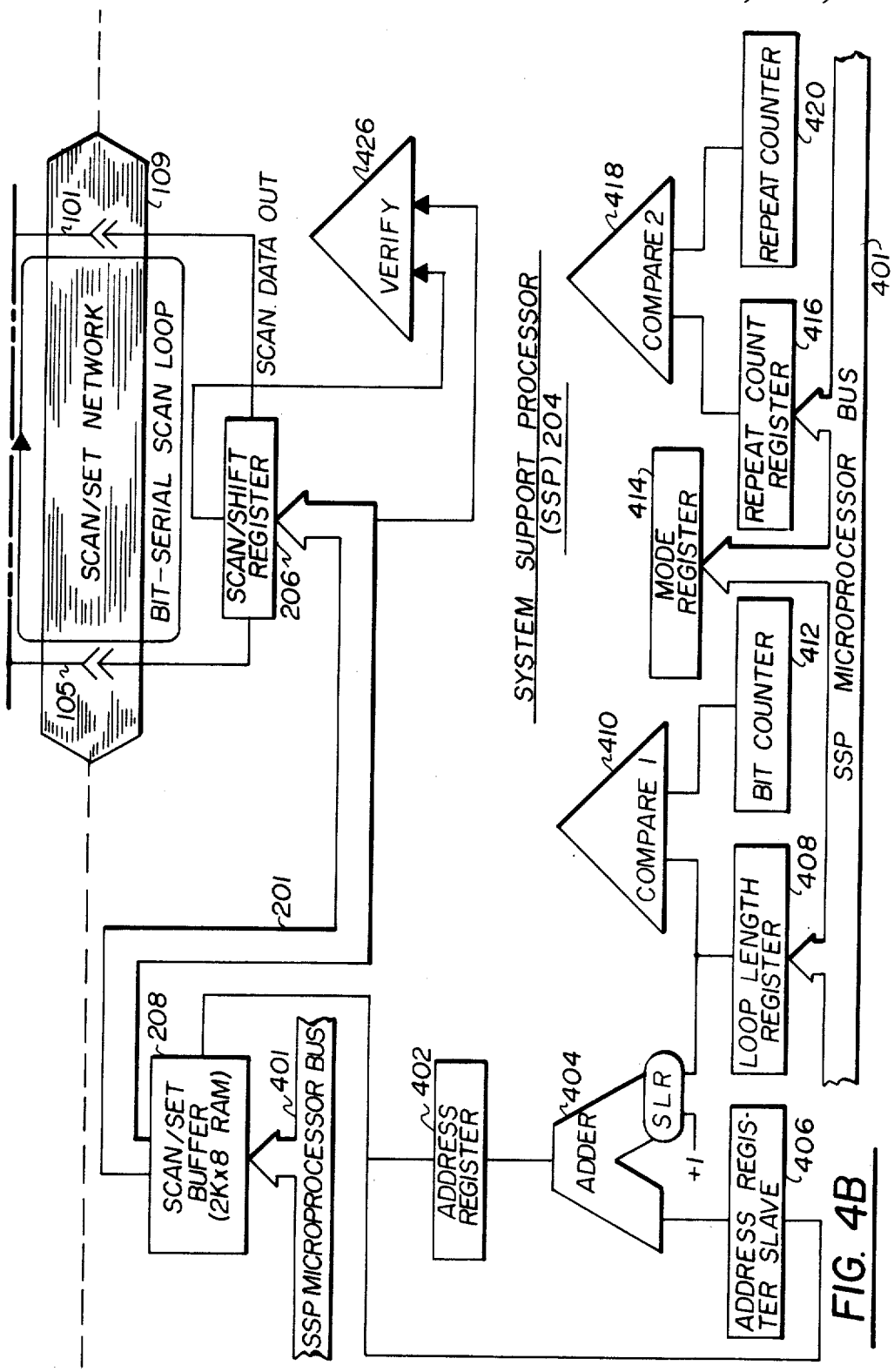
FIG. 4, consisting of FIG. 4a and FIG. 4b, shows a second-level block diagram of the circuit apparatus of the present invention and interfacing circuitry, such block diagram as depicts both the functional operation of the present invention and the logical circuit apparatus of its implementation, such circuit apparatus of the present invention as resides within the SYSTEM SUPPORT PROCESSOR which is shown below the dashed line in FIG. 4b.

A block diagram of the functional process of the simultaneous load and verification of data transmitted to a remote controlled, CENTRAL COMPLEX, device from a controlling, SYSTEM SUPPORT PROCESSOR, device via a bit-serial SCAN loop is diagrammed in FIG. 4. The logics diagrammatically represented below the mid-sheet dotted dividing line are those of the SYSTEM SUPPORT PROCESSOR (SSP) 204 previously seen in FIG. 2. The logics diagrammatically represented above the mid-sheet dotted dividing line are those of the CENTRAL COMPLEX 202, which CENTRAL COMPLEX is subject to having control store(s) loaded/verified, previously seen in FIG. 2. The electrical interconnection between the SYSTEM SUPPORT PROCESSOR (SSP) 204 and the CENTRAL COMPLEX 202 is via the SCAN/SET NETWORK 109 which incorporates, most particularly through signals SCAN DATA IN on line 105 and signal SCAN DATA OUT on line 101 (previously seen in FIG. 2 and FIG. 3) the bit-serial SCAN loop as is diagrammatically illustrated.

In initiation of the apparatus diagrammatically represented in FIG. 4 prior to the simultaneous load and verification via the SCAN loop, the microprocessor controller of the SYSTEM SUPPORT PROCESSOR (SSP) 204 will load a two byte header in the SCAN/SET BUFFER (2K×8 RAM) 208. This header data is followed by that data which is desired to be transmitted to the CONTROL STORE SCAN LOOP STRING 422, and potentially (if header control so directs) to the CONTROL STORE (RAM) 424 of the CENTRAL COMPLEX 202. The microprocessor (not shown) within the SYSTEM SUPPORT PROCESSOR 204 also loads the bit length of the control storage SCAN loop in the LOOP LENGTH REGISTER 408, and loads the number of addresses to be verified plus one into the REPEAT COUNT REGISTER 416. The number of addresses to be written equals the number to be verified plus one. The SCAN loop load and verify operation is initiated when the microprocessor finally writes the MODE REGISTER 414 with a particular code which identifies the SCAN READ, SCAN WRITE, or (of particular pertinence to the present invention) the ECHO mode write operation (time-overlapped SCAN loop reading and writing), or the VERIFY mode SCAN loop write operation (time-overlapped SCAN loop reading and writing and verifying). The microprocessor is not involved in further sequencing of timing of the logic apparatus of the present invention, such logic apparatus within the SYSTEM SUPPORT PROCESSOR 204 proceeding under such discrete control as will be taught to accomplish the entire SCAN loop write with verify process (or variants thereof).

After initialization, including the final operation of writing the directed function in the MODE REGISTER 414, the circuit of the present invention within the SYSTEM SUPPORT PROCESSOR 204 will recover the SCAN header from the SCAN/SET BUFFER (2K×8 RAM) 208 via bus 201 to the SCAN/SHIFT REGISTER 206. From SCAN/SHIFT REGISTER 206 it will be bit-serially trnasferred to all CENTRAL COMPLEX UNITS in the entire scan/set network as signal SCAN DATA IN on line 105 plus the true state of the header active control signal SCAN ADDRESS ENABLE on line 301 (shown in FIG. 3). The scan header, as enabled for receipt into the HEADER REGISTER 210 of all scan/set network interconnected CENTRAL COMPLEX UNITS, will select one such unique unit and a unique CONTROL STORE SCAN LOOP STRING 422 therein. When the header active signal, signal SCAN ADDRESS ENABLE on line 301 shown in FIG. 3, becomes inactive, then only the uniquely addressed CENTRAL COMPLEX 202 will continue to use the SCAN DATA IN signal on line 105.

After transmission of the SCAN header, the circuit of the present invention within the SYSTEM SUPPORT PROCESSOR 204 will transfer SCAN data 8-bits at a time in parallel from the SCAN/SET BUFFER (2K×8 RAM) 208 via bus 201 to the SCAN/SHIFT REGISTER 206. From the SCAN SHIFT REGISTER 206 such SCAN data is transmitted bit-serially as signal SCAN DATA IN on line 105 to the selected CONTROL STORE SCAN LOOP STRING 422 within the selected CENTRAL COMPLEX 202. A hardware bit counter, BIT COUNTER 412, is incremented with each bit transmitted. Logics within the CENTRAL COMPLEX 202 will serially shift this SCAN data into CONTROL STORE SCAN LOOP STRING 422 so long as the header active signal, signal SCAN ADDRESS ENABLE on line 301 is inactive, and so long as the proper address is within the HEADER REGISTER 210. This new SCAN data is bit-serially shifted in via signal SCAN DATA IN on line 105 to CONTROL STORE SCAN LOOP STRING 422, and the initial state of such CONTROL STORE SCAN LOOP STRING 422 is bit-serially shifted out as signal SCAN DATA OUT on line 101 back to SCAN/SHIFT REGISTER 206. Thus the bit-serial SCAN loop illustrated is circular.

The circuit of the present invention within the SYSTEM SUPPORT PROCESSOR 204 detects the completion of the entire first load of the CONTROL STORE SCAN LOOP STRING 422 (which may be a variably specifiable bit length) when the contents of the dynamic BIT COUNTER 412 are detected in COMPARE I 410 to equal the contents of the LOOP LENGTH REGISTER 408. Thusly, the loop length bit count, originally written in the LOOP LENGTH REGISTER 408 by the microprocessor via SSP MICROPROCESSOR BUS 401, determines the bit length of the CONTROL STORE SCAN LOOP STRING 422, such as may be repeatedly written. If logics within the CENTRAL COMPLEX 202 interpret the data within such CONTROL STORE SCAN LOOP STRING 422 to be an ADDRESS, DATA, and READ/WRITE (R/W) field, then such logics can enable the writing of a control storage location within CONTROL STORE STORE (RAM) 424 responsively to such interpretation. That such data within CONTROL STORE SCAN LOOP STRING 422 will actually be written to, and subsequently reread from, CONTROL STORE (RAM) 424 is not integral to the most basic objective of the present invention for simultaneously reading and writing (and selectively simultaneously verifying) bit-serial scan data as transmitted between SCAN/SHIFT REGISTER 206 within the SYSTEM SUPPORT PROCESSOR 204 and the CONTROL STORE SCAN LOOP STRING 422 within the CENTRAL COMPLEX 202. However, the non-trivial utilization of this data within the CONTROL STORE SCAN LOOP STRING 422 to cause the loading (writing) of the CONTROL STORE (RAM) 424 is the most interesting utilization of the time-overlap attributes of the present invention, and is so indicated within the title of this specification.

Continuing in FIG. 4, when the circuit of the present invention is so utilized to this final purpose of the multi-block (time-overlapped reading and verifying) loading of CONTROL STORE (RAM) 424 within CENTRAL COMPLEX 202, then such circuit will cause the increment of REPEAT COUNTER 220. The circuit will also cause the retransmission of the SCAN header as retrieved from SCAN/SET BUFFER (2K × 8 RAM) 208 to SCAN/SHIFT REGISTER 206, and will cause the CENTRAL COMPLEX 202 to receive such SCAN header (again transmitted as signal SCAN DATA IN on line 105) into the HEADER REGISTER 210 under the active condition of the header active control signal (signal SCAN ADDRESS ENABLE on line 301 shown in FIG. 3). Logics within the CENTRAL COMPLEX 202 will, should this further extension of the present invention unto the writing of CONTROL STORE (RAM) 424 be exercised, write the DATA field from the CONTROL STORE SCAN LOOP STRING 422 at the address from the ADDRESS field of such CONTROL STORE SCAN LOOP STRING 422 under control of the write enablement bit, READ/WRITE (R/W) being set (equalling one). This writing of data from the CONTROL STORE SCAN LOOP STRING 422 to the CONTROL STORE (RAM) 424 is accomplished in parallel as the occurrence of the first SCAN clock signal (SCAN CLOCK PH A on line 107 shown in FIG. 3) present concurrently with the SCAN header active signal (signal SCAN ADDRESS ENABLE on line 301 shown in FIG. 3) during retransmission of the SCAN header. After allowing for the access time of CONTROL STORE (RAM) 424, logics within CENTRAL COMPLEX 202 will cause the written data to be read back out of CONTROL STORE (RAM) 424 in parallel to the DATA portion of the CONTROL STORE SCAN LOOP STRING 422. During this optional utilization within the CONTROL STORE SCAN LOOP STRING 422 to write, and to subsequently reread the data written, to CONTROL STORE (RAM) 424, the logics of the present invention will maintain the header control signal (signal SCAN ADDRESS ENABLE on line 301 shown in FIG. 3) in the active state. Obviously, however, it is not necessary to the continuing operation of the present invention that anything actually has been done with the field or fields of CONTROL STORE SCAN LOOP STRING 422. Indeed, if the loading (storing) and rereading of CONTROL STORE (RAM) 424 has been accomplished without error, then the bit contents of CONTROL STORE SCAN LOOP STRING 422 will be unchanged from their conditions as initially bit-serially established under control of signal SCAN DATA IN on line 105 arising from SCAN/SHIFT REGISTER 206.

Continuing in FIG. 4, the circuit of the present invention within the SYSTEM SUPPORT PROCESSOR will next transfer the first byte of the second block string to be transmitted from the SCAN/SET BUFFER (2K × 8 RAM) 208 in parallel via cable 201 to SCAN/SHIFT REGISTER 206. This data is bit-serially shifted out of the SCAN/SHIFT REGISTER 206 as signal SCAN DATA IN on line 105 to the CONTROL STORE SCAN LOOP STRING 422. As each single bit is serially shifted out, a corresponding bit from the contents of CONTROL STORE SCAN LOOP STRING 422 is transferred as signal SCAN DATA OUT on line 101 back into the SCAN/SHIFT REGISTER 206 within the SYSTEM SUPPORT PROCESSOR 204. After eight complete bits have been shifted out of the SCAN/SHIFT REGISTER 206, then 8-bits retrieved from the CONTROL STORE SCAN LOOP STRING 422 will be assembled in such SCAN/SHIFT REGISTER 206. Utilizing the contents of LOOP LENGTH REGISTER 408 as an offset to the address contained within ADDRESS REGISTER 402 as routed through ADDRESS REGISTER SLAVE 406 to, and in, ADDER 404, the logics of the present invention formulate within ADDRESS REGISTER 402 the address of the previously transmitted byte, such byte as has now been retrieved via the bit-serial SCAN loop. This address is supplied from ADDRESS REGISTER 402 to (again) read this previously transmitted byte from SCAN/SET BUFFER (2K × 8 RAM) 208 to the VERIFY logics 426 wherein it is compared with the reread byte lodged in SCAN/SHIFT REGISTER 206. The output of VERIFY logics 426 will set an error flip-flop (not shown) if a mismatch occurs. The reference address to the SCAN/SET BUFFER (2K × 8 RAM) 208 as incremented, or offset, by the contents of LOOP LENGTH REGISTER 408 is stored in ADDRESS REGISTER SLAVE 406. The process of loading (writing) and simultaneously time-overlapped reading and verifying continues until the contents of BIT COUNTER 412 are detected as equal to the contents of LOOP LENGTH REGISTER 408 in circuit COMPARE 1 410. This is called the VERIFY operational mode. Alternatively selectively the reread data, byte by byte, may also be relodged from the SCAN/SHIFT REGISTER 206 (wherein it is received back) to dedicated stores area within the SCAN/SET BUFFER (2K × 8 RAM) 208 (path not shown). This is called the ECHO operational mode. This SCAN loop string by SCAN loop string, and byte by byte within each SCAN loop string, reassembly of the message read (in time-overlap), versus the message sent, within the stores of SCAN/SET BUFFER (2K × 8 RAM) 208 will serve as a detailed failure record should any fault be detected. Indeed, when the circuit of the present invention is selectively specifiably operable in this ECHO operational mode then the VERIFY circuit 426 is not enabled for the simultaneous, byte by byte within SCAN loop string by SCAN loop string, verification of the SCAN loop data read to the SCAN loop data written. When the time-overlapped verification is not selected, the ECHO operational mode, then the parallelly transmitted and received messages within the SCAN/SET BUFFER (2K × 8 RAM) 208 may be compared by microprogram microprocessor means operating through SSP MICROPROCESSOR BUS 401 in order to compare, under microprogram control, the equivalence of the written and read buffered messages. The utilization of SCAN/SET BUFFER (2K × 8 RAM) 208 in the VERIFY operational mode will be further seen in FIG. 5c, and in the ECHO operational mode in FIG. 5a and FIG. 6a.

Continuing in FIG. 4, during the transmission of the entirety of a SCAN data message, which may consist of any number of bytes and partial bytes, as fills the entirety of CONTROL STORE SCAN LOOP STRING 422, the bit count contained in BIT COUNTER 412 is incremented (path not shown) and compared to the value contained within LOOP LENGTH REGISTER 408 within COMPARE 1 circuit 410 in order to control the BIT-SERIAL SCAN LOOP shifting of the entirety of such message. The buffer addresses of successive bytes of such a message, and the address of successive bytes of the return message, are at separate times contianed within ADDRESS REGISTER 402 and incremented by one in the loop consisting of ADDER REGISTER SLAVE 406 and ADDER 404 in order to locate successive byte quantities to be transmitted, or to be stored as received, within SCAN/SET BUFFER (2K×8 RAM) 208. When the manner of organization of the SCAN/SET BUFFER (2K×8 RAM) 208 for addressing is seen in upcomping FIG. 5 and FIG. 6, the utilization of the offset obtained as the quantity contained within the LOOP REGISTER 408, and the incrementation of byte addresses by +1 proceeding from such a base of a block data string, will become increasingly clear.

Continuing in FIG. 4, as BIT-SERIAL SCAN LOOP data is simultaneously loaded (written) to the CONTROL STORE SCAN LOOP STRING 422 of the CENTRAL COMPLEX 202, and read (retrieved) from the SCAN STORE SCAN LOOP STRING 422 of the CENTRAL COMPLEX 202 to the SCAN/SHIFT REGISTER 206 of the SYSTEM SUPPORT PROCESSOR 204 and then to the memory stores within the SCAN/SET BUFFER (2K×8 RAM) 208, the repeat count contained with the REPEAT COUNTER 420 will be incremented by one (path not shown) and the entire process will continue until such incremented repeat count from REPEAT COUNTER 420 is detected to be equal to the value contained within REPEAT COUNT REGISTER 416, in, and by, COMPARE 2 logic 418. The occurrence of a miscompare, or mismatch, in VERIFY LOGIC 426 will priority interrupt the microprocessor and suspend SCAN loop communication activity (until such time, if any, as the microprocessor reinitiates such). Otherwise, a normal completion comparison resulting from an equal comparison in COMPARE 2 logics 418 will cause a completion interrupt. The complete status of the operation, plus sufficient historical information in ECHO mode on all buffers transferred and read, exists within SCAN/SET BUFFER (2K×8 RAM) 208 in order to further allow the microprocessor to evaluate the normal completion, or any errors resultant during the attempt, of the entire simultaneous load and read, and selectively verify operation.

The bit length of the SCAN loop data, such as is transmitted from the SCAN/SHIFT REGISTER 206 of the SYSTEM SUPPORT PROCESSOR 204 to the CONTROL STORE SCAN LOOP STRING 422 of the CENTRAL COMPLEX 202 is exactly determinable by the specified loop length as parameterized in LOOP LENGTH REGISTER 408. Although certain justification of partial byte messages needs occur within SCAN/SHIFT REGISTER 206, only the exactly equal number of bits as comprise the entirety of each SCAN loop string transmitted will be rotatably communicated upon the BIT-SERIAL SCAN LOOP. Furthermore the number of such successive strings to be transferred is exactly specifiable as the parameter inserted within REPEAT COUNT REGISTER 416. When it is considered that one unique CONTROL STORE SCAN LOOP STRING 422 was selected out of a plurality of such which exists within any unique CENTRAL COMPLEX 202, one of plurality of such as may exist within an entire computer system interconnected by a SCAN/SET NETWORK 109, then it may be recognized that the apparatus functionally diagrammed in FIG. 4 contains the generalized capability to address a multiplicity of SCAN loop strings of a specifiable bit length in order to concisely perform the loading (writing) and reading thereof via a BIT-SERIAL SCAN LOOP in substantially simultaneous time. Additionally, the verification of such SCAN loop read data may be substantially simultaneously accomplished in VERIFY logic 426 is optionally so specified during the initiation of the process. Although the granularity of such verification, and the granularity of data transfers between the SCAN/SET BUFFER (2K×8 RAM) 208, the SCAN/SHIFT REGISTER 106, and the VERIFY logic 426 has been established at one byte, or 8-bits, it should be recognized that the time-overlapped read and write data transmission occurring within the BIT-SERIAL SCAN LOOP is not affected by such granularity and, indeed, the time-overlap of the loading (writing) and reading operations is for, during, and at the entirety of a SCAN loop string, such as that entire SCAN loop string which becomes lodged in CONTROL STORE SCAN LOOP STRING 422. It may be considered that the verification being performed in VERIFY logics 426 is granularized at the byte level, although whether such verification transpires at the bit, the byte, or the level of the entire (specifiable length) content of an entire SCAN loop string is essentially irrelevant to the detection of errors between the SCAN loop data buffer as sent and as received.

The summary operation of the present invention for the time-overlapped simultaneous loading (writing) and reading, and selectively time-overlapped simultaneous verification, of data circularly transmitted via a circular BIT-SERIAL SCAN LOOP to a controlled slave CENTRAL COMPLEX device (which may further cause such SCAN loop string data to become lodged within a control store) from a controlling master SYSTEM SUPPORT PROCESSOR device is as follows. Referencing FIG. 4, when the SCAN loop WRITE operation is initiated under microprogrammed control within the SYSTEM SUPPORT PROCESSOR 204, the discrete logics controlling the process activate the header control signal, signal SCAN ADDRESS ENABLE on line 301 shown in FIG. 3. The first byte of header data is received in parallel via cable 201 from SCAN/SET BUFFER (2K×8 RAM) 208 to the SCAN/SHIFT REGISTER 206 to be serialized. Under the control of two clock signals as originate at the SYSTEM SUPPORT PROCESSOR 204 signals SCAN CLOCK PH A and SCAN CLOCK PH B as shown in FIG. 2 and FIG. 3, this header data byte is bit-serially shifted as signal SCAN DATA IN on line 105 from the SCAN/SHIFT REGISTER 206 to the HEADER REGISTERS 210 within each of a multiplicity of CENTRAL COMPLEX UNITS 202 within a computer system as are interconnected via a SCAN/SET NETWORK 109. A second header byte is similarly retrieved from SCAN/SET BUFFER (2K×8 RAM) 208 to SCAN/SHIFT REGISTER 206, and then bit-serially shifted to the HEADER REGISTER 210 of all slave CENTRAL COMPLEX UNIT devices. After sixteen occurrences of each of signal SCAN CLOCK PH B on line 103 and signal SCAN CLOCK PH A on line 101, and after one additional occurrence of signal SCAN CLOCK PH B on line 103, then both ranks (reference FIG. 1) of all HEADER REGISTERS 210 within all CENTRAL COMPLEX UNIT 202 devices have the complete, 16-bit, header data. The enable header signal, signal SCAN ADDRESS ENABLE on line 301 shown in FIG. 3, is then deactivated.

Continuing with the summary explanation in reference to FIG. 4, each CENTRAL COMPLEX 202 device determines whether it is the addressed one of all such devices from a device address field within the header quantity stored within HEADER REGISTER 210, and the selected CENTRAL COMPLEX 202 device further selects an individual SCAN loop string from amongst a plurality of such strings in accordance with a further, string select, field of the header quantity within the HEADER REGISTER 210. For the selected one CENTRAL COMPLEX 202 device and the selected SCAN loop string within such device, nominally CONTROL STORE SCAN LOOP STRING 422, a further SCAN write bit within the header quantity within the HEADER REGISTER 210 will cause the data carried upon signal SCAN DATA IN on line 105 to be gated to such CONTROL STORE SCAN LOOP STRING 422 by the SCAN clocks and during the absence of the header enable signal. Conversely, if such write enablement bit were cleared in the header quantity lodged within HEADER REGISTER 210, then the data out of the CONTROL STORE SCAN LOOP STRING 422 would be gated to the input of such string (reference path 205 in FIG. 2). The selected CENTRAL COMPLEX 202, and the selected CONTROL STORE SCAN LOOP STRING 422 within such device, will gate data out as signal SCAN DATA OUT on line 101 for either state of the write enablement bit as contained within the header quantity lodged within HEADER REGISTER 210. The scan/set clock pulses, signals SCAN CLOCK PH A on line 107 and SCAN CLOCK PH B on line 103 shown in FIG. 3, are gated to the selected string, string CONTROL STORE SCAN LOOP STRING 422, in order to shift the data of that string (reference FIG. 1).

Continuing with the summary explanation in reference to the functional block diagram of FIG. 4, the logic control of the SYSTEM SUPPORT PROCESSOR 204 will obtain successive bytes of SCAN data from the SCAN/SET BUFFER (2K×8 RAM) 208 for emplacement within SCAN/SHIFT REGISTER 206, and then for bit-serially shifting upon the BIT-SERIAL SCAN LOOP of the SCAN/SET NETWORK 109 until the entirety of the selected SCAN loop string, CONTROL STORE SCAN LOOP STRING 422, is written. Meanwhile, as each of a potential plurality of bytes and partial bytes as comprise the total bits of the CONTROL STORE SCAN LOOP STRING 422 is shifted into such string under control of signal SCAN DATA OUT on line 105, the priorly existing data within such CONTROL STORE SCAN LOOP STRING 422 is bit-serially shifted as signal SCAN DATA OUT ON line 101 into the SCAN/SHIFT REGISTER 206. Thusly during a write to the CONTROL STORE SCAN LOOP STRING 422, the SCAN/SHIFT REGISTER 206 will send bit-serial data to such string as signal SCAN DATA IN on line 105 in simultaneous time to the receipt of the prior data within such CONTROL STORE SCAN LOOP STRING 422 as signal SCAN DATA OUT on line 101. When an entire byte of data to be written is completely shifted out of SCAN/SHIFT REGISTER 206, and a read byte is entirely shifted in, then the read byte is stored within a read buffer area of the SCAN/SET BUFFER (2K×8 RAM) 208, and a new, next to be written, byte is retrieved from a write buffer area of the same memory. This operational mode, without more, of time-overlapped writing and reading of data upon a BIT-SERIAL SCAN LOOP is called the ECHO mode of operation. Verification of the read, versus the written, data obtained in such ECHO operational mode must be accomplished via a microprogram-directed microprocessor examining the buffer stores of the SCAN/SET BUFFER (2K×8 RAM) 208. Alternatively, when the VERIFY mode of operation is selectively enabled (upon initiation of the entire process), then each read SCAN loop data byte, as and when retrieved, will be compared in the VERIFY logics 426 to the original, previously written, contents of such byte as is retrieved from the SCAN/SET BUFFER (2K×8 RAM) 208. If the contents of the CONTROL STORE SCAN LOOP STRING 422 have been interpreted as ADDRESS DATA, and READ/WRITE (R/W) fields in order to accomplish the write bit enabling loading, and subsequent rereading, of addresses within CONTROL STORE (RAM) 424, then this subsequent verification of the contents of CONTROL STORE SCAN LOOP STRING 422 as bit-serially returned to SCAN/SHIFT REGISTER 206 and, byte-by-byte verified within VERIFY logics 426 suffices, in total, to verify the loading of a control store within a control device simultaneously with the ongoing, continuing loading of such a control store from a support processor via a SCAN loop. The bit length of the CONTROL STORE SCAN LOOP STRING 422 (and thusly, by implication the addressing and data dimensions of the CONTROL STORE (RAM) 424) is fully and exactly specifiable. Partial bytes retrieved into SCAN/SHIFT REGISTER 206 will, as needed, be normalized for comparison with the output buffer word contents of the SCAN/SET BUFFER (2K×8 RAM) 208 within the VERIFY logics 426, but the total number of bits transferred on the BIT-SERIAL SCAN LOOP will be, in the size of each SCAN loop string and the total number of strings so transferred, no more than the exactly required and specified numbers.

Figure 5C:
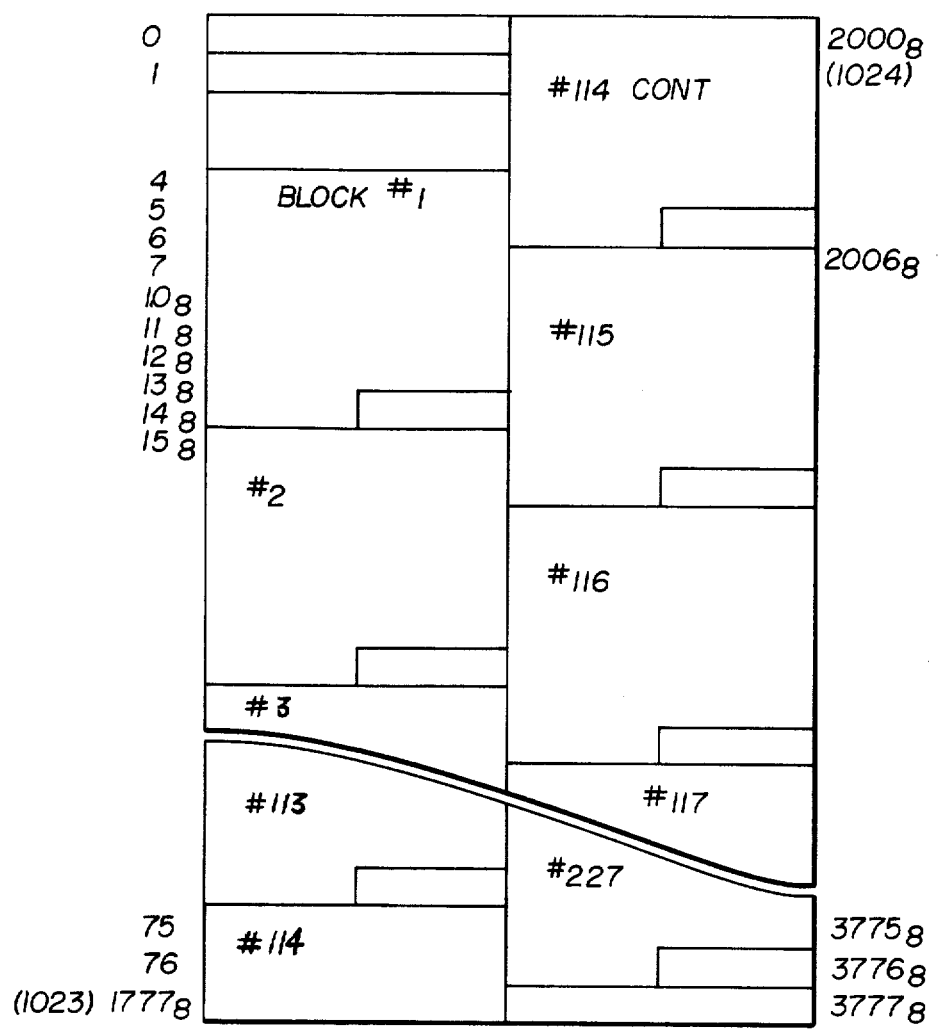
FIG. 5c shows the manner of addressing, and utilization of the SCAN/SET BUFFER memory during the operation of the apparatus of the present invention in VERIFY mode for substantially simultaneously loading (writing), reading, and verifying data transmission from and to a SYSTEM SUPPORT PROCESSOR and a control store within a CENTRAL COMPLEX.

The manner by which the microprocessor within the SYSTEM SUPPORT PROCESSOR 204 may address certain memory and register control locations in order to initiate the simultaneous load (write) and read and/or verify process, and may read the progress and/or results of such operations either upon the occurrence of an error interrupt or a normal completion, will next be discussed. The addressable locations of SCAN/SET BUFFER (2K×8 RAM) 208 (shown in FIG. 4) are shown in FIG. 5a and FIG. 6a for the utilization of this buffer memory during ECHO mode operations, and in FIG. 5c for the utilization of this memory during ECHO mode operations. The 2048 word decimal address range of the SCAN/SET BUFFER (2K×8 RAM) 208 is readable and writable by the microprocessor at arbitrary addresses 1140000 octal through 11143777 octal, the final four octal address digits of which are illustrated in FIG. 5a, FIG. 5c and FIG. 6a. Similarly to the addressing of the SCAN/SET BUFFER (2K×8 RAM) 208, the microprocessor can read and write three control registers commencing at address 1144000 octal, and read (only) four additional control registers commencing at address 1144003 octal, such seven total control registers as are identified by their final four octal address digits in FIG. 5b and FIG. 6b. The absolute octal displacement addresses of reference are arbitrary and without significance, the pertinent concept being merely that a microprocessor may, through the SSP microprocessor bus 401 shown in FIG. 4, addressably reference the indicated memory and register locations in those logics as will be further shown in FIG. 7.

Continuing in FIG. 5 and FIG. 6, the microprocessor within the SYSTEM SUPPORT PROCESSOR 204 (shown in FIG. 4) writes certain memory and register locations to initiate the simultaneous load (write) and read and (selectively) verify process. The header information which will be utilized to identify a unique one CENTRAL COMPLEX 202 and a particular CONTROL STORE SCAN LOOP STRING 422 within such device is written into relative octal addresses 0000 to 0001. The nominal fields, and the utilization of such fields, of this header quantity within the CENTRAL COMPLEX 202 device is not strictly relevant to the present invention, the simultaneity of all operations being managed by and within the SYSTEMS SUPPORT PROCESSOR 204. However, a suggested utilization would employ the field designated S (the most significant bit of the most significant byte of the 16-bit header quantity), as a designation identifying that only a preselected (at CENTRAL COMPLEX 202) part of the selected string is to be stored into CONTROL STORE (RAM) 424. The remaining field BUS ADRS of the header word first byte, and the 2-bit CC field of the header word second byte are jointly interpreted (as a total of 9-bits) for the addressing selection of a unique CENTRAL COMPLEX 202 device. The field designated P may be the parity bit for the two byte header word transmission. The field W contains the write enable bit, set if write is enabled. The fields labeled 1, 2, 3 and 4 are for string identification, a single one of which such fields being set identifies the corresponding one string to be selected within the addressed CENTRAL COMPLEX 202 device for receipt of further, SCAN data, information transmissions.

Continuing in FIG. 5 and FIG. 6 with the loading of certain memory and control stores by a microprocessor within the SYSTEM SUPPORT PROCESSOR 204 in order to initiate the SCAN loop data transfer operation, if such SCAN loop operation involves the writing of data to a string (such as is the subject of the present invention) then such microprocessor must put the string data to be written in an output buffer area of the SCAN/SET BUFFER (2K×8 RAM) 208 starting at displacement octal address 0004. Considering first the utilization of the circuit apparatus of the present invention for ECHO mode operation, that is, with the time-overlapped loading (writing) and reading of multiple blocks of SCAN LOOP DATA, consider FIG. 5a. The contents of data of all such strings as are to be written, such strings as may at the selected CENTRAL COMPLEX UNIT device be further stored to CONTROL STORE (RAM) 424 (shown in FIG. 4), are stored as successive strings, or blocks, each commencing at an addressable byte boundary, within the SCAN/SET BUFFER (2K×8 RAM) 208 commencing at displacement address 0004. For example, in FIG. 5a it is illustrated that five such blocks or strings are to be buffered out, each of which string is in bit-length equal to 22 decimal or 26 octal bits. The microprocessor does not load displacement addresses 2000 octal to 3777 octal within the SCAN/SET BUFFER (2K×8 RAM) 208, these addresses being reserved for the input buffer stores in ECHO operational mode.

Continuing in FIG. 5b the microprocessor will, further write three control registers at displacement addresses 4000 octal through 4002 octal in order to further initiate the SCAN loop data transfer process. Addressable for reading and writing at displacement address 4000 is the REPEAT COUNT REGISTER 416 (previously seen in FIG. 4), which is loaded with the number of blocks to be transferred, herein, by example, equalling five. Addressable at displacement address 4001 octal for reading and writing is the LOOP LENGTH REGISTER 408 (previously seen in FIG. 4) which contains the exact bit length (necessarily limited to $2^8 - 1$ equals 255 bits) of each string to be transferred. Herein by example, the contents of such register are set by the microprocessor to equal 26 octal corresponding to the illustrated string length shown, by example, in FIG. 5a. Addressable for reading and writing at displacement address 4002 octal is the MODE REGISTER 414, a control location previously seen in the block diagram of FIG. 4 and which such control location will be again seen in FIG. 7. The MODE REGISTER 414, addressable at displacement octal address 4002, is a 3-bit register, therefore the notation XXXXX within FIG. 5b represents mere place holding of unused, and potentially non-existent, register bit positions. Bit $2^3$, the most significant bit, of MODE REGISTER 414 enables, if cleared, the conduct of non-block, single string, SCAN loop data transfer operations. Such non-block operational mode will further be discussed in conjunction with FIG. 6a. When this most significant bit of the MODE REGISTER 414 is set to a binary, 1, as illustrated in the example contents shown in FIG. 5b, then block mode SCAN loop data transfer operations are enabled. The two least significant bits of the MODE REGISTER 414 (as can equal binary 00,01,10 and 11) respectively establish the SCAN loop string READ operational mode, SCAN loop string WRITE operational mode, SCAN loop VERIFY mode of simultaneous read and write and verification, and the SCAN ECHO operational mode of loop data transfer operations. In the example contents of the MODE REGISTER 414 shown in FIG. 5b, the example binary 10 contents of these two least significant bits establishes, in combination with the binary 1 content of the most significant bit, that a block of plural string, SCAN loop simultaneous load (write) and read and verify operation, meaning a block VERIFY mode operation, will be conducted. This operational mode is one of the preferred operation modes of the apparatus of the present invention, permitting the time efficient conduct of loading (writing) and reading bit-serially upon a SCAN/SET NETWORK 109 (shown in FIG. 4) while verification of the read data is also performed in time-overlap. The writing of the contents of MODE REGISTER 414 is the last operation performed by the microprocessor in the initiation of the desired SCAN loop data transfer operation. The writing of the MODE REGISTER 414 causes the directed SCAN loop data transfer operation to commence in accordance with the other stored parameters. The microprocessor does not further control the progress, or the sequencing of such SCAN loop data transfer operation, such sequencing as is controlled by further discrete logics and timing as will be taught.

Continuing in FIG. 5b, the remaining four addressable locations, displacement octal address 4003 through 4006, can only be read by the microprocessor. That displacement octal locations 4000 through 4002, as correspond to three registers, can both be read and written by the microprocessor whereas displacement octal locations 4003 through 4006, which represent three process control areas, can only be read by the microprocessor is further illustrated in FIG. 6a. Displacement octal address 4003 of three binary bits only, plus displacement octal address 4, of a full eight binary bits, constitute, in upper and lower parts, the entire ADDRESS REGISTER 402 of eleven binary bits. By momentary reference to the utilization of ADDRESS REGISTER 402 in FIG. 4, and observation of the addressing scheme of the SCAN/SET BUFFER (2K×8 RAM) 208 as illustrated in FIG. 5a, such eleven binary bits may be observed to suffice for addressing displacement octal addresses 0000 through 3777 within such buffer. The contents of ADDRESS REGISTER 402 point to the address of the next byte, part of a BLOCK STRING DATA to be written. In the example shown in FIG. 5b, these contents are set equal to 23 octal, which, by reference to FIG. 5a, may be observed to be the contents of ADDRESS REGISTER 402 upon the normal completion of the buffering of five strings of data , FIRST BLOCK STRING DATA through FIFTH BLOCK STRING DATA, as occupy octal displacement addresses 4 through 22.

Continuing in FIG. 5b, the contents of REPEAT COUNTER 420, indicates the number of BLOCK STRING DATA blocks already completely written (transmitted). In the example of FIG. 5b, the contents of REPEAT COUNTER 420 equal 5 octal, the contents which would appear when the entire five BLOCK STRING DATA had been buffered. Finally, the contents of BIT COUNTER 412 indicate the bit position during the assembly/disassembly of the current BLOCK STRING DATA within the SCAN/SHIFT REGISTER 206 (reference to FIG. 4). Shifting for normalization will always occur until an entire byte is zero-filled, even though only a partial byte may have been transmitted upon the BIT-SERIAL SCAN LOOP. Thusly, upon a normal completion, the contents of the bit counter are always equal to the beginning bit of the next full byte, indicating that an entire BLOCK STRING DATA has been disassembled/assembled and buffered. In the example of FIG. 5b, the contents of BIT COUNTER 412 equal 30 octal, such as represents the number of bits in the 3 byte-wide memory cells occupied by each BLOCK STRING DATA.

Continuing in FIG. 5b, the parameter 110 shown in MODE REGISTER 414 at displacement address 4002 was, as previously explained, set to that value as an example of parameterizing the block VERIFY operational mode. The utilization and addressing of SCAN/SET BUFFER (2K×8 RAM) 208 for this operational mode is illustrated, by example, in FIG. 5c. If MODE REGISTER 414 shown in FIG. 5b were to be parameterized (in a like manner to all other parameters shown by example in FIG. 5b) so as to control the utilization and addressing of SCAN/SET BUFFER (2K×8 RAM) 208 in the manner shown in FIG. 5a, then such MODE REGISTER 414 needs be parameterized to the block ECHO operation mode. In such a parameterization for block ECHO operational mode, MODE REGISTER 414 addressable by the microprocessor at displacement address 4003 octal would be set to 111.

Continuing in FIG. 5, during block ECHO mode of operation, such as is established in the present example when the contents of MODE REGISTER 414 equal octal 7, displacement addresses 2000 octal through 3777 octal of the SCAN/SET BUFFER (2K×8 RAM) 208 are reserved for the read, echoed, data as illustrated in FIG. 5a. The four byte positions commencing at octal address 2000 are unused. The three byte positions labeled OLD STRING DATA commencing at displacement address 2004 octal represent relatively old contents from other, previous operations, not related to the current write with verify operation. The five blocks labeled ECHO FIRST BLOCK through (ECHO FIFTH BLOCK) occupying displacement octal addresses 2007 through 2025 represent the (re)read data corresponding to that data respectively written as FIRST BLOCK STRING DATA through FIFTH BLOCK STRING DATA from displacement addresses 4 through 22 octal. The reason that (ECHO FIFTH BLOCK) is in parenthesis is that at a normal conclusion of buffering out (writing or loading) five blocks, or strings, as FIRST BLOCK STRING DATA through FIFTH BLOCK STRING DATA then that fifth string of data written (loaded) will not yet have been retrievably read. If it is desirous to recoverably read such FIFTH BLOCK STRING DATA as written to the CENTRAL COMPLEX 202 as data to be emplaced as the (ECHO FIFTH BLOCK), then a sixth, dummy, block of string data should be buffered out (written). This is a normal, preferred, way of retrieving such (ECHO FIFTH BLOCK). If such a sixth, dummy, block of string data were to be sent it would be enabled by initial parameterization of 6 octal in the REPEAT COUNT REGISTER 416, and it would occupy addresses 0023 through 0025 octal in the SCAN/SET BUFFER (2K×8 RAM) 208.

In illustration of the dynamic utilization of the buffer memory and control registers respectively shown in FIG. 5a and FIG. 5b, the status of stores will be considered after the second block of string data has been both transmitted and read back. The entirety of this data string, would lie within the area labeled ECHO SECOND BLOCK in memory displacement addresses 2012 through 2014 octal. By the time that this ECHO SECOND BLOCK has been completely received, the THIRD BLOCK STRING DATA buffer store occupying displacement octal addresses 12 through 14 would have been written (transmitted). The contents of REPEAT COUNT REGISTER 416, LOOP LENGTH REGISTER 408 and MODE REGISTER 500 have not changed from their initialized values. If, however, the ECHO SECOND BLOCK has been both completely transmitted and read back, then the contents of ADDRESS REGISTERS (Upper and Lower) 402 would equal 15 octal, the beginning address of the FOURTH BLOCK STRING DATA which is next to be transmitted. The contents of REPEAT COUNTER 420 would equal 3 octal, indicating that FIRST BLOCK STRING DATA through THIRD BLOCK STRING DATA had been buffered. As upon any normal buffering of a BLOCK STRING DATA, the contents of BIT COUNTER 412 would equal 30 octal. Thusly, it is by the dynamic contents of all ADDRESS REGISTER 402 and/or the contents of REPEAT COUNTER 420 that the microprocessor is able to identify the ECHO SECOND BLOCK as the last block buffered both out (loaded) and in (read). There is no possibility that the block ECHO mode transfer illustrated in FIG. 5a could stop at the completion of both the transmission and reading of the second block of string data, even should the operation have incurred data errors which could later be detected by programmed microprocessor inspection and comparison of the SECOND BLOCK STRING DATA and ECHO SECOND BLOCK buffer stores within the SCAN/SET BUFFER (2K×8 RAM) 208.

Consider, for a moment, the block VERIFY operational mode of the present invention. Now the addressing utilization of SCAN/SET BUFFER (2K×8 RAM) 208 is not as shown in FIG. 5a (for block ECHO mode) but is rather as shown (for different parameterization) in FIG. 5c. But if a block VERIFY mode were parameterized as shown in FIG. 5b (MODE REGISTER 414 equals 110, exactly as shown) and then during the readback of the second string of block data (during the transmission load of the THIRD BLOCK STRING DATA) a verification error was in time-overlap detected, then a stop would occur at the full completion of the reading of such second string of block data, and all the parameters shown in the control stores of FIG. 5b would be available for microprocessor inspection. Again, it is by the contents of all of ADDRESS REGISTER 402 and/or the contents of REPEAT COUNTER 420 that the microprocessor is able to identify that data which upon verification after reread, did not equal that data contained within the SECOND BLOCK STRING DATA. Further buffering of BLOCK STRING DATA is suspended, and the microprocessor is interrupted, upon the time-overlapped detection of an error within any data string within VERIFY LOGIC 426 (reference FIG. 4). Upon the receipt of such an abnormal completion, verify error, interrupt the microprocessor may, under microprogram control, proceed, if desired, to make further analysis. By momentary reference to FIG. 4, if the contents of such BLOCK STRING DATA are utilized within CONTROL STORE SCAN LOOP STRING 422 for the purposes of the enabled addressing and loading of CONTROL STORE (RAM) 424, then the situs (in any field) of a detected verification error may be revelatory of a hardware failure within such CONTROL STORE (RAM) 424. The further diagnosis of this and other types of incipient and/or systematic failure(s) is not the purpose of the present invention, the pertinent point merely being that even when the present invention operates in simultaneous time to verify that SCAN loop data which is simultaneously being loaded (written) and read (i.e., in VERIFY MODE), the error history is adequately preserved so that further error reduction, under microprocessor control, may later transpire.

The utilization of the SCAN/SET BUFFER (2K×8 RAM) 208 during block, or plural string, VERIFY mode data transfers upon the BIT-SERIAL SCAN LOOP is shown in FIG. 5c. The example shown is for individual blocks, or strings, arbitrarily sized at eight plus a partial bytes. The number of bits within each such string would be loaded if the microprocessor into the LOOP LENGTH REGISTER 408 addressable at displacement octal address 4001 (shown in FIG. 5b and FIG. 6b). For blocks of such size, the total number which could maximally be transferred during one initiation of the write with VERIFY operation is 227 decimal as illustrated in FIG. 5c. Note that the entire addressing space (save for the first four addresses utilized for the header word, and for any residue addresses) of the SCAN/SET BUFFER (2K×8 RAM) 208 may be utilized, no "ECHO" blocks being stored during the VERIFY mode. The total number of blocks is parameterized in the REPEAT COUNT REGISTER 416 (shown in FIG. 5b and FIG. 6b).

The utilization of the SCAN/SET BUFFER (2K×8 RAM) 208 during non-block string data transfers upon the SCAN loop is illustrated in FIG. 6a. The non-block operational mode is established when the most significant of three bits of the MODE TRANSFER REGISTER 414 equal zero. During this operation, the logics within the SYSTEM SUPPORT PROCESSOR 204 obtain successive bytes of data from the RD/WR storage area within the SCAN/SET BUFFER (2K×8 RAM) 208 and write this data to strings within the addressed CENTRAL COMPLEX 202 device bit-serially via the SCAN loop. Momentarily referencing FIG. 4, during an SCAN loop READ operation the serial data received from the addressed string as signal SCAN DATA OUT on line 101 is bit-serially shifted into SCAN/SHIFT REGISTER 206. As each successive byte of this read data is assembled, it is stored within the RD/WR buffer area beginning at displacement octal address 4 as shown in FIG. 6a. Again momentarily referencing FIG. 4, during a WRITE operation to a string the SCAN/SHIFT REGISTER 206 will shift data to the addressed string via signal SCAN DATA IN on line 105 while simultaneously, in time-overlap, receiving data from such string as signal SCAN DATA OUT on line 101. When a complete byte of written data is shifted to the CENTRAL COMPLEX 202, and a byte of old string data is shifted in from CENTRAL COMPLEX 202, then the logics within SYSTEM SUPPORT PROCESSOR 204 will store each complete read byte to the ECHO storage area commencing at displacement address 2004 within the SCAN/SET BUFFER (2K×8 RAM) 208. The representation of the same addressable registers as were previously seen in FIG. 5b within FIG. 6b is merely an illustration of their respective readable and writable status to the microprocessor of these control locations within the SYSTEM SUPPORT PROCESSOR 204.

The generalized manner of utilizing addressable locations within the SCAN/SET BUFFER (2K×8 RAM) 208 having been respectively illustrated for block and non-block data transfer operations in FIG. 5a and FIG. 6a, the detailed definition of each operational mode of the device is now possible as follows. The 3-bit contents of MODE REGISTER 414 equal 000 binary estabishes the non-block string READ mode. Such mode sends a 16-bit header quantity taken from displacement addresses 0000 and 0001 octal of the SCAN/SET BUFFER (2K×8 RAM) 208 through the SCAN/SHIFT REGISTER 206 to the HEADER REGISTER 210 within the CENTRAL COMPLEX 202. A selected string, such as CONTROL STORE SCAN LOOP STORE 422, having been identified by such header within CENTRAL COMPLEX 202, the scan clock signals provided by the SYSTEM SUPPORT PROCESSOR 204 cause the contents of such string to be bit-serially shifted into SCAN/SHIFT REGISTER 206. The number of such SCAN CLOCK signals furnished, and the resultant number of such bits read, is determined by the contents of the REPEAT COUNT REGISTER 416 catenated to the contents of the LOOP LENGTH REGISTER 408. The upper 2-bits of the REPEAT COUNT REGISTER 416 are not used for this determination. The lower 6-bits of REPEAT COUNT REGISTER 416 are used as an upper 6-bits, along with the 8-bits of LOOP LENGTH REGISTER 408, in forming a composite 14-bit count quantity. By momentary reference to FIG. 6a, this 14-bit count quantity may be observed to be precisely that which enables the addressing of the entie non-header buffer area of the SCAN/SET BUFFER (2K×8 RAM) 208, addresses 0004 through 3777 octal. Any last partial byte read is left-justified and zero-filled for storage in the SCAN/SET BUFFER (2K×8 RAM) 208, as indicated by the cells showing 000 binary in FIG. 6a.

The 3-bit contents of MODE REGISTER 414 equal to 001 binary establish a non-block string WRITE mode. The non-block string WRITE mode causes the transmission of a 16-bit header quantity in a like manner to the non-block string READ mode immediately previously discussed. Momentarily referencing FIG. 6a, data taken from the SCAN/SET BUFFER (2K×8 RAM) 208 starting at displacement address 0004 octal is written to a selected string, such as CONTROL STORE SCAN LOOP STRING 422 shown in FIG. 4. The total number of bits to be written to such string is determined by the 14-bit composite bit count derived from the lower 6-bits of REPEAT COUNT REGISTER 416 and the entire 8-bits of LOOP LENGTH REGISTER 408, exactly as these requests were utilized in the non-block string READ mode. The establishment of the quantity 010 binary in MODE REGISTER 414 identically establishes the non-block string WRITE mode as does the quantity 001 binary within such MODE REGISTER 414.

The initialization of quantity 011 binary within MODE REGISTER 414 establishes the non-block WRITE with echo operation. A 16-bit header quantity is first retrieved from SCAN/SET BUFFER (2K×8 RAM) 208 and bit-serially transmitted via the SCAN/SET NETWORK 109 to the HEADER REGISTER 210 within the CENTRAL COMPLEX 202 in a like manner to other non-block mode operations. Referencing FIG. 6a, the data commencing at displacement address 0004 octal of the SCAN/SET BUFFER (2K×8 RAM) 208 is written to the selected string in a like manner to the non-block string WRITE mode operation. Additionally, and momentarily referencing FIG. 4, the old data is received from the reference string, nominally CONTROL STORE SCAN LOOP STRING 422, bit-serially into SCAN/SHIFT REGISTER 206 and, upon the assembly of each complete byte of data, such data is written into the SCAN/SET BUFFER (2K×8 RAM) 208 commencing at displacement address 2004 octal. Note that this utilization of the addressable stores of SCAN/SET BUFFER (2K×8 RAM) 208 is not identical to the non-echo operational modes just discussed. In particular, the non-block string read operation (established by quantity 000 binary within MODE REGISTER 414) just discussed buffered the read data into SCAN/SET BUFFER (2K×8 RAM) 208 commencing at displacement address 0004 octal. The total transferable bit count within the non-block write with echo operational mode must be limited to 8160 bits (or 1020 bytes) because the SCAN/SET BUFFER (2K×8 RAM) 208 has the data to be written in the lower half area, displacement addresses 0004 octal through 1777 octal, and has the echo, or read data within the upper half area of displacement addresses 2004 through 3777 octal. Any last partial byte to be loaded (written) is obtained from the upper bits of the last referenced write buffer address, and any last partial byte read is zero-filled and left-justified in the ECHO part of the buffer, both which justifications are illustrated in FIG. 6a.

Operational modes established by inserting binary 100 through binary 111 within MODE REGISTER 414 are block mode operations, such as generally use the SCAN/SET BUFFER (2K×8 RAM) 208 addressing scheme illustrated in FIG. 5a and FIG. 5c. All block mode operations utilize the LOOP LENGTH REGISTER 408 and the REPEAT COUNT REGISTER 416 (shown in FIG. 5b) as separate registers. The maximum bit length of a string utilized in a block mode operation must not be greater than 255 decimal bits, the maximum count which may be inserted in LOOP LENGTH REGISTER 408. The REPEAT COUNT REGISTER 416 can also hold a maximum count of 277 octal or 255 decimal. During block mode operations either the reading or the writing, or both the reading and writing, of multiple sets of data transpires between the SCAN/SET BUFFER (2K×8 RAM) 208 and a string(s) within the CENTRAL COMPLEX 202 as selected by the header quantity. The same header quantity is repetitively sent with each string access. The REPEAT COUNT REGISTER 416 holds the count of the desired number of loop accesses of the CONTROL STORE SCAN LOOP STRING 422 which number equals the number of the BLOCK STRING DATA sets to be sent to the CENTRAL COMPLEX 202. The first data transferred, either written or read, begins at displacement address 0004 octal of SCAN/SET BUFFER (2K×8 RAM) 208 as illustrated in FIG. 5a. Successive bytes and partial bytes as comprise each BLOCK STRING DATA are in contiguous addressable buffer locations. Any partial last byte of any BLOCK STRING DATA is zero-filled, left-justified. The first byte of the next successive data set, or block, is in the next successive buffer addressable location. Different interrupts are generated at either the normal completion or the detection of an error, either interrupt occurring at the cessation of each block mode operation. Each interrupt to the microprocessor must be cleared in order to initiate a new SCAN operation.

Initializing the contents of MODE REGISTER 414 to binary 100 establishes the block READ of a string. Such block READ mode transmits a 16-bit header quantity from displacement addresses 0000 and 0001 octal of the SCAN/SET BUFFER (2K×8 RAM) 208 as illustrated in FIG. 5a. Successive bytes, and final bits, of the selected string are emplaced under the control of the quantity within BIT COUNTER 412 in SCAN/SET BUFFER (2K×8 RAM) 208 commencing at displacement address 0004 octal. Any last partial byte from the string is zero-filled, left-justified, such as is illustrated for displacement address 0006 octal in FIG. 5a. If the contents of REPEAT COUNT REGISTER 416 was greater than one, then the 16-bit header from buffer addresses displacement 0000 and 0001 octal is sent again. The same string, which may possess updated contents due to intermediarily transpiring activities within CENTRAL COMPLEX 202, is read again and the data is stored in the SCAN/SET BUFFER (2K×8 RAM) 208 commencing at the next location after the last partial or complete byte of the previous block read operation, such as displacement address 007 octal in the example of FIG. 5a. The block read operation ends with a block complete interrupt when the string has been read the number of times designated by the quantity within the REPEAT COUNT REGISTER 416, with each of these block reads having been preceded by the writing of the header quantity.

The initialization of the MODE REGISTER 414 to contents binary 101 establishes the block WRITE mode. The block WRITE mode, and the block write with VERIFY and block write with ECHO mode as will shortly be discussed, are normally used to write local, or control, stores within the addressed CENTRAL COMPLEX 202. By momentary reference to FIG. 4, each written string of the block WRITE operation, such as CONTROL STORE SCAN LOOP STRING 422, normally supplies the complete data for writing one stored address, such as one address with CONTROL STORE (RAM) 424. This data within the string thusly contains the stored address (field ADDRESS within CONTROL STORE SCAN LOOP STRING 422), the store control bits (field R/W) and the store write data (field DATA). During the writing of the header quantity prior to the block write of the second string, the data from the block write of the first string is still in position within the string, for example within CONTROL STORE SCAN LOOP STRING 422, and is not shifting. It is normally during this time of transferring successive headers that the data from the string is utilized within CENTRAL COMPLEX 202 to cause the writing of the control store, for example, CONTROL STORE (RAM) 424. If such time-overlapped writing of the control store within CENTRAL COMPLEX 202 is made conditional upon the receipt of subsequent header words, then the block writing of the last string would not transpire until the next SCAN block WRITE operation. A block transfer complete interrupt is generated at the normal conclusion of a block WRITE operation.

The initialization of the contents of MODE REGISTER 414 to binary 110 establishes the block write with VERIFY mode. Such a mode, a preferred operational mode of the present invention, is used to write and to read and to verify in substantial time-overlap the information written to a slave, CENTRAL COMPLEX 202, device from a controlling, SYSTEMS SUPPORT PROCESSOR 204, device via a bit-serial scan loop (reference FIG. 4). The write of the control store, for example CONTROL STORE (RAM) 424, from the scan loop string, for example CONTROL STORE SCAN LOOP STRING 422, normally takes place during the transference of each successive header quantity to the first such header quantity, nominally lodged in HEADER REGISTER 210, equivalently to the block WRITE operational mode. If verification of this process of loading all the way to a control store, nominally CONTROL STORE (RAM) 424, is desired, then the loaded data, and possibly also the utilized address, may be reread from such control store into the scan loop string, nominally CONTROL STORE SCAN LOOP STRING 422. The exact manner of the utilization, and the possible echo-back responses to such utilization, of the data within the address control store scan loop, nominally CONTROL STORE SCAN LOOP STRING 422, is not pertinent to the operation of the present invention for conducting the block write with VERIFY operation. Indeed, even should the contents of the addressed control store scan loop string not have been utilized for any further purpose whatsoever, when the first byte, for example, of the SECOND BLOCK STRING DATA illustrated in FIG. 5a commencing at displacement address 0007 octal is written (loaded) into the addressed control store scan loop string, nominally CONTROL STORE SCAN LOOP STRING 422, then the data that comes from such string as signal SCAN DATA OUT on line 101 is bit-serially recovered into the SCAN/SHIFT REGISTER 206 within the SYSTEM SUPPORT PROCESSOR 204. Such SCAN/SHIFT REGISTER 206 (reference FIG. 4) preferably consists of two ranks although other embodiments are possible. When two ranks are implemented, the second, and each subsequent byte of the SECOND BLOCK STRING DATA are loaded into one rank of such SCAN/SHIFT REGISTER 206, while the most recent returned byte from the string contained within the other rank of such SCAN/SHIFT REGISTER 206 is compared with the original data, i.e. the FIRST BLOCK STRING DATA shown in FIG. 5a, which was originally utilized to write the successive bytes of the first string. Thusly the time-overlapped operations occurring during the block write with VERIFY mode operation of the present invention are as follows: a bit-serial writing (loading) of a SCAN loop string via a bit-serial SCAN loop is transpiring in time-overlap with the bit-serial reading of a priorly transferred such string via the circular completion of such bit-serial SCAN loop. Additionally, as each complete byte of such prior SCAN loop string is retrieved, it is verified in comparison to that information, stored within the SCAN/SET BUFFER (2K×8 RAM) 208, which was originally written (loaded) in the writing of such string. That such verification transpired at byte, as opposed to single bit or the entire string, granularity is irrelevant to the function of the present invention. Indeed, a miscompare of any byte will set a verify error flip-flop but the block write with VERIFY operation will continue until the end of the current block string. Then only, the VERIFY operation having been conducted in time-overlap with the writing and reading, the entire operation will cease and a verify error interrupt will be generated. Note that in this block write with VERIFY operation, the verification can only begin at that time that the second byte of the second block is read from the buffer to be written into the string, at which such time the entire first byte of the first block will have been retrieved from the string and the first verify comparison will be enabled. If no miscompares are detected during the block write with VERIFY operation, a block transfer complete interrupt is generated when the entire operation is finished. If the verification of the last transmitted string is desired, it may be desirable to write or read one final, terminal dummy string so that the actual data associated with the last real string may be retrievably read and verified.

The initialization of the contents of MODE REGISTER 414 to binary 111 establishes the block write with ECHO operational mode, also a preferred operational mode of the present invention. The block write with ECHO operational mode is used to write SCAN loop strings (which may be further written to control stores) and read such SCAN loop strings and save the echo data thereby read—all in time-overlapped operations. The manner of the write and read buffer utilizations of the SCAN/SET BUFFER (2K×8 RAM) 208 is illustrated in FIG. 5a. Buffer addresses 0004 through 1777 octal are for the data to be block written to the strings. The read, or echoed, data is stored into addresses 2004 through 3777 octal. A block transfer complete interrupt is always generated at the end of the block write with ECHO operation. Any verification comparison of the data read, or echoed, with the data written must be accomplished by the software directed microprocessor examination of the buffers. Referencing FIG. 5a, when the FIRST BLOCK STRING DATA is written into the addresssed string, then old data from that string read in time-overlap is placed as OLD STRING DATA in the buffer starting at address 2004 octal. At the time that the SECOND BLOCK STRING DATA is being written to the address string, data received from such string is put into the buffer starting at address 2000 octal greater than the initial address of such SECOND BLOCK STRING DATA. As illustrated in FIG. 5a, such data is called ECHO FIRST BLOCK because it represents the read, or echo, of the FIRST BLOCK STRING DATA previously written. Momentarily referencing FIG. 4, if the data contents of each transmitted SCAN loop string so indicated, then such data might be used to effectuate the loading of a control store, such as CONTROL STORE (RAM) 424 within CENTRAL COMPLEX 202. If, after such optional utilization for a loading of control store, the loaded address within the control store is reread to the scan loop string, nominally CONTROL STORE SCAN LOOP STRING 422, then the block write with ECHO operation is proceeding to recover that data which has actually been lodged within the remote control store of the addressed slave CENTRAL COMPLEX 202 device. Returning to FIG. 5a, the ECHO SECOND BLOCK should be equal in content to the SECOND BLOCK STRING DATA. Similarly, the last block of echo data should equal the second to the last block of written block string data. The echo buffer will have recovered all data originally written to the addressed SCAN loop string within the CENTRAL COMPLEX 202 device save for the last block string data written. If read, echo, recovery of this last block string written is desired, a final, sixth and terminal, dummy block of string data may be written or read. Alternatively, if a new operation is restarted after responding to the completion interrupt, the first echoed block of the new operation, the block labeled OLD STRING DATA in FIG. 5a, will reflect the data of the last SCAN loop string of the previous operation.

The logic diagram of the present invention is shown in FIG. 7, consisting of FIG. 7a through FIG. 7d. The enablement and gating signals applied to this logic diagram, which is primarily concerned with data flow, are labeled a through z and aa through af, and the development of such is given in the table of FIG. 8. All signals ingressing to and egressing from, the present logics are identified by arrow tips. The source of all such signals will be explained. Certain register structures previously seen within the the block diagrams of FIG. 4 possess the identical identification numbers.

Figure 7A:
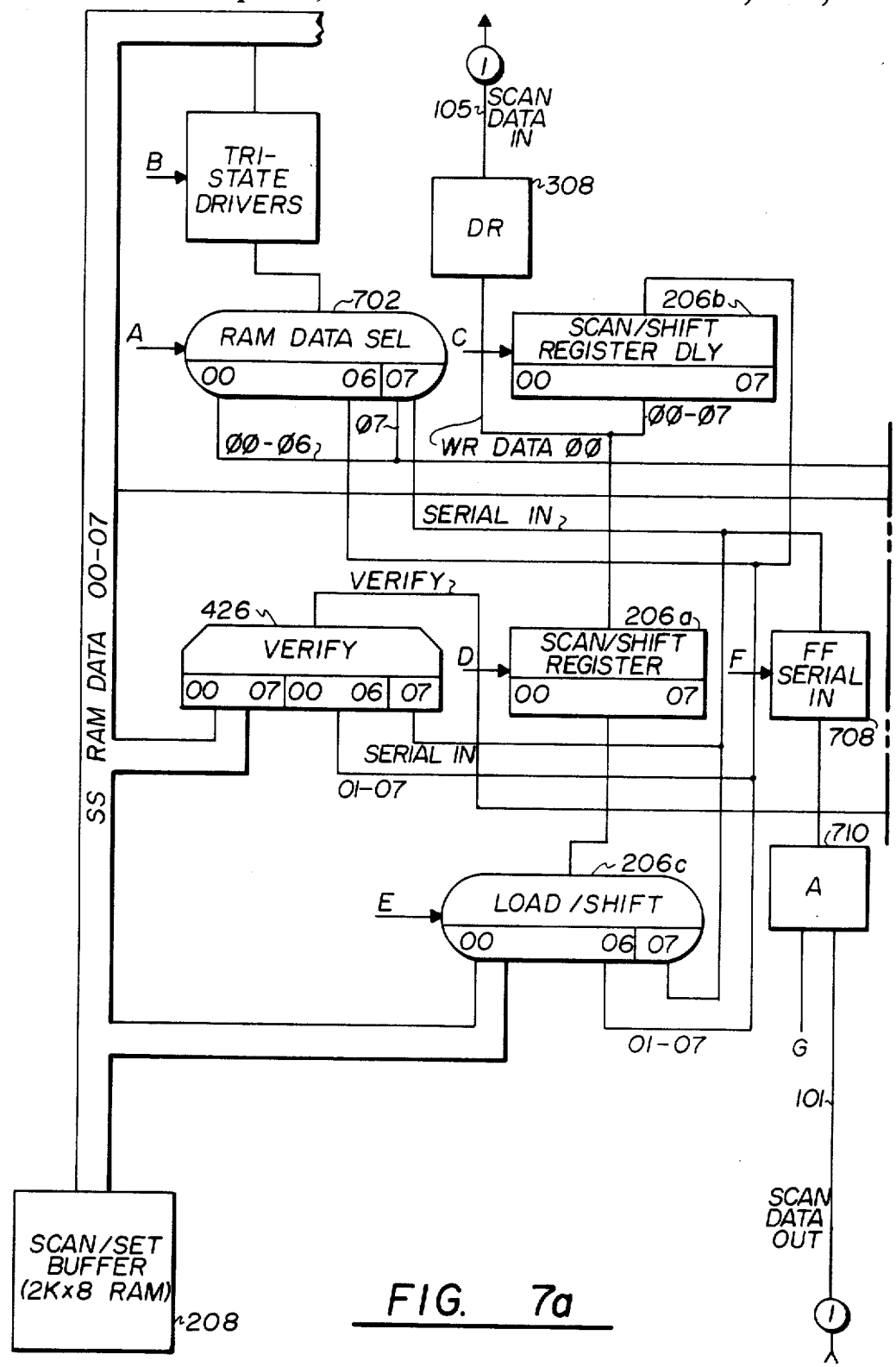
FIG. 7, consisting of FIG. 7a through FIG. 7d, shows the logic circuit apparatus of the present invention for accomplishing the simultaneous loading (writing) and reading, and selectively simultaneous verification of data to/from/within a control store within a remote CENTRAL COMPLEX, which digital logic apparatus is located entirely within a SYSTEM SUPPORT PROCESSOR.
Figure 9:
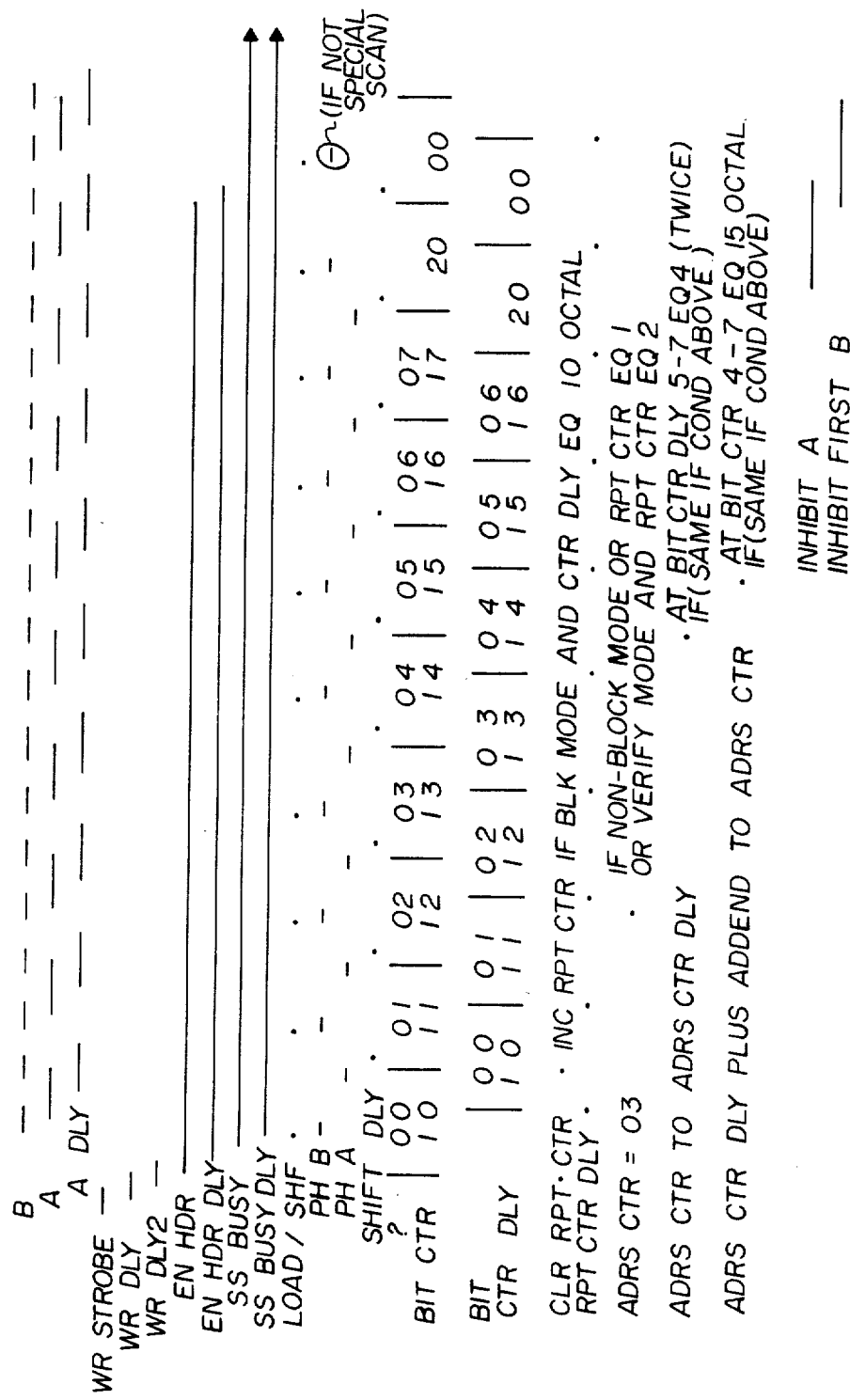
FIG. 9 shows the timing diagram of the operation of the present invention during the communication of a HEADER quantity from the SYSTEM SUPPORT PROCESSOR to the CENTRAL COMPLEX.
Figure 10:
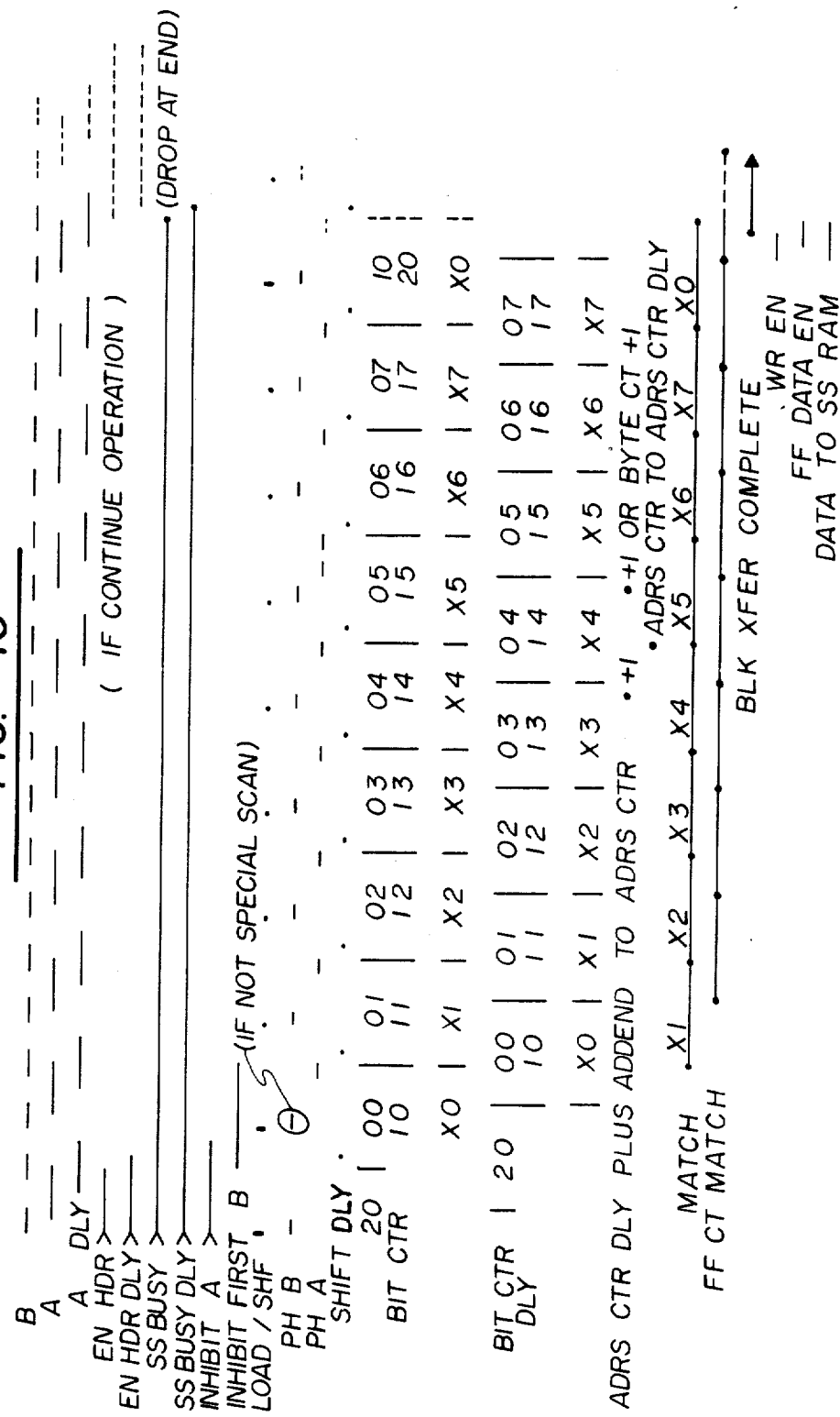
FIG. 10 shows a timing diagram of the operation of the present invention during the transmission of actual scan loop data from the SYSTEM SUPPORT PROCESSOR to the addressed CENTRAL COMPLEX during the operation of the present invention.

Commencing in FIG. 7a, the RAM DATA SEL 702 is an 8-bit wide selector selecting under the control of signal A one of two quantities to be gated to SCAN/SET BUFFER (2K×8 RAM) 208 as data. The logical true condition of signal A enables the selection of the right-most input signals, e.g. signals labeled 01–07 and SERIAL IN, whereas the converse, false condition of signal A enables the selection of the left-most signals, e.g. signals labeled 00–06 and 07. Signals input to RAM DATA CELL 702 may be traced back in order to discern their origin. As would be obvious to a routineer in the computer arts, the signals labeled 01–07 arising from the SCAN/SHIFT REGISTER DLY 206b in combination with signal SERIAL IN arising from the FF SERIAL IN 708, are gated to the SCAN/SET BUFFER (2K×8 RAM) 208 upon any of the ECHO or READ mode operations, the stores of which are illustrated in FIG. 5a and FIG. 6a for either multiple or single blocks. By reference to FIG. 8, the true condition of signal A upon which this byte is gated for storage is indicated as the Boolean expression FF SS BUSY DLY, meaning flip-flop scan/set busy delay. The time at which this signal should occur is shown both within the timing diagram of FIG. 10, representing the timing of the scan/set operation during the transference of string data, and within FIG. 9, showing the timing of the scan/set operation during the transmission of header data. Thusly, and in a like manner, all the control signals referenced in the logic diagram of FIG. 7, the development(s) of which is indicated by Boolean logical expression in the table of FIG. 8, will be directly referable to first quantities which are either (1) fundamental timing pulses, (2) conditions of registers and flip-flops and like logical structures which are directly observable within the logic diagram of FIG. 7, and/or (3) time signals associated with those timing chains which are completely and definitively illustrated in FIG. 9 and FIG. 10, such figures as will later be discussed.

Continuing in the illustration of this process by which the origin of all control signals provided to the logic diagram of FIG. 7 may be definitively determined, consider control signal B applied to TRI-STATE DRIVERS 706. This signal B is given in the table of FIG. 8 as equal to signal FF EN SS RAM WR DATA+SS RAM WR STROBE, meaning the enable scan/set random access memory write data flip-flop set condition in a logically ORed condition with the scan/set random access memory write strobe condition. The origin of signal FF EN SS RAM WR DATA is a flip-flop (not shown) which would set responsive to signal EN SS RAM WR DATA. The timing of this signal is shown in FIG. 10. The table of FIG. 8 gives a comtinuing expression for the development of signal SS RAM WR STROBE. The first part of the expression signal FF WR DLY 2, is merely a flip-flop (not shown) set and cleared responsively to signal WR DLY 2 shown in FIG. 9. In accordance with the terminology key of FIG. 8, this signal is logically ANDed with the NOT (or logical complement), of signal FF SS BUSY. Such a signal FF SS BUSY is merely a flip-flop (not shown) responsively set and cleared to signal SS BUSY shown in FIG. 9. The signal DECODE 230 next used in the continuing expression in the development of signal SS RAM WR STROBE in FIG. 8 is a signal which may arrive directly from the microprocessor, or which may be formulated as follows from ACTUAL ADDRS BITS 18–14 which, as indicated at FIG. 8f, are always available from the microprocessor. It may be recalled that within the addressing scheme of an entire computer system (such as is not relevant to the pleasant disclosure) that the incremental displacement addresses of addressable registers and memories associated with the scan/set logics were 0000 octal through 4006 octal above a base of 1140000 octal. If bits 19 through 11 of this 1140000 base reference to the displacement addresses of the present invention are considered, then this quantity is equal to 230 which is the meaning of the signal DECODE 230. Thus signal DECODE 230 means that ACTUAL ADDRS BITS 19-11 .EQ. 230, wherein ACTUAL ADDRS BIT 19 is a pseudo-bit always equalling 0. Such complexity in the name according recognition of a signal purpose, which is not to say the origin which is clearly defined in the final listings of FIG. 8, will not again occur. Continuing in the sample interpretation of the development of signal SS RAM WR STROBE as is involved in the development of the signal B in the table of FIG. 8, after signals such as FFB, FFA, FF EN HDR, FF INHIBIT A, and FF INHIBIT FIRST B, which are readily associatable with the timed pulses of FIG. 9 and FIG. 10, signal SS MODE REG BITS 6-7 .EQ. 0+MODE REG BITS 6-7 .EQ. 3 is next encountered. The expression EQ, meaning equal, is delineated by periods in order to define it, as in the FORTRAN programming language, as a mathematical equality. The expression obviously means that the bits 06 and 07 of the scan/set mode register are either equal to 0 to 3 octal, such scan/set mode register as is shown is as MODE REG 500 in FIG. 7a. Thusly, those signals which cannot be associated with the timing diagrams of FIG. 9 or FIG. 10, nor with the external logical input signals to the circuit of the present invention, should be searched for within the existent registers of the logic diagrams as illustrated in FIG. 7. Based on the possession of the Boolean logical expressions for development of all control signals which are contained in FIG. 8, plus an overall concept of the operational principles and purposes of the invention, it is believed that a routineer in the art could derive not merely a functionally operative embodiment of the present invention, but could probably replicate that selfsame exact logical embodiment thereof as is represented in FIG. 7 through FIG. 10.

Continuing in FIG. 7a with the explanation of the logical elements of the circuit of the present invention, VERIFY LOGIC 426 is an 8-bit wide comparison circuit. Eight binary bits received from SCAN/SET BUFFER (2K×8 RAM) 208 as signals SS RAM DATA 00-07 are compared with signal SERIAL IN and signals 01-07 which signals comprise an entire byte read from the addressed string within CENTRAL COMPLEX 202 (shown in FIG. 4). Successive bytes of data output to, and received from, the addressed string are assembled in the dual rank shift register consisting of SCAN/SHIFT REGISTER 206a and SCAN/SHIFT REGISTER DLY 206b. Completing the loop by which data may be shifted is the 8-bit wide one of two selector LOAD/SHIFT 206c. Under control signal E, LOAD/SHIFT 206c gates each successive byte of data to be output as signals SS RAM DATA 00-07 from the SCAN/SET BUFFER (2K×8 RAM) 208 to be lodged as output data in the SCAN/SHIFT REGISTER 206a. During the bit-serial SCAN loop shift operations signal SCAN DATA OUT on line 101 is gated in AND gate 710 by control signal G and lodged in flip-flop FF SERIAL IN 708 under the control of control signal F. Successively inputed bits from FF SERIAL IN 708 are gated as signal SERIAL IN along with signals 01-07 from bits 1 through 7 of SCAN/SHIFT REGISTER DLY 206b through LOAD/SHIFT 206b under the true state of control signal E in order to assemble a complete input byte in SCAN/SHIFT REGISTER 206a. As the output byte is bit-serially disassembled, and the input byte is assembled, within such SCAN/SHIFT REGISTER 206a, the most significant bit thereof is taken as signal WR DATA oo and amplified in driver element DR 308 to be driven as signal SCAN DATA IN on line 105, the signal by which data communication is obtained with CENTRAL COMPLEX 202 upon the SCAN/SET NETWORK 109 (shown in FIG. 4). The derivation, including the logical prerequisites and timing, of all control signals C through G is shown in the table of FIG. 8.

Figure 7B:
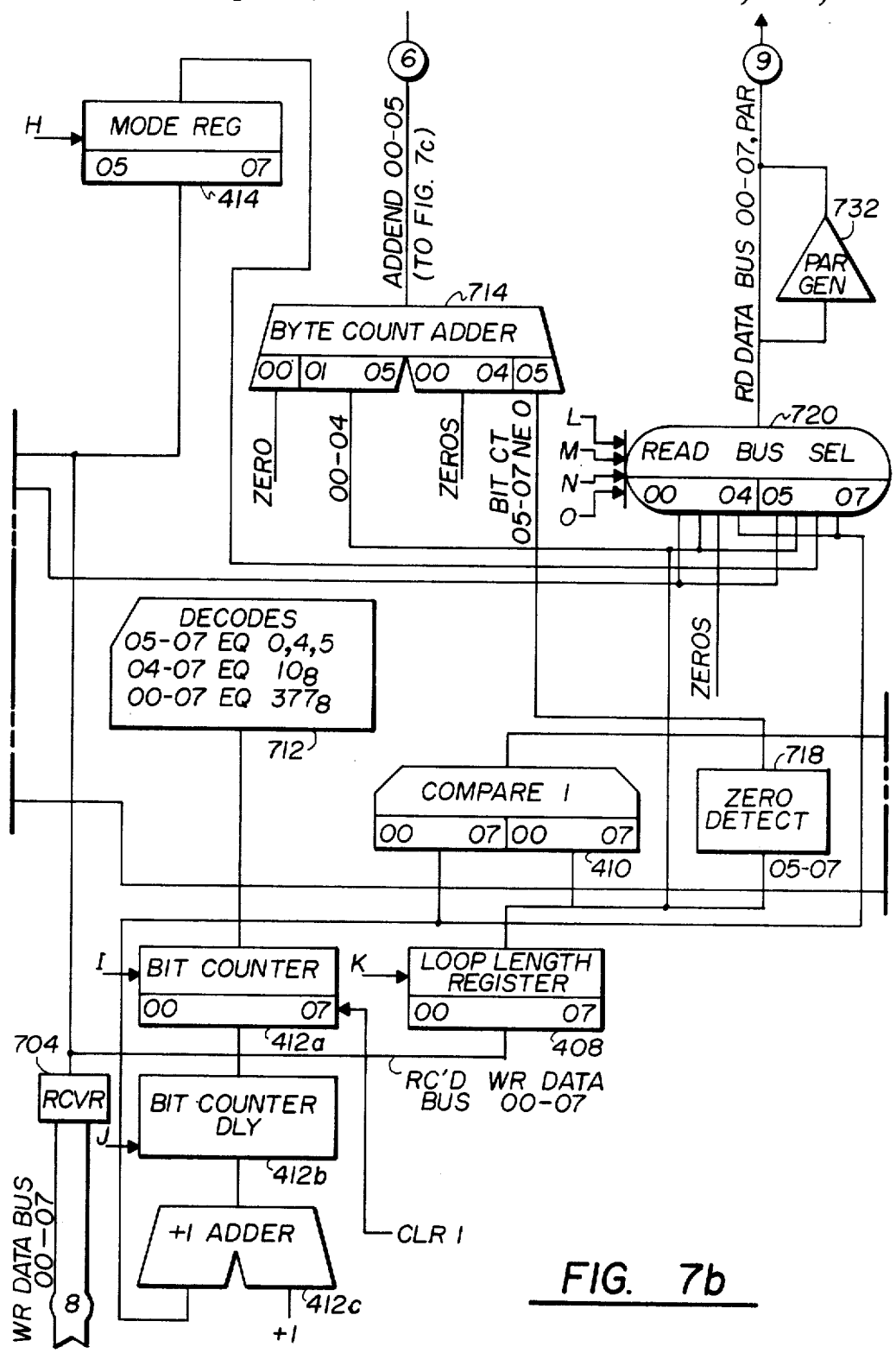

Continuing in FIG. 7b, MODE REG 414, is the 3-bit mode register addressable by the microprocessor at a displacement address 4002 octal over a nominal base of 01140000 octal. The path by which the microprocessor should write such MODE REG 414 as well as the SCAN/SET BUFFER (2K×8 RAM) 208 and the LOOP LENGTH REGISTER 408 (shown in FIG. 7b), is through the receivers RCVR 704 to the write data bus signals WR DATA BUS 00-07. As may be recalled by momentary reference to FIG. 6b, the MODE REG 414 is also readable by such microprocessor, along with other control registers of the present logics. Such a read path is shown as the signal output of MODE REG 414 which is gated through 8-bit wide one of four selector READ BUS SEL 720, under the true condition of control signal N, as the three least significant of signals RD DATA BUS 00-07. Obviously the MODE REG 414 is a prime control site for the operations of the circuit of the present invention and has a pronounced role in the development of control signals such as enable the operation of the circuit of the present invention. Such utilization of the contents of MODE REG 414 is not illustrated within the logic diagrams of FIG. 7, such as are primarily ordered for data flow occurring within the circuit, but is clearly defined in the table of FIG. 8. For example, it may noted that the contents of MODE REGISTER 500 bit 6 and bit 7 are involved in the development of control signal E, such as was previously seen to be applied to the LOAD/SHIFT 206c, within such table of FIG. 8. In order to highlight that such control signal development is transpiring, certain indications of this decode process such as the logics labeled DECODE 05-07 EQ. 0, 4, 5; 04-07 EQ. 108; and 00-07 EQ. 3778 712 are shown in the block diagram of FIG. 7. Such a structure is meant to show that the decode of certain bits of the BIT COUNTER 412a, such decode as is readily accomplishable by a routineer in the art, will be important to the development of further control signals utilized during the operation of the present circuit. For example, note the expression BIT CTR DLY BIT 05-07 .EQ. 00 in the development of control signal B shown in the table of FIG. 8. The structure labeled DECODES 712 shown in FIG. 7a is merely an attempt to illustrate that decode logic will interpret certain bit contents of BIT COUNTER 412a and BIT COUNTER DLY 412b, although the showing of such DECODES type representation within the logic diagram of FIG. 7 should not be considered to be either necessary or inclusive. The manner of the development of all control signals is unambiguously represented in the Boolean logical expressions of the table of FIG. 8.

Continuing in FIG. 7a, another register structure of the present invention, two-tiered as is typical and interconnected by an adder element so as to permit updates and/or incrementation thereof, is shown as BIT COUNTER 412a connecting to BIT COUNTER DLY 412b through +1 ADDER 412c. The BIT COUNTER 412a is (only) readable from the microprocessor at displacement address 4006 octal over a base of 1140000 octal. Such a path to read the data contents of all BIT COUNTER 412a is shown through eight wide one of four selector READ BUS SEL 720 on FIG. 7b to transpire under the control of signal O. The development of this control signal as well as the control signals I and J as respectively control the loading of BIT COUNTER 412a and BIT COUNTER DLY 412b may be studied within the table of FIG. 8. At the start of the header time (reference the control signals) the BIT COUNTER 412a is cleared and then counts to 20 octal for control of sending the header quantity across the SCAN/SET NETWORK 109 (shown in FIG. 4). At the end of the header time, such BIT COUNTER 412a is cleared again. It then counts, and controls, the sending of data to an address string, the receiving of data from an address string, or both the sending and receiving of data. Six bits of the REPEAT COUNTER 420a (shown in FIG. 7d) become associated with the 8-bits of the BIT COUNTER 412a in non-block modes. When the COMPARE 1 410 (shown in FIG. 7b) detects a match between the contents of the BIT COUNTER 412a and the LOOP LENGTH REGISTER 408 (also shown in FIG. 7b) in block mode operations, or a match between the contents of the composite BIT COUNTER 412a and REPEAT COUNTER 420a in non-block modes, the incrementation of BIT COUNTER 412a transpiring through +1 ADDER 412c and BIT COUNTER DLY 412b will stop at a rounded up multiple of 8. In block operational modes, such BIT COUNTER 412a will then be cleared if another header quantity is to be sent. A block mode completion, or a verify error, interrupt and termination will not clear the contents of BIT COUNTER 412a, such contents as are available to the microprocessor to assess the status of operations.

Continuing in FIG. 7b with the explanation of the logic diagram of the circuit of the present invention, the LOOP LENGTH REGISTER 408 can be written or read from the microprocessor at displacement address 4001 octal over a base of 1140000 octal. In block modes, this register determines the exact number of SCAN CLOCK PH A on line 107 and SCAN CLOCK PH B on line 103 signal pairs (shown in FIG. 3) to be sent to the CENTRAL COMPLEX 202 to bit-serially gate data into the selected scan loop string (shown in FIG. 4). A final, extra signal SCAN CLOCK PH B on line 103 is additionally set for each block. The extra occurrence of this signal SCAN CLOCK PH B at the end of each scan loop string makes the scan rank within such string equal to the main rank within such string, reference FIG. 1. Returning to FIG. 7b, normally the count stored within LOOP LENGTH REGISTER 408 is equal to the bit-length of the selected string. Since LOOP LENGTH REGISTER 408 is of eight binary bits, strings used in block mode operation should be no longer than 255 decimal bits. In non-block operational modes, the LOOP LENGTH REGISTER 408 comprises the lower 8-bits of a composite 14-bit register formed by the catenation of the lower 6-bits of the REPEAT COUNT REGISTER 416 shown in FIG. 7d to this register, LOOP LENGTH REGISTER 408. Thusly for non-block operational modes the total bit count specifiable for being contained within the composite 14-bit register can range to 2047 decimal bytes, although the utilization of the SCAN/SET BUFFER (2K × 8 RAM) 208 in FIG. 6a should be referenced for bit strings in excess of 2043 decimal bytes.

Figure 7C:
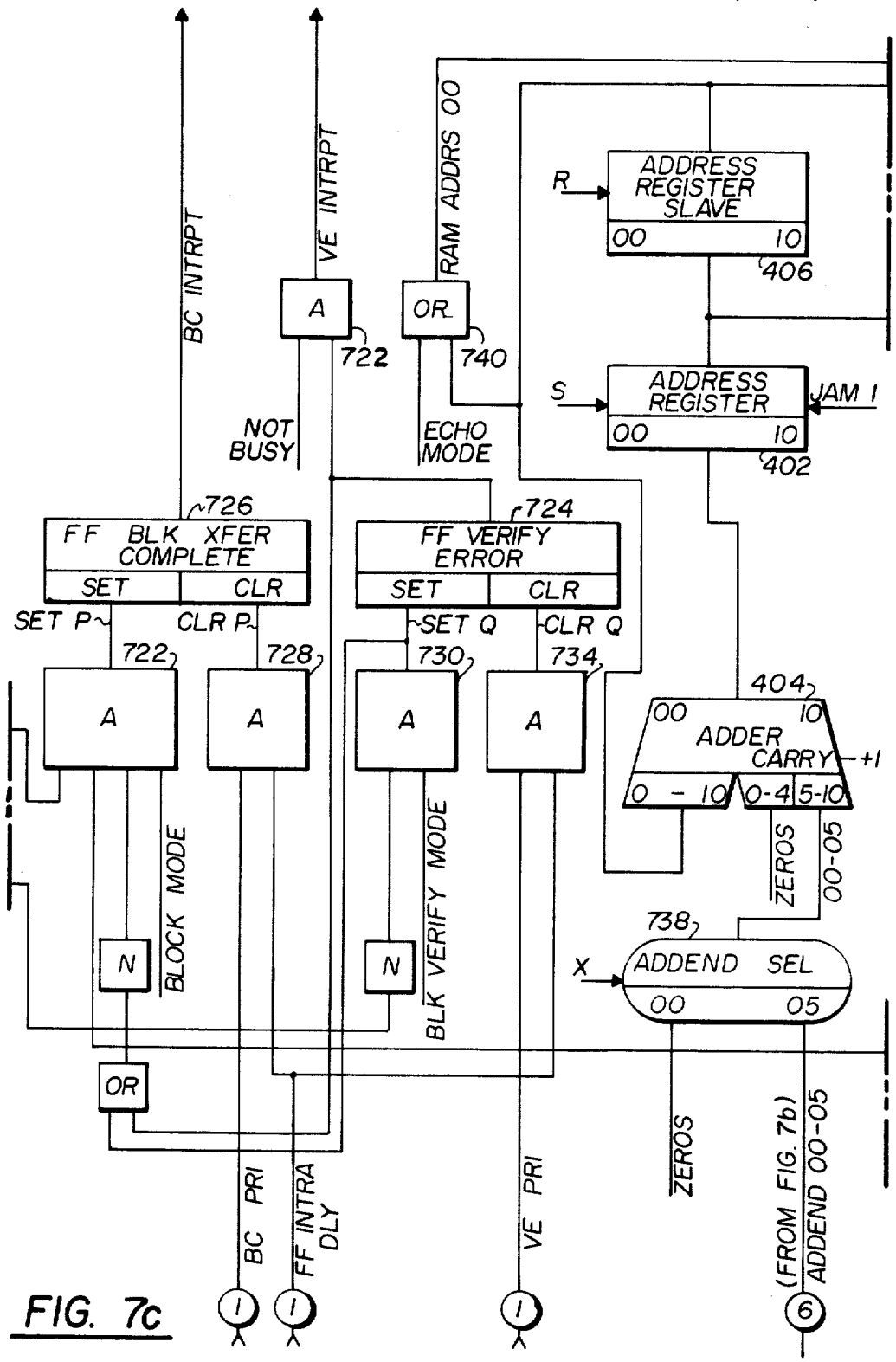

Continuing in FIG. 7b and FIG. 7c, the comparison of the contents of LOOP LENGTH REGISTER 408 with the dynamic contents of BIT COUNTER 412a in 8-bit wide comparator COMPARE 1 410 is supplied to the 4 input AND gate A 722. Also supplied to such AND gate A 722 is signal RPT CTR EQ CT arising at the repeat count comparator COMPARE 2 418 shown in FIG. 7d, the inversion of the logical OR obtained in th OR gate between the signal from the verify error flip-flop FF VERIFY ERROR 724 and the SET Q signal utilized to set such FF VERIFY ERROR 724, and signal BLOCK MODE derived from the most significant bit of MODE REG 414. Under the true condition of all signals as received at 4 input AND gate A 722, the true signal output of such AND gate is utilized to set the block transfer complete flip-flop FF BLK XFR COMPLETE 726 as signal SET P. The set condition of such flip-flop produces signal BC INTRPT which is distributed to the microprocessor as the block transfer complete, or normal completion, interrupt. Such flip-flop FF BLK XFR COMPLETE 726 is cleared upon the simultaneous logical true occurrence of signals BC PRI and FF INTRA DLY which jointly satisfy 2 input AND gate A 728. In a like manner, the signal derived from VERIFY LOGICS 426 (shown in FIG. 7a), logically false if the 8-bit quantities compared are not equal, is inverted and applied to 2 input AND gate A 730 along with signal BLK VERIFY MODE derived from MODE REG 414 in satisfaction thereof. Upon the occurrence of a verify error in the block VERIFY operational mode, flip-flop FF VERIFY ERROR 724 will set, subsequently satisfying 2 input AND gate A 726 upon the occurrence of signal NOT BUSY and producing the verify error interrupt as signal VE INTRPT.

Continuing in FIG. 7b, so long as bits 05–07 of LOOP LENGTH REGISTER 408 are nonzero, indicating that there is a partial last byte, then signals 05–07 applied to the zero detection circuitry ZERO DETECT 718 will produce logically true signal BIT CT 05–07 NE 0 which is applied as the incrementation count of +1 binary to the byte count adder BYTE COUNT ADDER 714. This incrementation count is added to the most significant 5-bits of LOOP LENGTH REGISTER 408 received as signal 00–04 into BYTE COUNT ADDER 714 in order to develop signal ADDEND 00–05, as the rounded up total byte count, which signals will momentarily been seen in FIG. 7c to be utilized in the sequential addressing of the byte contents of stores within SCAN/SET BUFFER (2K × 8 RAM) 208. As a final aspect of the logics shown in FIG. 7b, the 8-bit wide 1 or 4 read bus selector READ BUS SEL 720 is selected under the occurrence of one of control signals L through O to select a corresponding 8-bit path (a register) to be gated as signals RD DATA BUS 00–07. The illustration of parity generator PAR GEN CIRCUIT 732 is in illustration of the fact that these signals may also, optionally, have parity appended for transmission to the microprocessor.

Continuing with the explanation of the logic circuit of the present invention, the address register is shown in two ranks as consisting of ADDRESS REGISTER 402 and ADDRESS REGISTER SLAVE 406 in FIG. 7c. As indicated, both ranks are 11-bits in length. The lower 8-bits of ADDRESS REGISTER 402 are readable to the microprocessor as displacement address 4004 octal above a base of 1140000 octal. Similarly, the upper 3-bits of ADDRESS REGISTER 402 are readable (only) to the microprocessor as displacement address 4003 octal over a base of 1140000 octal. The contents of ADDRESS REGISTER 402 as updated in the path proceeding through ADDRESS REGISTER SLAVE 406 and the address adder ADDER 404 are selected in the 10-bit wide 1 or 4 random address memory selector RAM ADDR SEL 736 to selectively address data within the random access memory via signals RAM ADDRS 00-10. Addressing of the SCAN/SET BUFFER (2K×8 RAM) 208 via such route is used to access data, and header bytes from the buffer as illustrated in FIG. 5a and FIG. 6a. In order to so access data, the ADDRESS REGISTER 402 is effectively initialized under the occurence of signal JAM 1 at the beginning of any operation to reference displacement address 4 within the SCAN/SET BUFFER (2K×8 RAM) 208. The contents of ADDRESS REGISTER 402 are not reset between successive blocks during block transfer operations except during the second block of VERIFY mode (reference signal ADRS CRT=3 in FIG. 9 and associated explanation). At the end of any operation, the contents of ADDRESS REGISTER 402 contain the next, subsequent address which would be used should operations continue. If operations are suspended due to the occurrence of a verify error, as opposed to a normal completion, the contents of the ADDRESS REGISTER 402 will contain the address of the first byte of the next block which would have been written if the error had not stopped further block data transfer activity. The control signal S applied to ADDRESS REGISTER 402 is quite complex of generation, especially in the block write with VERIFY operational mode. Nonetheless, the derivation of such signal S is definitively given in the table of FIG. 8. Update modification to the addressing quantity contained within ADDRESS REGISTER 402 is derived by the addition of a 6-bit quantity as signal 00-05 in the 11-bit adder ADDER 404. A +1 signal is also received at the CARRY input, meaning that each time the contents of ADDRESS REGISTER 402 are gated on the true occurrence of signal S, then such contents will be augmented by plus 1, or by the addend selected in ADDEND SEL 738 plus 1. Gating of signals ADDEND 00-05 through the 6-bit wide 1 of 2 selector ADDEND SEL 738 occurs under the logical true condition of selection signal X, and is the manner by which the contents of ADDRESS REGISTER 402 may be updated within an excursion range of 00 through 77 octal during block data transfer modes. In ECHO modes, during which the utilization of SCAN/SET BUFFER (2K×8 RAM) 208 is illustrated in FIG. 5a and FIG. 6a, the most significant memory write address bit, signal RAM ADDRS 00 is developed in 2 input OR gate OR 740 as the combination of signal 00 arising from the most significant bit of ADDRESS REGISTER SLAVE 406 of the signal ECHO MODE arising from the MODE REGISTER 414.

Figure 7D:
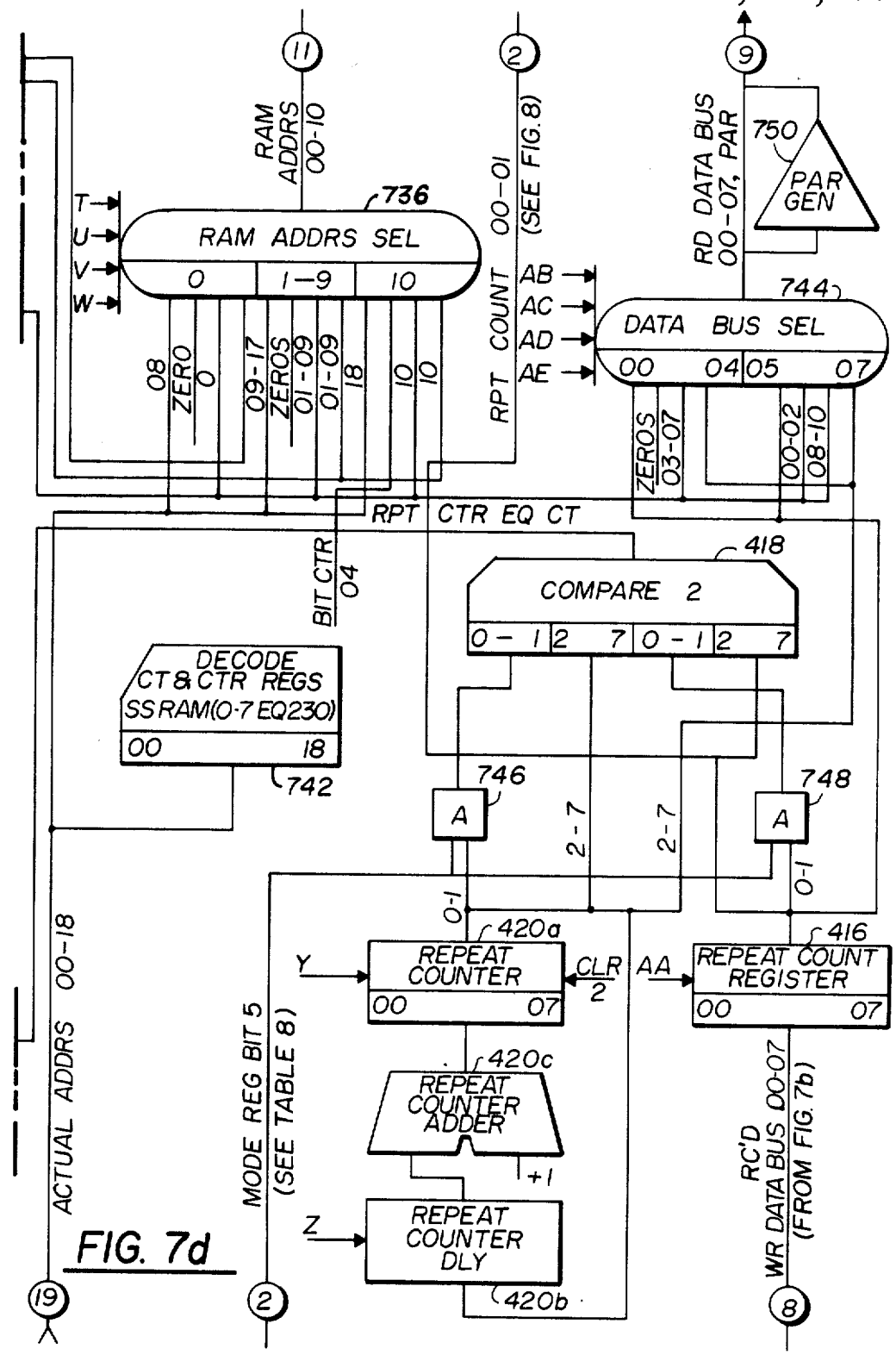

Continuing in FIG. 7d, signals ACTUAL ADDRS 00-18 are derived as the absolute, 19 binary bit, address from the microprocessor. Certain decode circuits, of which DECODE CT & CTR REGS, SS RAM (0-7 EQ 230) 742 is illustrated, will enable gating and selection within the present logics responsively to such microprocessor addressing. It should be recalled, however, that the microprocessor is not involved in the ongoing activity of the present circuit to bit-serially transfer SCAN data, and the initiation of the entire operation transpires when the microprocessor finally writes the bits of MODE REG 414 (shown in FIG. 7b), other registers' parameters previously having been established.

Continuing with the explanation of the logics circuit of the present invention as shown in FIG. 7, the REPEAT COUNTER 420a and REPEAT COUNT REGISTER 416 are shown in FIG. 7d. The REPEAT COUNT REGISTER 416 can be written or read from the microprocessor as displacement address 4000 octal above a base of 1140000 octal. The signals by which such 8-bit register might be written are shown as signals WR DATA BUS 00-07, whereas the path by which it may be read is shown to be gated through 8-bit wide 1 of 5 selector DATA BUS SEL 744 occurring under the true condition of selection signal AB. As already mentioned, in non-block operational mode the lower 6-bits of REPEAT COUNT REGISTER 716 are catenated to the 8-bits of LOOP LENGTH REGISTER 408 (shown in FIG. 7b) as the upper bits of a 14-bit composite register. The upper bit, bit 0, of the REPEAT COUNT REGISTER 416 is utilized in non-block operational modes as a special function mode bit. When set, this bit will cause the first generation of signal SCAN CLOCK PH B on line 103 (shown in FIG. 3) to be skipped for the (non-block) string address. When such addressed string contains a pattern in the SCAN rank (which may be a zero pattern inserted at the CENTRAL COMPLEX 202 under the occurrence of a clear signal to such SCAN rank), then with the special function mode bit (bit zero of REPEAT COUNT REGISTER 416) set, then the normal first gating of the main rank to the SCAN rank will be skipped, and the first occurrence of signal SCAN CLOCK PH A on line 107 (reference FIG. 3) will gate the pattern of the SCAN rank into the main rank (reference FIG. 1). During the non-block string operation, the contents of the SCAN rank will then be bit-serially shifted from the string to the CONTROL PROCESSOR 204 and the main rank within the selected SCAN loop string will have the original pattern stored in it. A clear of such main rank of the SCAN loop string needs be done within CENTRAL COMPLEX 202 if it is desired to clear this pattern. If a non-block string WRITE operation is performed, the selected SCAN loop string will assume the written data. The bit next to the upper bit of REPEAT COUNT REGISTER 416, bit 1, is not used in non-block operational modes. In block data transfer modes, all 8-bits of REPEAT COUNT REGISTER 416 are utilized to specify the total number of headers and data blocks to be in use in the entire block data transfer operation.

Continuing in FIG. 7d, the REPEAT COUNTER 420a is (only) readable from the microprocessor at displacement address 4005 octal over a base of 1140000 octal. In block data transfer modes, this 8-bit wide counter holds the block number. At the end of a block data transfer operation, it will contain the block number of the last block processed. This number should be equal to that parameter previously loaded by the microprocessor in the REPEAT COUNT REGISTER 416 unless the occurrence of a verify error has stopped the operation early. As previously mentioned, in non-block data transfer operations, the REPEAT COUNTER 420a is catenated to the BIT COUNTER 412a (shown in FIG. 7a) to form a 14-bit composite counter. At the conclusion of non-block data transfer operations, the contents of this composite counter should end up with a value equal to the 14-bit composite of the LOOP LENGTH REGISTER 408 and REPEAT COUNT REGISTER 416 rounded up to the next multiple of eight. The current block count within REPEAT COUNTER 420a is incremented in the path proceeding through the second rank of such repeat counter—REPEAT COUNTER DLY 420b, and an 8-bit wide adder REPEAT COUNTER ADDER 420c.

Continuing in FIG. 7d, the six least significant bits of the initialized block count contained within REPEAT COUNT REGISTER 416 and the current block count contained within REPEAT COUNTER 420a are directly input to the 8-bit wide comparator COMPARE 2 418. The two most significant bits of REPEAT COUNTER 420a are gated as signals 0-1 by signals MODE 05 through two 2 input AND gates A746. Similarly, the two most significant bits of REPEAT COUNT REGISTER 416 are gated as signals 0-1 through two 2 input AND gates A748 by signals MODE 05. The comparison transpiring in 8-bit wide comparator COMPARE 2 418 results in the true condition of signal RPT CTR EQ CT upon the equivalence of the dynamic current and stored parameterized block count. Also shown in FIG. 7d, the 8-bit wide 1 of 5 selector DATA BUS SEL 744 selects, responsively to one only of four control signals AB through AE, an 8-bit quantity to be gated to the microprocessor as signals RD DATA BUS 00-07. It is suggested by the optional parity generation element PAR GEN 750 that a signal PAR or a parity signal, could also be generated for transmission to the microprocessor.

The timing of the circuit of the present invention during the transference of header information from the SYSTEM SUPPORT PROCESSOR 204 to the CENTRAL COMPLEX 202 (reference FIG. 2 or FIG. 4) is shown in FIG. 9. A microprocessor write to MODE REG 414 (shown in FIG. 7b) causes a SCAN data transfer operation of types 0 through 7 octal to commence in accordance with the previously established parameters (if such parameters designate that any data is to be transferred). If the SCAN logics within the SYSTEM SUPPORT PROCESSOR 204 (shown in FIG. 4) are addressed by the microprocessor, such as by the interpretation of actual address bits 00-18 equaling 114XXXX octal, then the write strobe signal WR STROBE shown in FIG. 9, may be rippled through a first latch as signal WR DLY, and through a second latch as signal WR DLY 2, in order to—if the mode register is addressed (actual address bit 00-18 equals 01144002 octal) and neither a block transfer completion interrupt nor a verify error interrupt is pending—set and enable the header latch producing signal EN HDR. The BIT COUNTER 412a (shown in FIG. 7b) and the REPEAT COUNTER 420a (shown in FIG. 7d) are both cleared at this time. The existence of the enable header condition, represented by the true condition of signal EN HDR, and after rippling through one additional latch, signal EN HDR DLY (as shown in FIG. 9) causes the address selection performed in RAM ADDRS SEL 736 (shown in FIG. 7c) to change the signals RAM ADDRS 00-10 from a microprocessor origin to an origin within the logics of FIG. 7. Mainly, under the true condition of selection signal U, an address of all zeros is generated save for the lowest, 09, bit position which is derived from bit 4 of the BIT COUNTER 412a (shown in FIG. 7b) as signal BIT CTR 04 (shown in FIG. 7c). Thusly the first header byte is read from address zero of the SCAN/SET BUFFER (2K×8 RAM) 208 and the second header byte is read from address one of this buffer (reference FIG. 5a and FIG. 6a).

After one cycle, the SCAN busy latch becomes set as represented by signal SS BUSY shown in FIG. 9. One-half cycle after this occurrence, the first of three timing latches, flip-flop B, becomes set producing logical true signal B shown in FIG. 9. The setting of flip-flop B is utilized to produce the setting of a flip-flop A which is used to produce the setting of a flip-flop A delayed, producing signals, B, A. and A DLY as indicated in FIG. 9 in ordered sequence. This clock management is shown in FIG 8c. The SCAN/SHIFT REGISTER 206a (shown in FIG. 7a) is loaded with the first byte from displacement address 000 octal of the SCAN/SET BUFFER (2K×8 RAM) 208 (shown in FIG. 7a) at this time as indicated by signal LOAD/SHF in FIG. 9. Immediately, bit 0 of SCAN/SHIFT REGISTER 208a is driven by driver DR 308 as signal SCAN DATA IN on line 105 (all shown in FIG. 7a). A further timing pulse phase B, PH B shown in FIG. 9, of one-half cycle duration is generated from combination logic of flip-flop B set, flip-flop A cleared, and flip-flop A delayed clear (signals B, A, and A DLY shown in FIG. 9).

The contents of BIT COUNTER 412a are gated through the +1 ADDER 412c into the BIT COUNTER DLY 412b (reference FIG. 7b) and the contents of REPEAT COUNTER 420a are gated into REPEAT COUNTER DLY 420b (reference FIG. 7d) while flip-flop A is set (signal A in FIG. 9) and flip-flop A delayed is cleared (absence of signal A DLY in FIG. 9) as a sequence enable. The amount of time delay in the generation of signal A DLY is not critical. This process is diagrammatically illustrated in FIG. 9 by reference to the two ranks of the bit counter (BIT COUNTER 412a and BIT COUNTER DLY 412b shown in FIG. 7a) by showing the sample contents of such bit counter during the header sequence. The question marks indicate that priorly existing contents are unknown and without relevance to the current sequence. During the first gating of the BIT COUNTER 412a to the BIT COUNTER DLY 412b (shown in FIG. 7a) note in FIG. 9 that contents of 00 octal are transferred.

One cycle later, a phase A pulse, signal PH A shown in FIG. 9, is generated from combinatorial logic in a like manner to the generation of the phase B pulse. One-half cycle later, the contents of BIT COUNTER DLY 412b incremented by +1 in +1 ADDER 412c are gated into the BIT COUNTER 412a (all shown in FIG. 7b). This transference is diagrammatically illustrated in FIG. 9 wherein the octal 00 contents of BIT CTR DLY are incremented by 1 and transferred to BIT CTR wherein the quantity 01 octal appears. The REPEAT COUNTER 420a is also incremented by 1 via the path through REPEAT COUNTER DLY 420b and REPEAT COUNTER ADDER 420c (all shown in FIG. 7d) once only during each header time of block modes only. Such time of incrementation is shown as signal INC RPT CTR in FIG. 9. In non-block modes, it may be recalled that the REPEAT COUNTER 420a is an extension of the BIT COUNTER 412a. In such a non-block mode, when the BIT COUNTER DLY 412b contains a value of 377 octal and the incremented contents gated to BIT COUNTER 412a cause such BIT COUNTER 412a to assume a zero value (all shown in FIG. 7b), then the carry from BIT COUNTER 412a causes the REPEAT COUNTER 420a (shown in FIG. 7d) to be incremented by one.

Continuing in the explanation of header sequence operations with reference to FIG. 9 and FIG. 7, one-half cycle later, as shown by the occurrence of signal SHIFT DLY in FIG. 9, the contents of SCAN/SHIFT REGISTER 206a are gated left-shifted one bit position and into the SCAN/SHIFT REGISTER DLY 206b (shown in FIG. 7a). One cycle later, as indicated by the next occurrence of signal LOAD/SHF in FIG. 9, the contents of SCAN/SHIFT REGISTER DLY 206b are gated through the LOAD/SHIFT 206c and into the SCAN/SHIFT REGISTER 206a (all shown in FIG. 7a) thereby sending the second bit of the header quantity out through driver DR 308 onto the SCAN/SET NETWORK 109. The second occurrence of signal SCAN CLOCK PH B sent out at this time is used to gate the main rank (contains header information) onto the SCAN rank in the scan/settable HEADER REGISTER of all interconnected CENTRAL COMPLEX 202 devices (reference FIGS. 1–3). This second occurrence of signal SCAN CLOCK PH B also will cause the scan logics within the CENTRAL COMPLEX 202 to send the second bit of the previous header quantity as signal SCAN DATA OUT on line 101 across the SCAN/SET NETWORK 109 to SYSTEM SUPPORT PROCESSOR 204 interconnected thereon. This returned header quantity information is, however, neither stored nor used.

Two cycles later, the second occurrence of signal SCAN CLOCK PH A is sent out on line 101 of the SCAN/SET NETWORK 109 to gate the second header bit into the main rank of HEADER REGISTERS 210 within the slave controlled CENTRAL COMPLEX 202 devices. One cycle later, and by momentary reference to FIG. 7a, the second bit of the old header word (which should be equivalent within all slave CENTRAL COMPLEX 202 devices) is gated into flip-flop FF SERIAL IN 708 at the same time that signal C gates the SCAN/SHIFT REGISTER DLY 206b. Continuing with the momentary reference to FIG. 7a, although the old header data received as signal SCAN DATA OUT On line 101 through AND gate A 710 and into the flip-flop FF SERIAL IN 708 will, through the path proceeding through LOAD/SHIFT 206c, become shifted into the SCAN/SHIFT REGISTER 206a, such older header data is never stored within SCAN/SET BUFFER (2K×8 RAM) 208.

Continuing in FIG. 9, when the BIT COUNTER 412a (shown in FIG. 7b) has a contents of 02, diagrammatically represented in FIG. 9, the the ADDRESS REGISTER 402 is forced under the occurrence of signal JAM 1 (shown in FIG. 7c and FIG. 8) to the value of 3 during the first header time of any SCAN operation, such as is represented by the line ADRS CTR=03 in FIG. 9. During the time that the second header quantity is sent out, if the selected operation is a write with verify, then the ADDRESS REGISTER 402 is again forced to 3 under the occurrence of signal JAM 1 (shown in FIG. 7c). The contents of REPEAT COUNTER 420a (shown in FIG. 7d) equals a value of 2 during this second header time. This is the meaning of the conditional line "IF NON-BLOCK MODE OR RPT CTR EQ 1, OR VERIFY MODE AND RPT CTR EQ 2" shown in FIG. 9 associated with the occurrence of the ADRS CTR=03 forcing signal.

Continuing in FIG. 9 and FIG. 7c, the ADDRESS REGISTER 402 is gated to the ADDRESS REGISTER SLAVE 406 when the BIT COUNTER DLY 412b (shown in FIG. 7b) has a contents of 4, such occurrence as is illustrated by the line ADRS CTR TO ADRS CTR DLY in FIG. 9. Meanwhile, data transmission and shifting within SCAN/SHIFT REGISTER 206a and SCAN/SHIFT REGISTER DLY 206b (shown in FIG. 7a) continues. The last bit of the first byte is gated into the HEADER REGISTERS 210 within each of the CENTRAL COMPLEX 202 devices shortly after the eighth occurrence of the PH A CLOCK signal. After the SCAN/SHIFT REGISTER DLY 206b (shown in FIG. 7a) is clocked as represented by the last occurrence of signal SHIFT DLY in FIG. 9, then the timing diagram folds to the left side of the sheet in continuation of the header sequence.

Momentarily referencing FIG. 7b and FIG. 7d, when the BIT COUNTER 412a has counted to a value of 10 octal, then bit 4 is set presenting BIT CTR 04 to RAM ADDRS SEL 736 which presents an address of octal 1 and one-half cycles after the contents of BIT COUNTER 412a become 10 octal, the SCAN/SHIFT REGISTER 206a is loaded through LOAD/SHIFT 206c with the second header byte from address 1 of the SCAN/SET BUFFER (2K×8 RAM) 208 (all shown in FIG. 7a). The header sequence continues. When the contents of BIT COUNTER DLY 412b (shown in FIG. 7b) equals 14 octal, then the ADDRESS REGISTER SLAVE 406 (shown in FIG. 7c) is clocked again with the same data as when the BIT COUNTER DLY 412b register contained a value of 04 octal. During non-header time clocking is required each time that the lower 3-bits of the BIT COUNTER DLY 412b register have a value of octal 4. Double clocking during the header time does no harm.

When the BIT COUNTER 412a (shown in FIG. 7b) contains a value of 15 octal, and contents of ADDRESS REGISTER SLAVE 406 added to an addend gated through ADDEND SEL 738 in ADDER 404 is clocked into the ADDRESS REGISTER 402 (all shown in FIG. 7c). This event is represented in FIG. 9 as the line ADRS CTR DLY PLUS ADDEND TO ADRS CTR, which occurrence is conditional on AT BIT CTR 4–7 EQ 15 OCTAL IF (SAME IF COND ABOVE). This addend is equal to octal 1 during the first header time. It is equal to the number of bytes in LOOP LENGTH REGISTER 408 (shown in FIG. 7b), rounded up +1, if the repeat count contained within REPEAT COUNT REGISTER 416 (shown in FIG. 7d) is greater than one and the value of 5 octal is contained within the lower 3-bits of BIT COUNTER 412a (shown in FIG. 7b). For example, if the bit counter were 9-bits, the rounded up byte count would be 2, and the addend would be 3. Note that the ADDRESS REGISTER 402 (shown in FIG. 7c) is clocked during the first header time, during the second header time, if in verify mode, and never at any other header times. At the end of the first header time, the contents of ADDRESS REGISTER 402 will be octal 4 and the contents of ADDRESS REGISTER SLAVE 406 will be octal 3 (both shown in FIG. 7c). At the end of the second header time in verify mode, the contents of ADDRESS REGISTER 402 will be octal 4 plus the byte count while the contents of ADDRESS REGISTER SLAVE 406 wil be octal 3 (both shown in FIG. 7c).

Shifting the SCAN/SHIFT REGISTER 206a (shown in FIG. 7a) continues during the header sequence. When the contents of BIT COUNTER 412a (shown in FIG. 7b) equals 20 octal, then binary bit 3 is set. This occurrence is used to set the INHIB A flip-flop, giving rise to signal INHIB A shown in FIG. 9. A new byte of data will be loaded within such SCAN/SHIFT REGISTER 206a (shown in FIG. 7a) before the header sequence, represented by signal EN HDR, drops but this final byte of data will not be used. The setting of the inhibit A flip-flop, as represented by signal INHIBIT A, causes the header sequence to drop, the BIT COUNTER 412a (shown in FIG. 7b) to be cleared, the inhibit B flip-flop to be set (giving rise to signal INHIBIT FIRST B shown in FIG. 9 and causes the inhibition of a phase A clock pulse, signal PH A shown in FIG. 9. The header sequence time is finished.

The timing diagram of the operation of the circuit of the present invention during the transmission of actual SCAN loop data from the SYSTEM SUPPORT PROCESSOR to the addressed CENTRAL COMPLEX during data transfer operations is shown in FIG. 10. When the header sequence terminates as represented by the cessation of signal EN HDR in FIG. 10, the selection transpiring in RAM ADDRS SEL 736 (shown in FIG. 7d) for addressing the SCAN/SET BUFFER (2K×8 RAM) 208 (shown in FIG. 7a) changes. When the busy flip-flop is set (signal SS BUSY in FIG. 10), the header sequence is cleared (signal EN HDR), the A timing flip-flop is cleared (signal A), and the lower 3-bits of BIT COUNTER 412a (shown in FIG. 7b) are cleared, then the address gated through RAM ADDRS SEL 736 (shown in FIG. 7d) will come from the ADDRESS REGISTER 402 (shown in FIG. 7c). The SCAN/SHIFT REGISTER 206a will be loaded through LOAD/SHIFT 206c with a byte of data from the SCAN/SET BUFFER (2K×8 RAM) 208 (all shown in FIG. 7a) if the operation is neither a block read nor a non-block read. The first occurrence of the phase B pulse, signal PH B shown in FIG. 10 will be inhibited if the upper bit of the REPEAT COUNT REGISTER 416 (shown in FIG. 7d) is set while in a non-block mode. The upper 2-bits of such REPEAT COUNT REGISTER 416 are not needed as an extension of the LOOP LENGTH REGISTER 408 (shown in FIG. 7b) in non-block modes. Thusly the upper bit of such REPEAT COUNT REGISTER 416 can then be utilized to designate the special scan mode, shown as (IF NOT SPECIAL SCAN). If a string to be scanned has a pattern in its SCAN rank resultant from a master clear, then the missing first phase B clock pulse (signal PH B shown in FIG. 10) will not gate the string main rank onto the SCAN rank (reference FIG. 1). The SCAN loop data transfer will then be of the data of the addressed string SCAN rank.

Conversely, if the first data transfer sequence clock phase B pulse (signal PH B shown in FIG. 10) is not inhibited, it gates the main rank onto the SCAN rank of the selected string. The first bit of the selected string data is then put onto the SCAN/SET NETWORK 109 for the reading of the string. The next occurrence of the SCAN clock phase A pulse, signal PH A shown in FIG. 10, is utilized by the CENTRAL COMPLEX 202 device to clock 1-bit of data into the selected string and to clock other bits from the SCAN rank of such string shifted 1-bit position (reference FIG. 1). The bit shifted into the selected string is either the write data provided by the SYSTEM SUPPORT PROCESSOR 204 from its SCAN/SHIFT REGISTER 206a through the driver DR 308 as signal SCAN DATA IN on line 105 if the write bit of the previously transmitted header has been set, or the output of the selected string if the write bit of such header is cleared.

One cycle later during the data transfer operation, a bit of string data is gated as signal SCAN DATA OUT on line 101 through AND gate A 710 (under the enablement of signal G) to the serial in flip-flop FF SERIAL IN 708 (shown in FIG. 7a). Additionally, the contents of SCAN/SHIFT REGISTER 206a are gated into the SCAN/SHIFT REGISTER DLY 206b (shown in FIG. 7a). Three total cycles have been allowed for the occurrence of signal PH B to get to the remotely located string and to bring a bit back to the SYSTEM SUPPORT PROCESSOR 204 for loading in this FF SERIAL IN 708 (shown in FIG. 7a).

One cycle after the SCAN/SHIFT REGISTER DLY 206b is clocked, the bits 1-7 of this SCAN/SHIFT REGISTER DLY 206b are clocked through LOAD/SHIFT 206c into bits 0-6 of the SCAN/SHIFT REGISTER 206a while the contents of FF SERIAL IN 708 is clocked into bit 7 of such SCAN/SHIFT REGISTER 206a (all shown in FIG. 7a). This completes one shift of such SCAN/SHIFT REGISTER 206a. Note that the shift, rather than the load, occurs whenever the contents of the lower 3-bits of BIT COUNTER 412a (shown in FIG. 7b) are not equal to zero. If the contents of the LOOP LENGTH REGISTER 408 were equal to octal 1, the match with the incremented contents of BIT COUNTER 412a (both shown in FIG. 7b) would occur after the first clock phase A pulse (signal PH A shown in FIG. 10) was sent out. A count match flip-flop, represented as signal FF CT MATCH in FIG. 10, would set one cycle after the first bit was shifted into the SCAN/SHIFT REGISTER 206a (shown in FIG. 7a) and remain set. Such count match flip-flop clears during the header time. Zeros are shifted into the SCAN/SHIFT REGISTER 206a (shown in FIG. 7b) from the time of the setting of the count match flip-flop until the end of the byte.

The contents of ADDRESS REGISTER 402 (shown in FIG. 7c) is updated during the shifting of the SCAN/SHIFT REGISTER 206a (shown in FIG. 7a). At the end of the first header operation, such ADDRESS REGISTER 402 will have a value of 4 and the contents of ADDRESS REGISTER SLAVE 406 (both shown in FIG. 7c) will have a value of 3 octal. When the first byte of the first string is shifting in such SCAN/SHIFT REGISTER 206a and the BIT COUNTER 412a (shown in FIG. 7b) has a value of octal 4, the ADDRESS REGISTER 402 (shown in FIG. 7c) is incremented to 4 octal. Two cycles later, this value of octal 4 is gated into the ADDRESS REGISTER SLAVE 406 (shown in FIG. 7c). After another two cycles, the contents of such ADDRESS REGISTER SLAVE 406 is incremented by one in ADDER 404 and reemplaced in ADDRESS REGISTER 402 (all shown in FIG. 7c), thereby leaving such ADDRESS REGISTER 402 with a contents of octal 5. The address increments in this manner as each byte is shifted, except if the contents of REPEAT COUNTER 420a should be greater than one and the operation is a write with verify operation.

At the end of the second header operation in verify mode, the contents of ADDRESS REGISTER 402 will contain a value of 4 octal plus the byte count (thereby pointing to the first byte of the SECOND BLOCK STRING DATA as illustrated in FIG. 5a) and the ADDRESS REGISTER SLAVE 406 (shown in FIG. 7c) will contain a value of octal 3. The updating of such ADDRESS REGISTER 402 (shown in FIG. 7c) during the transmission of the first byte of the second block is done in three steps. Firstly, the value (3) contained within the ADDRESS REGISTER SLAVE 406 is incremented by one in ADDER 404 and gated into ADDRESS REGISTER 402 (all shown in FIG. 7c), thereby emplacing a value of 4 within such ADDRESS REGISTER 402. Secondly, such ADDRESS REGISTER 402 is again gated to ADDRESS REGISTER SLAVE 406 (both shown in FIG. 7c), thereby allowing both to assume a value of 4 octal. Thirdly, the value (4)

of such ADDRRESS REGISTER SLAVE 406 is incremented by one in ADDER 404 and also added to the byte count which is gated from LOOP LENGTH REGISTER 408 through BYTE COUNT ADDER 714 (both shown in FIG. 7b) through ADDEND SEL 738 (shown in FIG. 7c). This third operation emplaces a value of 5 plus the byte count within such ADDRESS REGISTER 402 (shown in FIG. 7c). By momentary reference to FIG. 5a, this may be observed to be the address of the second byte within the second block, which address is needed after the shifting of the first byte of such second block has completed.

Both ranks of the ADDRESS REGISTER 402 and the ADDRESS REGISTER SLAVE 406 (shown in FIG. 7c) have been incremented by one during the shifting of data. The difference between the two ranks is maintained at the byte count +1 for all blocks starting with the second block in the write with verify operational mode. After the second header sequence, no address updates take place during header time. The address setup within ADDRESS REGISTER 402 (shown in FIG. 7c) during the shifting of the last byte of each block is the address utilized for the first byte of the next block. After a byte is completely shifted, a new byte of data is loaded into the SCAN/SHIFT REGISTER 206a (shown in FIG. 7a) utilizing the contents of the ADDRESS REGISTER 402 for any write modes. One-half cycle later, the address gated through RAM ADDRS SEL 736 (shown in FIG. 7d) changes to that derived from ADDRESS REGISTER SLAVE 406 (shown in FIG. 7c), which address, except in the verify operation mode, is one less than that contained within ADDRESS REGISTER 402 (also shown in FIG. 7c). Referencing the logical OR gate OR 740 shown in FIG. 7c, the most significant buffer address bit is forced to a 1 in echo operational modes. Meanwhile, and momentarily referencing FIG. 7a, the contents of SCAN/SHIFT REGISTER DLY 206b bits 1-7 plus the bit contained within the FF SERIAL IN 708 will contain a complete byte of data returned from a string. This first returned first byte will be stored in address 2004 octal (reference FIG. 5a). However, if not in echo mode and in read mode, this first byte will be stored in address 0004 octal utilizing the ADDRESS REGISTER SLAVE 406 (shown in FIG. 7c) rank of the ADDRESS REGISTER as the address source selected in RAM ADDRS SEL 736 (shown in FIG. 7d) to the SCAN/SET BUFFER (2K×8 RAM) 208 (shown in FIG. 7a).

Continuing in FIG. 10, one-half cycle after the address selection is switched in RAM ADDRS SEL 736 (shown in FIG. 7d) to the ADDRESS REGGISTER SLAVE 406 (shown in FIG. 7c), a write enable, signal WR EN shown in FIG. 10, is sent to the SCAN/SET BUFFER (2K×8 RAM) 208, and the data is additionally gated to such RAM. The data to and from the SCAN/SET BUFFER (2K×8 RAM) 208 on bus SS RAM DATA 00-07 is bidirectional. The write enable, signal WR EN shown in FIG. 10, starts a write to the RAM and turns the read drivers off so that the data to be written to such RAM may be set upon the bidirectional lines. The signal FF DATA ENABLE shown in FIG. 10, meaning the setting of a flip-flop enabling via signal B the TRI-STATE DRIVERS (shown in FIG. 7a) to write data, is utilized to extend the write enablement one-half cycle after the write enable flip-flop, signal WR EN, is disabled. This extension is merely to fulfill the hold time requirement of the write enable to a typical RAM chip.

In the verify operational mode, after the first byte of the second block has been shifted out of the SCAN/SHIFT REGISTER 206a, and the second byte is loaded in such SCAN/SHIFT REGISTER 206a (shown in FIG. 7a), then the verification comparison begins. The selection addressing of the RAM in RAM ADDRS SEL 736 is switched from the contents of ADDRESS REGISTER 402 (which had contained an octal 5 plus the rounded up byte count) to the contents of ADDRESS REGISTER SLAVE 406 (which contained an octal 4). A comparison is made in VERIFY logics 426 between the returned first byte lodged in SCAN/SHIFT REGISTER DLY 206b and the data from SCAN/SET BUFFER (2K×8 RAM) 208 (all shown in FIG. 7a) which had previously been sent as the first byte of the first block. If the data does not compare, the FF VERIFY ERROR flip-flop 724 (shown in FIG. 7c) sets. If such flip-flop sets, the operation continues to the end of the current block, the operation then terminates, and the interrupt is then presented as signal VE INTRPT as gated in AND gate A 726 (shown in FIG. 7c) by signal NOT BUSY. All bytes are verified in the same manner. If no verify error is detected, the verify operation ends with the setting of the FF BLK XFER COMPLETE flip-flop 726 (shown in FIG. 7c) after the last block has been written and the second to the last block has been verified.

Whenever the count match flip-flop sets, represented by signal FF CT MATCH shown in FIG. 10, an operation or a block of an operation ends when the shifting of the current byte completes. The total string data transfer operation ends here in non-block operational modes, if a verify error has occurred, or if the contents of the REPEAT COUNTER 420a in block mode have incremented to equal the contents of REPEAT COUNT REGISTER 416 (both shown in FIG. 7d). If a block transfer mode operation is not ending, another header operation is started and no interrupt is generated. The overall operation continues with alternate header operations (the timing of which is shown in FIG. 9) and string data transfer operations (the timing of which is shown in FIG. 10). Both operations repeat until the total operation ends with either a verify error interrupt or a block complete interrupt. No interrupts are generated for non-block modes. For non-block such modes, the state of the BUSY flip-flop, represented by signal SS BUSY shown in FIG. 9 and FIG. 10, can be read by the microprocessor so that it may see that the scan data transfer operation has completed.

Various modifications and variations falling within the scope and spirit of the present invention will occur to those skilled in the computer arts. The above description presents the present invention as incorporated in its preferred embodiment within a system support processor for the function of initializing computer stores within a digital computer system via a bit-serial SCAN loop. Those of skill in the digital arts will readily be able to apply the time-overlapped features of the present invention to other bit-serial digital communication contexts.

What is claimed is:

1. Wherein a scan/settable register is defined as composite shift register, called a STRING, controllable by clock signals upon a scan/set network to bit-serially be set, meaning written, by data input signals and to bit-serially be scanned, meaning read, to produce data output signals, an improved method of bit-serially sequentially communicating data, called scan data, to and from such a scan/settable register within a slave first digital logic device, called a CENTRAL COMPLEX, from and to a controlling second digital logic device, called a SYSTEM SUPPORT PROCESSOR, to the end that bit-serial communication to, and bit-serial communication from, said scan/settable register should substantially transpire overlapped in simultaneous time, said method of concurrently writing and reading a scan/settable register comprising:

producing in said controlling second digital logic device clock signals, called SCAN CLOCK PH A and SCAN CLOCK PH B, sufficient in time and phase relationship to control the bit-serial shifting of the entirety of said scan/settable register, said STRING, within said slave first digital logic device, and transmitting said produced clock signals upon said scan/set network; while also concurrently in simultaneous time responsively to said clock signals, bit-serially successively shifting first data bits stored within a first register, called a SCAN/SHIFT REGISTER, within said controlling second digital logic device successively serially out from a first end of said first register as a bit-serial first signal, called SCAN DATA IN, which said bit-serial first signal is transmitted upon a line of said scan/set network uniquely dedicated to said first signal; while also concurrently in simultaneous time responsively to said clock signals, bit-serially successively shifting second data bits into a second end of said first register within said controlling second digital logic device responsively to a bit-serial second signal, called SCAN DATA OUT, which second signal is received upon said scan/set network; while also concurrently in simultaneous time responsively to said clock signals received upon said scan/set network, writing by bit-serially setting from a first end and shifting said scan/settable register within said slave digital logic device with said first data bits responsively to receiving said bit-serial first signal upon said scan/set network; while also concurrently in simultaneous time responsively to said clodk signals received upon said scan/set network, reading by bit-serially successively shifting said second data bits stored within said scan/settable register within said slave first digital logic device successively serially out from a second end of said scan/settable register as said bit-serial second signal, which said bit-serial second signal is transmitted upon a line of said scan/set network uniquely dedicated to said second signal;

whereby said bit-serial signal transmissions upon unique signal lines upon said scan/set network is of said first signal, said SCAN DATA IN signal, from said controlling second digital logic device to said slave first digital logic device, and of said second signal, said SCAN DATA OUT, from said slave first digital logic device to said controlling second digital logic device, which transmissions signals and transmissions signal lines are thusly circular between said controlling second digital logic device and said slave first digital logic device, which circular communication upon said scan/set network is called a SCAN LOOP;

whereby both said bit-serial writing of first data bits into said scan/settable register and said reading of second data bits from said scan/settable register does transpire concurrently in simultaneous time.

2. The method according to claim 1 which further comprises:

as and when each entirety of first data bits contained within said first register, said SCAN/SHIFT REGISTER, is completely bit-serially successively shifted and transmitted serially out as said bit-serial first signal upon said scan/set network, then loading and reloading said first register with successive entireties of said first data bits obtained from a buffer memory store, called a SCAN/SET BUFFER, to that extent so that successive entireties are, in aggregate, contained of sufficiently many bits so as to permit of the continuing provision of first data bits shiftable and transmittable as said bit-serial first signal which, in aggregate, do allow said bit-serial writing of the entire said scan/settable register, said entire composite shift register called a STRING.

3. The method according to claim 2 which, as a first preliminary step performed priorly to said concurrent writing and reading, further comprises:

storing a variably specifiable first parameter quantity within a second register, called a LOOP LENGTH REGISTER, within said controlling second digital logic device, which stored first parameter quantity is indicative of the length in bits of said scan/settable register within said first digital logic device;

and wherein said producing step further comprises:

producing in accordance with said first parameter quantity stored within said second register precisely that number of said clock signals as will accomplish said bit-serial shifting of said entirety of said scan/settable register, said STRING;

whereby the bit length of said writing and said reading of said scan/settable register is precisely variably specifiable.

4. The method according to claim 3 expanded and extended by operations causing the transmission of a header quantity, said header quantity transmission operations transpiring after any said preliminary step(s) but priorly to said concurrent writing and reading, said expanded and extended method further comprising:

transmitting for a duration from said controlling digital second logic device the true state of a control signal, called a SCAN ADDRESS ENABLE signal, upon a line of said scan/set network uniquely dedicated to said control signal;

during the duration of the true state of said control signal, also bit-serially transmitting from said controlling second digital logic device a succession of bits which constitute a header word quantity as said bit-serial first signal upon said line of said scan/set network uniquely dedicated to said first signal;

conditionally upon and responsively to the receiving of the true state of said control signal and the receiving of said bit-serial first signal at said slave first digital logic device, causing said succession of bits which constitute said header word quantity as transmitted upon said first signal to become stored in a control register, called a HEADER REGISTER; and responsively to identification information contained within said header word quantity stored in said control register, selecting in said slave second digital logic device said scan/settable register, said STRING, from amongst a plurality of like registers within said slave second digital logic device to be a single addressed register which is written and read in simultaneous time;

whereby said scan/settable register, said STRING, within said slave second digital logic device which is written and read in simultaneous time is selectively addressable by said header word quantity.

5. The method according to claim 4 which, as a second preliminary step performed priorly to said concurrent writing and reading, further comprises:

storing a variably specifiable second parameter quantity within a third register, called a REPEAT COUNT REGISTER, within said controlling second digital logic device, which stored second parameter quantity is indicative of the number of times said scan/settable register within said first digital logic device is to be simultanously written and read;

and which, as a step performed after said concurrent reading and writing, further comprises:

repeating all operations not said first or said second preliminary steps, which is to say repeating said expanded and extended method which is said header quantity transmission operations followed by said concurrent reading and writing, for howsoever many number of times is indicated by said second parameter quantity stored in said third register;

whereby said transmitting of a header word quantity, plus said concurrent reading and writing of said scan/settable register, does repeatedly transpire a variably specifiable number of times.

6. The method according to claim 5 wherein said repeating step further comprises:

repeating said expanded and extended method so that said header quantity transmission operations do bit-serially transmit from said controlling second digital logic device the selfsame identical header word quantity upon each repetition, and so that as and when (1) each entirety of said first data bits contained within said first register, said SCAN/SHIFT REGISTER, are completely bit-serially successively shifted and transmitted serially out as said bit-serial first signal upon said scan/set network, then said first register is loaded and reloaded with new successive entireties of said first data bits obtained from a buffer memory store called a SCAN/SET BUFFER, that extent so that successive entireties are, in aggregate, contained of sufficiently many bits so as to permit of the continuing provision of first data bits shiftable and transmittable as said bit-serial first signal which, in aggregate, do allow said bit-serial writing of the entire said scan/settable register, said STRING, and also so that as and when (2) upon each repetition of said bit-serial writing of said entire said scan/settable register, a new succession of successive entireties of said first data bits, each succession called a BLOCK STRING DATA buffer store, is obtained from said buffer memory store to allow said bit-serial writing of said entire said scan/settable register;

whereby said repeating of said transmitting of said header quantity is of the selfsame identical header word quantity upon each repetition, but said repeating of said bit-serial writing of said entire said scan/settable register is of said new successions of said successive entireties of said first data bits upon each repetition;

whereby the selfsame header quantity is transmitted upon each repetition, but successive new data as allows the writing of said scan/settable register is transmitted upon each repetition.

7. The method according to claim 1 which, immediately upon each such time as said entirety of first data bits contained within said first register have been completely serially shifted out from said first end of said first register and bit-serially transmitted upon said scan/set network, which said each such time is identically equivalent to that time as said first register has been completely filled with second data bits serially shifted into said second end of said first register responsively to said bit-serial second signal received upon said scan/set network, further comprises:

storing said contents of said first register, said second data bits received by bit-serially reading said scan/settable register as said second signal upon said scan/set network, in successive addressable locations of a buffer memory store;

whereby said successive addressable locations of said buffer memory store are called ECHO data buffer stores because the second data bits stored therein are obtained, in the reading of said scan/settable register, responsively to, and in time overlap with, the writing of said scan/settable register, and because if said second data bits stored therein obtained by the reading of said scan settable register represent data previously written to said scan/settable register then such currently read second data bits are a retrieval, or echo, of first data bits previously written.

8. The method according to claim 2 which, immediately upon each such time as said entirety of first data bits contained within said first register have been completely serially shifted out from said first end of said first register and bit-serially transmitted upon said scan/set network, which said each such time is identically equivalent to that time as said first register has been completely filled with second data bits serially shifted into said second end of said first register responsively to said bit serial second signal received upon said scan/set network, further comprises:

storing said contents of said first register, said second data bits received by bit-serially reading said scan/settable register as said second signal upon said scan/set network, in successive addressable locations of a buffer memory store;

whereby said successive addressable locations of said buffer memory store are called ECHO data buffer stores because the second data bits stored therein are obtained, in the reading of said scan/settable register, responsively to, and in time overlap with, the writing of said scan/settable register, and because if said second data bits stored therein obtained by the reading of said scan/settable register represent data previously written to said scan/settable register then such currently read second data bits are a retrieval, or echo, of first data bits previously written.

9. The method according to claim 3 which, immediately upon each such time as said entirety of first data bits contained within said first register have been completely serially shifted out from said first end of said first register and bit-serially transmitted upon said scan/set network, which said each such time is identically equivalent to that time as said first register has been completely filled with second data bits serially shifted into said second end of said first register responsively to said bit-serial second signal received upon said scan/set network, further comprises:
- storing said contents of said first register, said second data bits received by bit-serially reading said scan/settable register as said second signal upon said scan/set network, in successive addressable locations of a buffer memory store;
- whereby said successive addressable locations of said buffer memory store are called ECHO data buffer stores because the second data bits stored therein are obtained, in the reading of said scan/settable register, responsively to, and in time overlap with, the writing of said scan/settable register, and because if said second data bits stored therein obtained by the reading of said scan/settable register represent data previously written to said scan/settable register then such currently read second data bits are a retrieval, or echo, of first data bits previously written.

10. The method according to claim 4 which, immediately upon each such time as said entirety of first data bits contained within said first register have been completely serially shifted out from said first end of said first register and bit-serially transmitted upon said scan/set network, which said each such time is identically equivalent to that time as said first register has been completely filled with second data bits serially shifted into said second end of said first register responsively to said bit-serial second signal received upon said scan/set network, further comprises:
- storing said contents of said first register, said second data bits received by bit-serially reading said scan/settable register as said second signal upon said scan/set network, in successive addressable locations of a buffer memory store;
- whereby said successive addressable locations of said buffer memory store are called ECHO data buffer stores because the second data bits stored therein are obtained, in the reading of said scan/settable register, responsively to, and in time overlap with, the writing of said scan/settable register, and because if said second data bits stored therein obtained by the reading of said scan settable register represent data previously written to said scan/settable register then such currently read second data bits are a retrieval, or echo, of first data bits previously written.

11. The method according to claim 5 which, immediately upon each such time as said entirety of first data bits contained within said first register have been completely serially shifted out from said first end of said first register and bit-serially transmitted upon said scan/set network, which said each such time is identically equivalent to that time as said first register had been completely filled with second data bits serially shifted into said second end of said first register responsively to said bit serial second signal received upon said scan/set network, further comprises:
- storing said contents of said first register, said second data bits received by bit-serially reading said scan/settable register as said second signal upon said scan/set network, in successive addressable locations of a buffer memory store;
- whereby said successive addressable locations of said buffer memory store are called ECHO data buffer stores because the second data bits stored therein are obtained, in the reading of said scan/settable register, responsively to, and in time overlap with, the writing of said scan/settable register, and because if said second data bits stored therein obtained by the reading of said scan/settable register represent data previously written to said scan/settable register then such currently read second data bits are a retrieval, or echo, of first data bits previously written.

12. The method according to claim 6 which, immediately upon each such time as said entirety of first data bits contained within said first register have been completely serially shifted out from said first end of said first register and bit-serially transmitted upon said scan/set network, which said each such time is identically equivalent to that time as said first register has been completely filled with second data bits serially shifted into said second end of said first register responsively to said bit-serial second signal received upon said scan/set network, further comprises:
- storing said contents of said first register, said second data bits received by bit-serially reading said scan/settable register as said second signal upon said scan/set network, in successive addressable locations of a buffer memory store;
- whereby said successive addressable locations of said buffer memory store are called ECHO data buffer stores because the second data bits stored therein are obtained, in the reading of said scan/settable register, responsively to, and in time overlap with, the writing of said scan/settable register, and because if said second data bits stored therein obtained by the reading of said scan/settable register represent data previously written to said scan/settable register then such currently read second data bits are a retrieval, or echo, of first data bits previously written.

13. The method according to claim 5 which, substantially concurrently with said concurrent reading and writing and immediately upon each such time as said entirety of first data bits contained within said first register have been completely serially shifted out from said first end of said first register and bit-serially transmitted upon said scan/set network, which said each such time is identically equivalent to that time as said first register has been completely filled with second data bits serially shifted into said second end of said first register responsively to said bit-serial second signal received upon said scan/set network, further comprises:
- comparing the entire said contents of said first register—said second data bits received by bit-serially reading said scan/settable register—with an equal number of corresponding data bits read as an entirety from said buffer memory store, which corresponding data bits are collectively that one said entirety of first data bits—one said entirety of successive said entireties which in aggregate do allow said bit-serial writing of the entire said scan/settable register, and of a succession of said successive entireties as do allow the repetitive said bit-serial writing of the entire said scan/settable register—which are collectively those first data bits previously written to said scan/settable register which are collectively the identical selfsame second data bits read from said scan/settable register; and producing a signal indicating error if the results of said comparing of second data bits read to first data bits written do not indicate equality;

whereby said comparing of data bits read from said scan/settable register to data bits previously written to said scan/settable register is thusly a verification of the integrity of such reading and writing;

whereby since said comparing, tantamount to verification, is ongoing with said concurrent writing and reading of said scan/settable register, then all operations of reading and writing and comparing are transpiring substantially concurrently in simultaneous time.

14. The method according to claim 6 which, substantially concurrently with said concurrent reading and writing and immediately upon each such time as said entirety of first data bits contained within said first register have been completely serially shifted out from said first end of said first register and bit-serially transmitted upon said scan/set network, which said each such time is identically equivalent to that time as said first register has been completely filled with second data bits serially shifted into said second end of said first register responsively to said bit-serial second signal received upon said scan/set network, further comprises:

comparing the entire said contents of said first register—said second data bits received by bit-serially reading said scan/settable register—with an equal number of corresponding data bits read as an entirety from said buffer memory store, which corresponding data bits are collectively that one said entirety of first data bits—one said entirety of successive said entireties which in aggregate do allow said bit-serial writing of the entire said scan/settable register, and of a succession of said successive entireties as do allow the repetitive said bit-serial writing of the entire said scan/settable register—which are collectively those first data bits previously written to said scan/settable register which are collectively the identical selfsame second data bits read from said scan/settable register; and producing a signal indicating error if the results of said comparing of second data bits read to first data bits written do not indicate equality;

whereby said comparing of data bits read from said scan/settable register data bits previously written to said scan/settable register is thusly verification of the integrity of such reading and writing;

whereby since said comparing, tantamount to verification, is ongoing with said concurrent writing and reading of said scan/settable register, then all operations of reading and writing and comparing are transpiring substantially concurrently in simultaneous time.

15. In serial digital communication bidirectionally transpiring between a first and a second digital logic device, an improvement to the method of (1) communicating first data from a source of said first data within said first digital logic device bit-serially upon a media to a destination of said first data within said second digital logic device, which operation is called writing, and (2) using said destination of said first data within said secnd digital logic device as a source of second data, and (3) communicating second data from said source of said second data within said second digital logic device bit-serially upon a media to a destination of said second data within said first digital logic device, which operation is called reading, and (4) comparing in said first digital logic device said second data read to corresponding said first data previously written, which comparing is thusly verification of the integrity of said writing, said using, and said reading CHARACTERIZED IN THAT THE STEPS OF:

said (1) writing and said (3) reading transpire partially overlapped in simultaneous time, meaning that successive first portions of said second data are read bit-serially upon said media from said source of second data within said second digital logic device to said first digital logic device concurrently that successive last portions of said first data are written bit-serially upon said media from said source of first data within said first digital logic device to said destination of said first data within said second digital logic device;

whereby since said writing and said reading do transpire partially overlapped in simultaneous time then said reading bit-serially upon said media is non-conflicting with said writing bit-serially upon said media, which thusly means that said media is possessed of at least two independent channels, or lines, of communication;

whereby since said writing and said reading do transpire partially overlapped in simultaneous time then said using of said destination of said first data within said second digital logic device as a source of said first portions of said second data for said reading is thusly non-conflicting with said writing of said last portions of said first data within said destination of said first data.

16. The method of claim 15 IS FURTHER CHARACTERIZED IN THAT THE STEP OF:

said (3) reading does communicate said second data from said source of said second data within said second digital logic device bit-serially upon said media to said destination of said second data within said first digital logic device WHICH destination of said second data IS said source of said first data in those of the data bits positioned thereof not progressively bit-serially filled with said second data read;

whereby when all the data bits of said source of first data have been written, then said source of first data will be filled with said second data.

17. The method of claim 15 FURTHER CHARACTERIZED IN THAT THE STEP OF:

said (4) comparing of said second data read to corresponding said first data previously written is by portions, meaning that successive said first portions of said second data read are compared to corresponding portions of said first data previously written immediately upon each said first portion of said second data should be read;

whereby said comparing is thusly concurrently ongoing with said writing and said reading which transpire partially overlapped in simultaneous time.

18. The method of claim 15 FURTHER CHARACTERIZED IN THAT THE STEP OF said (4) comparing of said second data read to corresponding said first data previously written does transpire in time only when all successive first portions of said second data, said all successive first portions of said second data constituting all of said second data, have been completely read;

whereby said comparing is thusly subsequent to both said writing and said reading which transpire partially overlapped in simultaneous time.

19. A digital logic apparatus for bidirectionally bit-serially conducting reading and writing communication via clock and data signals upon a multiplicity of signal lines of a scan/set network to a scan/settable register within a remote, slaved, digital logic device, said apparatus comprising:

buffer memory means for storing a multiplicity of output data bits as successive addressable pluralities, or output strings, of said output data bits;

shift register and communicating means
for successively receiving by parts said successive addressable pluralities of said output data bits from said buffer memory means, and also
for shifting out bit-by-bit each part of said successive pluralities of said output data bits to form by said shifting a bit-serial output data signal plus clocking signals, and bit-serially transmitting said output data signal plus said clocking signals upon a first signal line plus second signal lines of said multiplicity of signal lines of said scan/set network to said scan/settable register within said remote digital logic device to acomplish the writing communication to said digital logic device, and also
for receiving input data as a bit-serial input data signal upon a third signal line of said multiplicity of said signal lines of said scan/set network from said scan/settable register within said remote digital logic device, which bit-serial input data signal enables the shifting in bit-by-bit of data read from said remote digital logic device until a plurality of such input data bits are assembled as an input data word WHEREIN said shifting out and said transmitting is conducted in simultaneous overlapped time with said receiving and said shifting in at said shift register and communicating means because said plurality of output data bits are shifted one bit-by-bit from one end of said shift register and communicating means at the same time as said plurality of input data bits are shifted in bit-by-bit to the other end of said shift register and communicating means;

whereby said reading and said writing communication via said clock and data signals upon said multiplicity of signal lines of said scan/set network to said scan/settable register within said remote digital logic device in concurrent in said shift register and communicating means.

20. The digital logic apparatus of claim 19 wherein said buffer memory means further comprises:
buffer memory means for storing, as successive addressable pluralities, a multiplicity of input data bits;

and wherein said shift register and communicating means further comprising:
shift register and communicating means
for addressably transferring each of successive pluralities of input data bits shifted in and assembled as input data words to said buffer memory means for storage;

whereby at the conclusion of said writing communication of said multiplicity of output data bits, which communication is in concurrent time with the reading communication of said multiplicity of input data bits in said shift register and communicating means, then said buffer memory means will still contain said multiplicity of input data bits and will, responsively to said addressably transferring, also contain said successive pluralities of input data bits;

whereby although nothing has been established concerning the relationship of said multiplicities of output data bits and input data bits, IF said scan/settable register within said remote digital logic device were, after some number of bits delay less than that total multiplicity of output data bits, taking successive ones of previously output said output data bits and transmitting said ones as input data bits to said shift register and communicating means THEN these certain ones of said input data bits as stored in said buffer memory means would be, insofar as said writing and said reading had transpired without alteration to said ones of data bits, identical to certain ones of said output data bits as stored in said buffer memory means, which operation and likeness MAY arbitrarily be called an ECHO, which operation would be one use of said buffer memory means containing said successive pluralities of output data bits and input data bits.

21. The digital logic apparatus of claim 19 which further comprises:
comparing means for comparing each of successive pluralities of input data shifted into, and assembled in, said shift register and communicating means to a corresponding one of said successive addressable pluralities of output data bits as stored in said buffer memory means, said corresponding meaning only that each one of said successive addressable pluralities of output data bits as compared is one which has upon a previous time been received into, and shifted out bit-by-bit from, said shift register and communicating means, and for indicating the equal or unequal results of each such comparing of corresponding ones of successive pluralities;

whereby although nothing has been established that said comparing should ever indicate equality, IF said scan/settable register within said remote digital logic device were, after some number of bits delay less than the total multiplicity of output data bits, taking successive ones of previously output said output data bits and transmitting said ones as input data bits to said shift register and communicating means, and IF said certain ones of said input data bits as collectively form one of said successive pluralities of input data shifted into, and assembled in, said shift register and communicating means were subject to said comparing with those identical certain ones of said successive addressable pluralities of said output data bits stored in said buffer memory means which originally by the course of said writing and said taking and said transmitting and said reading gave rise to said certain ones of said input data bits, THEN said comparing would indicate equality SO LONG AS said writing and said taking and said transmitting and said reading has been performed without alteration of said data bits both input and output, which operation may arbitrarily be called VERIFY, which operation would be one use of said comparing means.

22. The digital logic apparatus of claim 20 which further comprises:
parameter storage means for holding a variably specifiable parameter quantity, called a LOOP LENGTH, which parameter specifies the number of output bits of each of said successive addressable pluralities, or output strings, of said output data bits; and parameter controlling means for successively incrementally counting and comparing to said parameter quantity held within said parameter storage means in order that by said counting said shifting out bit-by-bit of each of said plurality of output data bits, in order to form by said shifting said bit-serial output data signal plus clocking signals, should be for exactly said variably specifiable parameter quantity number of bits whereby exactly requires than neither more nor less than the variably specifiable parameter quantity number of output bits will be bit-serially transmitted as said output data signal plus said clocking signals upon said first signal line plus second signal lines of said multiplicity of signal lines of said scan/set network.

23. The digital logic apparatus of claim 21 which further comprises:

parameter storage means for holding a variably specifiable parameter quantity, called a LOOP LENGTH, which parameter specifies the number of output bits of each of said successive addressable pluralities, or output strings, of said output data bits; and parameter controlling means for successively incrementally counting and comparing to said parameter quantity held within said parameter storage means in order that by said counting said shifting out bit-by-bit of each of said plurality of output data bits to form by said shifting said bit-serial output data signal plus clocking signals should be for exactly said variable specifiable parameter quantity number of bits whereby exactly requires than neither more nor less than the variably specifiable parameter quantity number of output bits will be bit-serially transmitted as said output data signal plus said clocking signals upon said first signal line plus second signal lines of said multiplicity of signal lines of said scan/set network.

24. The digital logic apparatus of claim 20 which further comprises:

parameter storage means for holding a variably specifiable parameter quantity, called a REPEAT COUNT, which parameter specifies the numbers of said successive addressable pluralities, or output strings, of said output data bits which are to be bit-serially conducted in writing communication; and parameter controlling means for successively incrementally counting and comparing to said parameter quantity held within said parameter storage means in order that by said counting said shift register and communicating means is controlled for successively receiving by parts said successive addressable pluralities of said output data bits, and for said shifting out bit-by-bit each part of successive pluralities of said output data bits, until the entire said successive addressable pluralities, or output strings, of said output data bits have been bit-serially conducted in writing communication.

25. The digital logic apparatus of claim 21 which further comprises:

parameter storage means for holding a variably specifiable parameter quantity, called a REPEAT COUNT, which parameter specifies the numbers of said successive addressable pluralities, or output strings, of said output data bits which are to be bit-serially conducted in writing communication; and parameter controlling means for successively incrementally counting and comparing to said parameter quantity held within said parameter storage means in order that by said counting said shift register and communicating means is controlled for successively receiving by parts said successive addressable pluralities of said output data bits, and for said shifting out bit-by-bit each part of successive pluralities of said output data bits, until the entire said successive addressable pluralities, or output strings, of said output data bits have been bit-serially conducted in writing communication.

* * * * *